(12) United States Patent
Liu

(10) Patent No.: US 12,159,577 B2
(45) Date of Patent: Dec. 3, 2024

(54) ARRAY SUBSTRATE OF ORGANIC LIGHT EMITTING DIODE (OLED) DISPLAY IMPROVING RESPONSE SPEED OF PIXEL CIRCUIT

(71) Applicant: BOE TECHNOLOGY GROUP CO., LTD., Beijing (CN)

(72) Inventor: Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 32 days.

(21) Appl. No.: 17/639,312

(22) PCT Filed: Mar. 19, 2021

(86) PCT No.: PCT/CN2021/081923
§ 371 (c)(1),
(2) Date: Feb. 28, 2022

(87) PCT Pub. No.: WO2022/170661
PCT Pub. Date: Aug. 18, 2022

(65) Prior Publication Data
US 2023/0351958 A1    Nov. 2, 2023

(30) Foreign Application Priority Data

Feb. 10, 2021    (WO) ............... PCT/CN2021/076577

(51) Int. Cl.
G09G 3/3233    (2016.01)
H10K 59/131    (2023.01)

(52) U.S. Cl.
CPC ......... *G09G 3/3233* (2013.01); *H10K 59/131* (2023.02); *G09G 2300/0426* (2013.01);
(Continued)

(58) Field of Classification Search
CPC .......... G09G 3/30; G09G 3/32; G09G 3/3208; G09G 3/3216; G09G 3/3225;
(Continued)

(56) References Cited

U.S. PATENT DOCUMENTS 10,586,491 B2    3/2020 Chaji et al.
11,937,465 B2 *  3/2024 Liu ................... H01L 29/78693
(Continued)

FOREIGN PATENT DOCUMENTS

CN    106920801 A    7/2017
CN    107038997 A    8/2017
(Continued)

OTHER PUBLICATIONS

Written Opinion from PCT/CN2021/081923 dated Nov. 17, 2021.
(Continued)

*Primary Examiner* — Ke Xiao
*Assistant Examiner* — Nelson Lam
(74) *Attorney, Agent, or Firm* — Calfee, Halter & Griswold LLP

(57) ABSTRACT

Embodiments of the present disclosure provide an array substrate and related display panel and display device. The array substrate includes: a substrate; and a plurality of sub-pixels arranged on the substrate. At least one of the sub-pixels includes a pixel circuit, and each pixel circuit comprises a driving circuit, a voltage-stabilizing circuit, a driving reset circuit and a light-emitting reset circuit. The driving circuit is configured to provide a driving current to a light-emitting device. The voltage-stabilizing circuit is configured to make the control terminal of the driving circuit and the driving reset circuit. The driving reset circuit is configured to reset the control terminal of the driving circuit. The light-emitting reset circuit is configured to reset the light-emitting device. A driving reset voltage line is config-
(Continued)

ured to provide a driving reset voltage. A light-emitting reset voltage line is configured to provide a light-emitting reset voltage.

19 Claims, 39 Drawing Sheets

(52) U.S. Cl.
CPC ............ *G09G 2300/0819* (2013.01); *G09G 2300/0842* (2013.01); *G09G 2300/0861* (2013.01); *G09G 2310/08* (2013.01); *G09G 2330/021* (2013.01)

(58) Field of Classification Search
CPC .... G09G 3/3233; G09G 3/325; G09G 3/3258; G09G 3/3266; G09G 3/3275; G09G 3/3283; G09G 3/3291
USPC ........................................................ 345/76–83
See application file for complete search history.

(56) References Cited

U.S. PATENT DOCUMENTS

| | | | |
|---|---|---|---|
| 11,978,396 B2* | 5/2024 | Liu ..................... | G09G 3/3233 |
| 2014/0034923 A1 | 2/2014 | Kim et al. | |
| 2015/0130691 A1 | 5/2015 | Jeon | |
| 2015/0243718 A1 | 8/2015 | Kwon | |
| 2015/0243719 A1 | 8/2015 | Kwon | |
| 2015/0243720 A1 | 8/2015 | Kwon | |
| 2015/0279278 A1 | 10/2015 | Park et al. | |
| 2016/0187695 A1 | 6/2016 | Cho et al. | |
| 2017/0069273 A1 | 3/2017 | Park | |
| 2017/0365218 A1 | 12/2017 | Jeong | |
| 2018/0158415 A1 | 6/2018 | Chaji et al. | |
| 2019/0245023 A1* | 8/2019 | Kim ..................... | G09G 3/3233 |
| 2019/0295463 A1 | 9/2019 | Ling et al. | |
| 2019/0295471 A1 | 9/2019 | Jeong | |
| 2019/0319083 A1* | 10/2019 | Pyon .................. | H10K 59/1213 |
| 2019/0385522 A1 | 12/2019 | Song et al. | |
| 2020/0258966 A1 | 8/2020 | Cha et al. | |
| 2020/0395433 A1 | 12/2020 | Sung et al. | |
| 2020/0410937 A1 | 12/2020 | Chen et al. | |
| 2021/0090494 A1 | 3/2021 | Hwang et al. | |
| 2021/0249498 A1* | 8/2021 | Cho ..................... | H01L 29/7869 |
| 2021/0359066 A1* | 11/2021 | An ....................... | H01L 27/124 |
| 2022/0114943 A1 | 4/2022 | Cao | |
| 2023/0042966 A1* | 2/2023 | Huangfu ............. | G09G 3/3258 |
| 2023/0119752 A1 | 4/2023 | Jeong | |
| 2023/0267888 A1* | 8/2023 | Liu ..................... | G09G 3/3233 345/214 |
| 2023/0351956 A1* | 11/2023 | Liu ..................... | G09G 3/3233 |

FOREIGN PATENT DOCUMENTS

| | | | |
|---|---|---|---|
| CN | 108777132 A | | 11/2018 |
| CN | 108986742 A | | 12/2018 |
| CN | 109964316 A | | 7/2019 |
| CN | 110277060 A | | 9/2019 |
| CN | 110619850 A | | 12/2019 |
| CN | 110660360 A | | 1/2020 |
| CN | 111128080 A | | 5/2020 |
| CN | 111292687 A | | 6/2020 |
| CN | 111354307 A | | 6/2020 |
| CN | 111696484 A | | 9/2020 |
| CN | 111754937 A | | 10/2020 |
| CN | 112053661 A | | 12/2020 |
| CN | 112071882 A | | 12/2020 |
| CN | 212365460 U | | 1/2021 |
| CN | 110751927 B | * | 10/2021 |
| DE | 102017222059 A1 | | 6/2018 |
| EP | 3258463 A1 | | 12/2017 |

OTHER PUBLICATIONS

International Search Report from from PCT/CN2021/081923 dated Nov. 17, 2021.
Allowance from Chinese Application No. 202180000505.6 dated Jul. 18, 2022.
Office action from Chinese Application No. 202180000505.6 dated Apr. 21, 2022.
Communication from European Application No. 21925317.6 dated Jul. 18, 2023.
Non-final OA of U.S. Appl. No. 18/307,028 Jul. 22, 2024.

* cited by examiner

ARRAY SUBSTRATE OF ORGANIC LIGHT EMITTING DIODE (OLED) DISPLAY IMPROVING RESPONSE SPEED OF PIXEL CIRCUIT

CROSS REFERENCE OF RELATED APPLICATION(S)

The present disclosure is the national stage entry and claims priority to the PCT International Application No. PCT/CN2021/081923, filed on Mar. 19, 2021 and entitled "Array Substrate, Display Panel Comprising the Array Substrate, and Display Device", which claims priority to PCT/CN2021/076577, filed on Feb. 10, 2021 the entire contents of which ARE incorporated herein by reference in its their entirety.

TECHNICAL FIELD

Embodiments of the present disclosure generally relate to the display technical field, and more particularly, to an array substrate, a display panel including the array substrate and a display device.

BACKGROUND

Organic Light-Emitting Diode (OLED) display panels have advantages of self-luminescence, high efficiency, bright colors, light weight, power saving, rollability, and a wide temperature range, and have thus been gradually applied to large-area displays, lighting, and automotive displays, and other fields.

SUMMARY

Embodiments of the present disclosure provide an array substrate, a related display panel and a display device.

According to a first aspect of the present disclosure, there is provided an array substrate, including a substrate. The array substrate further includes a plurality of sub-pixels arranged in multiple rows and columns on the substrate. At least one of the plurality of sub-pixels includes a pixel circuit, and each pixel circuit includes a driving circuit, a voltage-stabilizing circuit, a driving reset circuit and a light-emitting reset circuit. The driving circuit includes a control terminal, a first terminal and a second terminal, and is configured to provide a driving current to a light-emitting device. The voltage-stabilizing circuit is coupled to the control terminal of the driving circuit, a first node and a voltage-stabilizing control signal input terminal, and is configured to make the control terminal of the driving circuit and the first node conduct under control of a voltage-stabilizing control signal from the voltage-stabilizing control signal input terminal. The driving reset circuit is coupled to a driving reset control signal input terminal, the first node and a driving reset voltage terminal, and is configured to provide a driving reset voltage from the driving reset voltage terminal to the voltage-stabilizing circuit under control of a driving reset control signal from the driving reset control signal input terminal, so as to reset the control terminal of the driving circuit. The light-emitting reset circuit is coupled to a light-emitting reset control signal input terminal, the light-emitting device and a light-emitting reset voltage terminal, and is configured to provide a light-emitting reset voltage from the light-emitting reset voltage terminal to the light-emitting device under control of a light-emitting reset control signal from the light-emitting reset control signal input terminal, so as to reset the light-emitting device. The array substrate further includes a driving reset voltage line and a light-emitting reset voltage line. The driving reset voltage line is coupled to the driving reset voltage terminal to provide the driving reset voltage. The light-emitting reset voltage line is coupled to the light-emitting reset voltage terminal to provide the light-emitting reset voltage.

In an embodiment of the present disclosure, the driving circuit includes a driving transistor. The voltage-stabilizing circuit includes a voltage-stabilizing transistor. The driving reset circuit includes a driving reset transistor. The light-emitting reset circuit includes a light-emitting reset transistor. A first electrode of the driving transistor is coupled to the first terminal of the driving circuit, a gate of the driving transistor is coupled to the control terminal of the driving circuit, and a second electrode of the driving transistor is coupled to the second terminal of the driving circuit. A first electrode of the voltage-stabilizing transistor is coupled to the control terminal of the driving circuit, a gate of the voltage-stabilizing transistor is coupled to the voltage-stabilizing control signal input terminal, and a second electrode of the voltage-stabilizing transistor is coupled to the first node. The first electrode of the driving reset transistor is coupled to the driving reset voltage terminal, a gate of the driving reset transistor is coupled to the driving reset control signal input terminal, and a second electrode of the driving reset transistor coupled to the first node. A first electrode of the light-emitting reset transistor is coupled to the light-emitting reset voltage terminal, a gate of the light-emitting reset transistor is coupled to the light-emitting reset control signal input terminal, and a second electrode of the light-emitting reset transistor is coupled to a first terminal of the light-emitting device. An active layer of the voltage-stabilizing transistor includes an oxide semiconductor material, and active layers of the driving transistor and the driving reset transistor include a silicon semiconductor material.

In an embodiment of the present disclosure, an active layer of the light-emitting reset transistor includes the oxide semiconductor material.

In an embodiment of the present disclosure, the array substrate further includes:
a first active semiconductor layer on the substrate and including the silicon semiconductor material; and
a second active semiconductor layer arranged on a side of the first active semiconductor layer away from the substrate and insulated from the first active semiconductor layer and including the oxide semiconductor material.

In an embodiment of the present disclosure, the first active semiconductor layer includes the active layer of the driving transistor and the active layer of the driving reset transistor. The second active semiconductor layer includes a first part and a second part arranged along a column direction. The first part of the second active semiconductor layer includes the active layer of the voltage-stabilizing transistor. The second part of the second active semiconductor layer includes the active layer of the light-emitting reset transistor.

In an embodiment of the present disclosure, the first part of the second active semiconductor layer and the second part of the second active semiconductor layer are aligned in the column direction.

In an embodiment of the present disclosure, the pixel circuit further includes a data writing circuit, a compensation circuit, a storage circuit and a light-emitting control circuit. The data writing circuit is coupled to a data signal input terminal, a scan signal input terminal, and the first terminal of the driving circuit, and is configured to provide a data signal from the data signal input terminal to the first terminal of the driving circuit under control of a scan signal from the scan signal input terminal. The compensation circuit is coupled to the second terminal of the driving circuit, the first node and a compensation control signal input terminal, and is configured to perform a threshold compensation for the driving circuit according to a compensation control signal from the compensation control signal input terminal. The storage circuit is coupled to a first power voltage terminal and the control terminal of the driving circuit, and is configured to store a voltage difference between the first power voltage terminal and the control terminal of the driving circuit. The light-emitting control circuit is coupled to the light-emitting control signal input terminal, the first power voltage terminal, the first terminal and the second terminal of the driving circuit, the light-emitting reset circuit and the light-emitting device, and is configured to apply a first power voltage from the first power voltage terminal to the driving circuit, and apply the driving current generated by the driving circuit to the light-emitting device under control of the light-emitting control signal from the light-emitting control signal input terminal.

In an embodiment of the present disclosure, the data writing circuit includes a data writing transistor. The compensation circuit includes a compensation transistor. The storage circuit includes a storage capacitor. The light-emitting control circuit includes a first light-emitting control transistor and a second light-emitting control transistor. A first electrode of the data writing transistor is coupled to the data signal input terminal, a gate of the data writing transistor is coupled to the scan signal input terminal, and a second electrode of the data writing transistor is coupled to the first terminal of the driving circuit. A first electrode of the compensation transistor is coupled to the second terminal of the driving circuit, a gate of the compensation transistor is coupled to the compensation control signal input terminal, and a second electrode of the compensation transistor is coupled the first node. A first electrode of the storage capacitor is coupled to the first power voltage terminal, a second electrode of the storage capacitor is coupled to the control terminal of the driving circuit, and is configured to store the voltage difference between the first power voltage terminal and the control terminal of the driving circuit. A first electrode of the first light-emitting control transistor is coupled to the first power voltage terminal, a gate of the first light-emitting control transistor is coupled to the light-emitting control signal input terminal, and a second electrode of the first light-emitting control transistor is coupled to the first terminal of the driving circuit. A first electrode of the second light-emitting control transistor is coupled to the second terminal of the driving circuit, a gate of the second light-emitting control transistor is coupled to the light-emitting control signal input terminal, and a second electrode of the second light-emitting control transistor is coupled to the first electrode of the light-emitting device.

In an embodiment of the present disclosure, the first active semiconductor layer includes active layers of the data writing transistor, the compensation transistor, the first light-emitting control transistor and the second light-emitting control transistor.

In an embodiment of the present disclosure, the light-emitting reset control signal and the light-emitting control signal are a same signal.

In an embodiment of the present disclosure, the scan signal and the compensation control signal are a same signal.

In an embodiment of the present disclosure, the array substrate further includes a first conductive layer arranged between the first active semiconductor layer and the second active semiconductor layer and insulated from the first active semiconductor layer and the second active semiconductor layer. The first conductive layer includes a driving reset control signal line, a scan signal line, the gate of the driving transistor, the first electrode of the storage capacitor and a light-emitting control signal line that are sequentially arranged along the column direction. The driving reset control signal line is coupled to the driving reset control signal input terminal, and is configured to provide the driving reset control signal to the driving reset control signal input terminal. The scan signal line is coupled to the scan signal input terminal and the compensation control signal input terminal, is configured to provide the scan signal to the scan signal input terminal, and is configured to provide the compensation control signal to the compensation control signal input terminal. The first electrode of the storage capacitor and the gate of the driving transistor are formed as an integral structure. The light-emitting control signal line is coupled to the light-emitting control signal input terminal, and is configured to provide the light-emitting control signal to the light-emitting control signal input terminal.

In an embodiment of the present disclosure, an overlapping portion between an orthographic projection of the driving reset control signal line on the substrate and an orthographic projection of the first active semiconductor layer on the substrate is the gate of the driving reset transistor. Overlapping portions between an orthographic projection of the scan signal line on the substrate and the orthographic projection of the first active semiconductor layer on the substrate are the gate of the compensation transistor and the gate of the data writing transistor. Overlapping portions between an orthographic projection of the light-emitting control signal line on the substrate and the orthographic projection of the first active semiconductor layer on the substrate are the gate of the first light-emitting control transistor and the gate of the second light-emitting control transistor.

In an embodiment of the present disclosure, the array substrate further includes: a second conductive layer arranged between the first conductive layer and the second active semiconductor layer and insulated from the first conductive layer and the second active semiconductor layer. The second conductive layer includes a voltage-stabilizing control signal line, the second electrode of the storage capacitor, a first power voltage line and a light-emitting reset control signal line that are arranged along the column direction. The voltage-stabilizing control signal line is coupled to the voltage-stabilizing control signal input terminal, and is configured to provide the voltage-stabilizing control signal to the voltage-stabilizing control signal input terminal. The first power voltage line is coupled to the first power voltage terminal, and is configured to provide the first power voltage to the first power voltage terminal. Orthographic projections of the second electrode of the storage capacitor and the first electrode of the storage capacitor on the substrate at least partially overlap. The second electrode of the storage capacitor and the first power voltage line are integrally formed. The light-emitting reset control signal line is coupled to the light-emitting reset control signal input terminal, and is configured to provide the light-emitting reset control signal to the light-emitting reset control signal input terminal.

In an embodiment of the present disclosure, an overlapping portion of an orthographic projection of the voltage-stabilizing control signal line on the substrate and an orthographic projection of the second active semiconductor layer on the substrate is a first control electrode of the voltage-stabilizing transistor. An overlapping portion of an orthographic projection of the light-emitting control signal line on the substrate and the orthographic projection of the second active semiconductor layer on the substrate is a first control electrode of the light-emitting reset transistor.

In an embodiment of the present disclosure, the array substrate further include: a third conductive layer arranged on a side of the second active semiconductor layer away from the substrate and insulated from the second active semiconductor layer. The third conductive layer includes the voltage-stabilizing control signal line, the light-emitting reset control signal line, and a light-emitting reset voltage line that are arranged along the column direction.

In an embodiment of the present disclosure, an overlapping portion of an orthographic projection of the voltage-stabilizing control signal line on the substrate and an orthographic projection of the second active semiconductor layer on the substrate is a second control electrode of the voltage-stabilizing transistor electrode. An overlapping portion of an orthographic projection of the light-emitting control signal line on the substrate and an orthographic projection of the second active semiconductor layer on the substrate is a second control electrode of the light-emitting reset transistor. The light-emitting reset voltage line is coupled to the second active semiconductor layer through a via hole to form the first electrode of the light-emitting reset transistor.

In an embodiment of the present disclosure, the array substrate further includes: a fourth conductive layer arranged on a side of the third conductive layer away from the substrate and insulated from the third conductive layer. The fourth conductive layer the layer includes a first connection portion, a second connection portion, a third connection portion, a fourth connection portion, a fifth connection portion, a sixth connection portion, a seventh connection portion, and an eighth connection portion. The first connection portion is used as the driving reset voltage line. The first connection portion is coupled to a drain region of the driving reset transistor through a via hole to form the first electrode of the driving reset transistor. The second connection portion is coupled to the light-emitting reset voltage line through a via hole. The third connection portion is coupled to a drain region of the data writing transistor through a via hole to form the first electrode of the data writing transistor. The fourth connection portion is coupled to a source region of the driving reset transistor and a source region of the compensation transistor through via holes to form the second electrode of the driving reset transistor and the second electrode of the compensation transistor, respectively, and the fourth connection portion is coupled to a source region of the voltage-stabilizing transistor through a via hole to form the second electrode of the voltage-stabilizing transistor. The fifth connection portion is coupled to the gate of the driving transistor and the first electrode of the storage capacitor through via holes, and the fifth connection portion is coupled to a drain region of the voltage-stabilizing transistor through a via hole to form the first electrode of the voltage-stabilizing transistor. The sixth connection portion is coupled to a drain region of the first light-emitting control transistor through a via hole to form the first electrode of the first light-emitting control transistor. The seventh connection portion is coupled to a source region of the second light-emitting control transistor through a via hole to form the second electrode of the second light-emitting control transistor, and the seventh connection portion is coupled to a source region of the light-emitting reset transistor to form the second electrode of the light-emitting reset transistor. The eighth connection portion is coupled to the source region of the light-emitting reset transistor through a via hole to form the first electrode of the light-emitting reset transistor.

In an embodiment of the present disclosure, the array substrate further includes: a fifth conductive layer arranged on a side of the fourth conductive layer away from the substrate and insulated from the fourth conductive layer, wherein the fifth conductive layer includes a data signal line, the first power voltage line, and a second power voltage line that are arranged in a row direction. The data signal line extends along the column direction, and is coupled to the third connection portion of the fourth conductive layer through a via hole. The first power voltage line extends along the column direction, and is coupled to the third connection portion of the fourth conductive layer through a via hole. The second power voltage line extends along the column direction, and is coupled to the seventh connection portion of the fourth conductive layer through a via hole.

According to a second aspect of the present disclosure, there is provided a display panel. The display panel includes the array substrate according to any one of the above embodiments in the first aspect.

According to a third aspect of the present disclosure, there is provided a display device. The display device includes the display panel according to any one of embodiments in the second aspect.

Further aspects and scope of adaptability will become apparent from the descriptions provided herein. It should be understood that various aspects of the present disclosure may be implemented alone or in combination with one or more other aspects. It should also be understood that the descriptions and specific examples herein are intended for purposes of illustration only and are not intended to limit the scope of the present disclosure.

BRIEF DESCRIPTION OF THE DRAWINGS

The drawings described herein are provided for illustration of exemplary embodiments, but not all possible implementations, and are not intended to limit the scope of present disclosure.

Corresponding reference numerals indicate corresponding parts or features throughout various views of the drawings.

DETAILED DESCRIPTION

Figure 1:
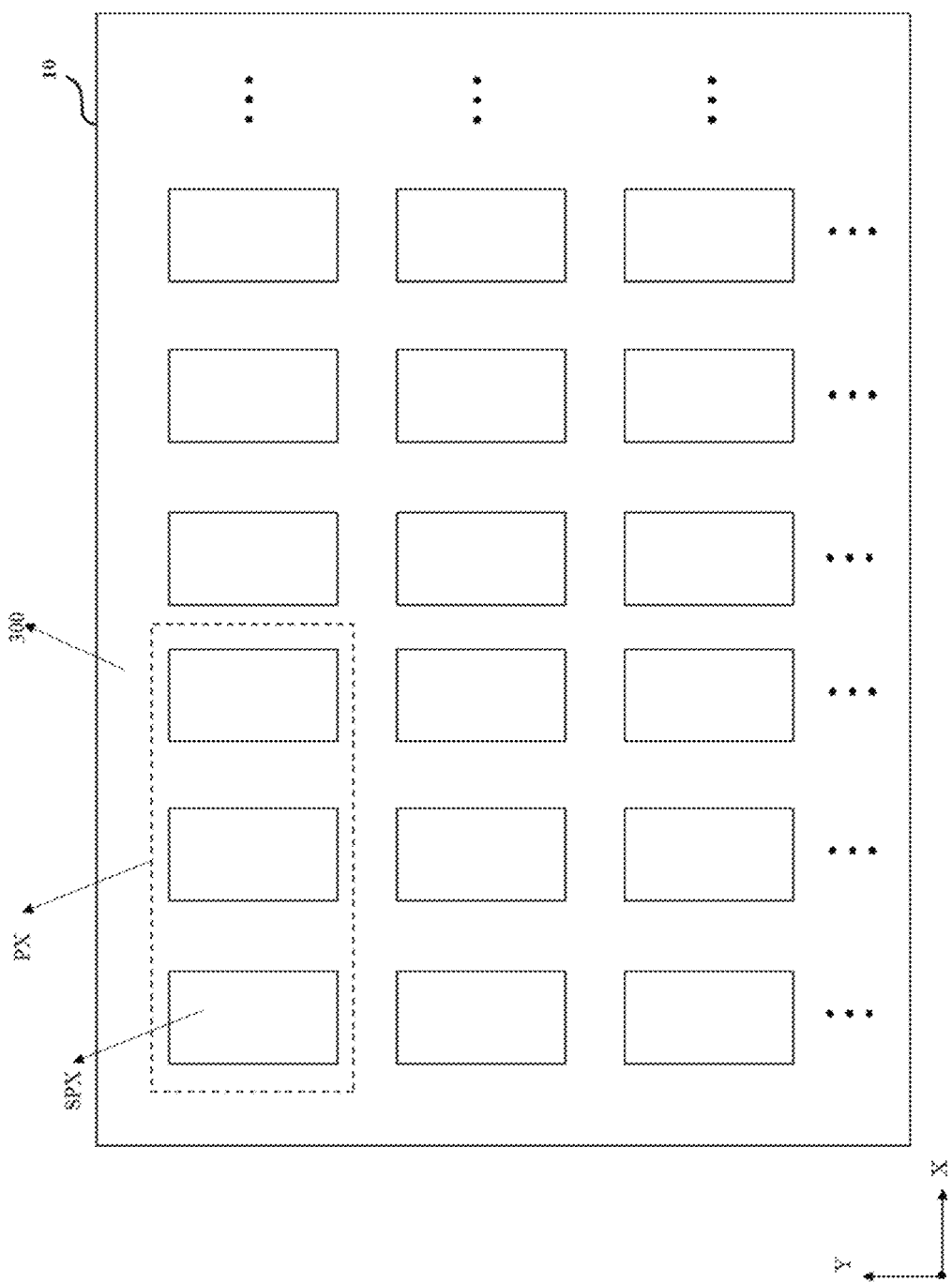
FIG. 1 shows a schematic block diagram of an array substrate according to an embodiment of the present disclosure.

First, it should be noted that unless the context clearly dictates otherwise, the singular forms of words used herein and in the appended claims include the plural and vice versa. Thus, when referring to a singular term, the plural of the corresponding term is generally included. Similarly, the words "comprising" and "containing" are to be construed as inclusive rather than exclusive. Likewise, the terms "including" and "or" should be construed as inclusive unless otherwise indicated herein. Where the term "instance" is used herein, particularly when it follows a group of terms, the "instance" is merely exemplary and illustrative and should not be considered exclusive or broad.

In addition, it should also be noted that when introducing elements of the present disclosure and embodiments thereof, the articles "a", "an", "the" and "said" are intended to mean that there are one or more of the elements; unless otherwise stated, "plurality" means two or more. The terms "comprising", "including", "containing" and "having" are intended to be inclusive and mean that there may be additional elements other than the listed elements. The terms "first", "second", "third", etc. are used for descriptive purposes only and should not be construed to indicate or imply relative importance and formation order.

Further, in the drawings, the thicknesses and regions of various layers are exaggerated for clarity. It will be understood that when a layer, a region, or a component is referred to as being "on" another part, it means that it is directly on the another part, or other components may also be intervening. Conversely, when a component is referred to as being "directly" on another component, it means that no other component is in between.

In a general array substrate, a reset voltage is supplied from the same reset voltage line to reset a light-emitting device and a pixel circuit. The value of the reset voltage is set in consideration of the power consumption level of the pixel circuit, the display effect after compensation, and keeping the light-emitting device after reset in an unlit state. In this case, the power consumption of the pixel circuit, the display effect after compensation, and the charging time of the light-emitting device after reset cannot be in an optimal state at the same time, thereby affecting the power consumption, response speed, accuracy, and display effect of the pixel circuit.

At least some embodiments of the present disclosure provide an array substrate. The array substrate includes two reset voltage lines: a driving reset voltage line and a light-emitting reset voltage line. The driving reset voltage line is coupled to a driving reset voltage terminal to provide the driving reset voltage. The light-emitting reset voltage line is coupled to a light-emitting reset voltage terminal to provide the light-emitting reset voltage. The driving reset voltage may be set in consideration of the power consumption level and the reset effect of the pixel circuit. In the case of a relatively low power consumption level, the pixel circuit is reset more thoroughly, thereby improving the display effect. The light-emitting reset voltage line is coupled to the light-emitting reset voltage terminal to provide the light-emitting reset voltage. The light-emitting reset voltage can be set to just enough to keep the light-emitting device just unlit, thereby reducing the charging time of the light-emitting device before emitting light, improving the response speed of the pixel circuit to a light-emitting signal, shortening the response time, and increasing the probabilistic accuracy.

The array substrate provided by embodiments of the present disclosure will be described below in a non-limiting manner with reference to the accompanying drawings. As described below, different features in these exemplary embodiments can be combined with each other to obtain new embodiments if these features do not conflict with each other. These new embodiments also fall with the protection scope of the present disclosure.

FIG. 1 shows a schematic diagram of an array substrate 10 according to an embodiment of the present disclosure. As shown in FIG. 1, the array substrate 10 includes a substrate 300 and a plurality of sub-pixels SPX arranged in multiple rows and columns on the substrate 300. The substrate may be a glass substrate, a plastic substrate, or the like. The display area of the substrate 300 includes a plurality of pixel units PX, and each pixel unit may include a plurality of sub-pixels SPX, for example, three sub-pixels. The sub-pixels SPX are arranged at intervals along a row direction X and a column direction Y. The row direction X and the column direction Y are perpendicular to each other. At least one of the sub-pixels SPX includes a pixel circuit. The array substrate 10 further includes a driving reset voltage line and a light-emitting reset voltage line. The driving reset signal line is coupled to a driving reset voltage terminal, and is configured to provide a driving reset voltage to the driving reset voltage terminal. The light-emitting reset voltage line is coupled to a light-emitting reset voltage terminal, and is configured to provide a light-emitting reset voltage to the light-emitting reset voltage terminal. The settings of the voltages of the driving reset signal line and the light-emitting reset control signal line and layout showing positions of the driving reset signal line and the light-emitting reset control signal line will be described in detail below with reference to circuit diagrams shown in FIGS. 5 to 11.

In an embodiment of the present disclosure, each pixel circuit includes: a driving circuit, a voltage-stabilizing circuit, a driving reset circuit, a light-emitting reset circuit, a data writing circuit, a compensation circuit, a storage circuit, and a light-emitting control circuit. The pixel circuit will be described in detail below with reference to FIG. 2.

Figure 2:
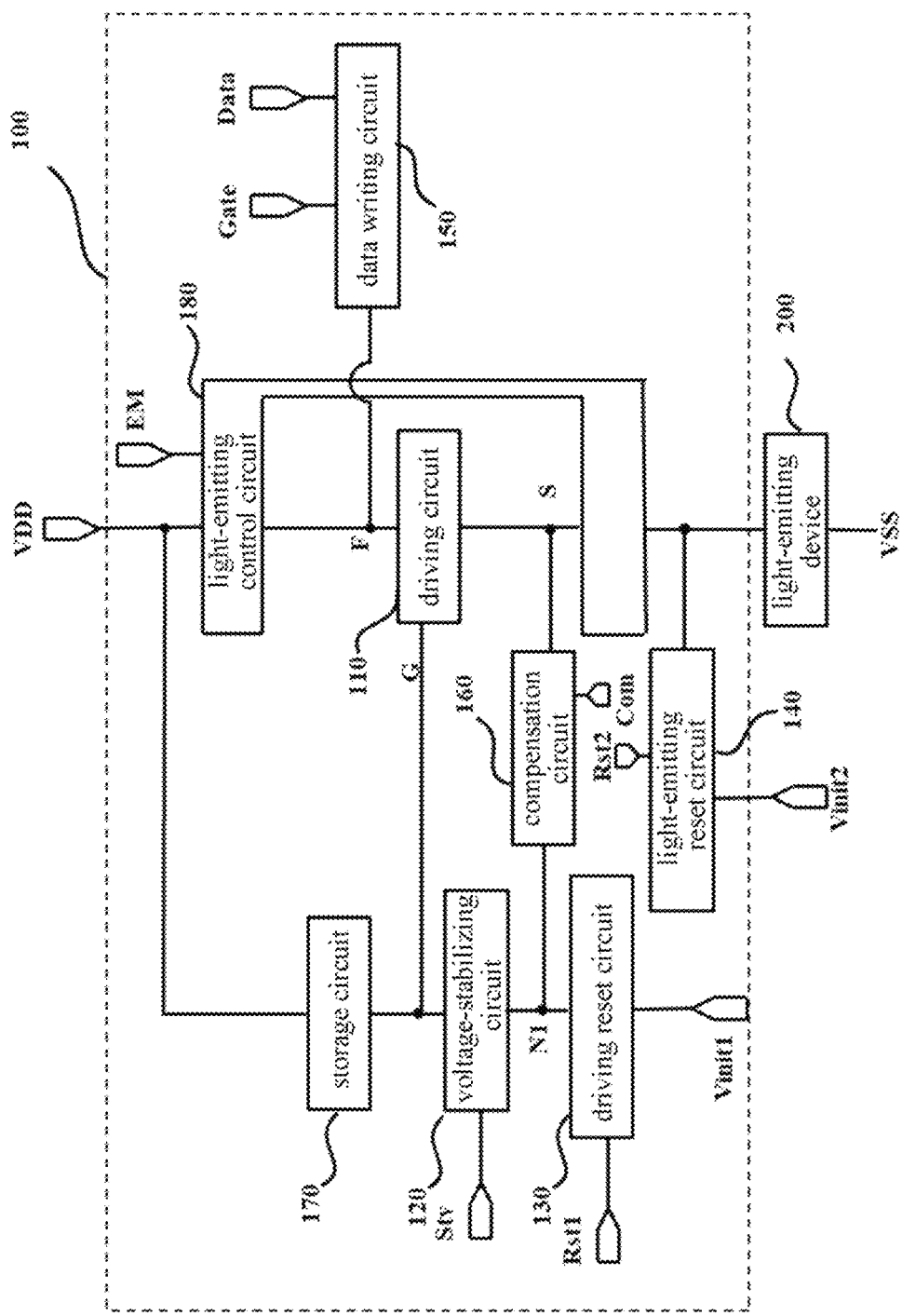
FIG. 2 shows a schematic block diagram of a sub-pixel according to an embodiment of the present disclosure.

FIG. 2 shows a schematic block diagram of a sub-pixel according to some embodiments of the present disclosure. As shown in FIG. 2, a sub-pixel SPX includes a pixel circuit 100 and a light-emitting device 200. The pixel circuit 100 includes: a driving circuit 110, a voltage-stabilizing circuit 120, a driving reset circuit 130, a light-emitting reset circuit 140, a data writing circuit 150, a compensation circuit 160, a storage circuit 170 and a light-emitting control circuit 180.

As shown in FIG. 2, the driving circuit 110 includes a control terminal G, a first terminal F and a second terminal S. The driving circuit 110 is configured to provide a driving current to the light-emitting device 200 under control of a control signal from the control terminal G.

The voltage-stabilizing circuit 120 is coupled to the control terminal G of the driving circuit 110, a first node N1 and a voltage-stabilizing control signal input terminal Sty. The voltage-stabilizing circuit 120 is configured to make the control terminal G of the driving circuit 110 and the first node N1 conduct under control of a voltage-stabilizing control signal from the voltage-stabilizing control signal input terminal.

The driving reset circuit 130 is coupled to a driving reset control signal input terminal Rst1, the first node N1 and a driving reset voltage terminal Vinit1. The driving reset circuit 130 is configured to provide a driving reset voltage from the driving reset voltage terminal Vinit1 to the voltage-stabilizing circuit 120 under control of a driving reset control signal from the driving reset control signal input terminal Rst1, so as to reset the control terminal G of the driving circuit 110.

The light-emitting reset circuit 140 is coupled to a light-emitting reset control signal input terminal Rst2, the light-emitting device 200, and a light-emitting reset voltage terminal Vinit2. Further, the light-emitting reset circuit 140 is also coupled to the light-emitting control circuit 180. The light-emitting reset circuit 140 is configured to provide a light-emitting reset voltage from the light-emitting reset voltage terminal Vinit2 to the light-emitting device 200 under control of a light-emitting reset control signal from the light-emitting reset control signal input terminal Rst2, so as to reset an anode of the light-emitting device 200.

The data writing circuit 150 is coupled to a data signal input terminal Data, a scan signal input terminal Gate and the first terminal F of the driving circuit 110. The data writing circuit 150 is configured to provide a data signal from the data signal input terminal Data to the first terminal F of the driving circuit 110 under control of a scan signal from the scan signal input terminal Gate.

The compensation circuit 160 is coupled to the second terminal S of the driving circuit 110, the first node N1 and a compensation control signal input terminal Com. The compensation circuit 160 is configured to perform threshold compensation on the driving circuit 110 according to a compensation control signal from the compensation control signal input terminal Com.

In an embodiment of the present disclosure, the scan signal from the scan signal input terminal Gate and the compensation control signal from the compensation control signal input terminal Com may be the same signal.

The storage circuit 170 is coupled to a first power voltage terminal VDD and the control terminal G of the driving circuit 110. The storage circuit 170 is configured to store a voltage difference between the first power voltage terminal VDD and the control terminal G of the driving circuit 110.

The light-emitting control circuit 180 is coupled to a light-emitting control signal input terminal EM, the first power voltage terminal VDD, the first terminal F and the second terminal S of the driving circuit 110, the light-emitting reset circuit 140, and the light-emitting device 200. The light-emitting control circuit 180 is configured to apply a first power voltage from the first power voltage terminal VDD to the driving circuit 110 under control of a light-emitting control signal from the light-emitting control signal input terminal EM, and to apply the driving current generated by the driving circuit 110 to the light-emitting device 200.

In some embodiments of the present disclosure, the light-emitting reset control signal from the light-emitting reset control signal input terminal Rst2 and the light-emitting control signal from the light-emitting control signal input terminal EM may be the same signal.

Additionally or alternatively, in some embodiments of the present disclosure, the light-emitting reset control signal from the light-emitting reset control signal input terminal Rst2 and the scan signal from the scan signal input terminal Gate may be the same signal.

The light-emitting device 200 is coupled to a second power voltage terminal VSS, the light-emitting reset circuit 140 and the light-emitting control circuit 180. The light-emitting device 200 is configured to emit light under the driving of the driving current generated by the driving circuit 110. For example, the light-emitting device 200 may be a light-emitting diode or the like. The light-emitting diode may be an organic light-emitting diode (OLED), a quantum dot light-emitting diode (QLED), or the like.

In an embodiment of the present disclosure, the voltage-stabilizing control signal, the scan signal, the driving reset control signal, the light-emitting reset control signal, the compensation control signal, the light-emitting control signal, and the compensation control signal may be square waves, and the value range of a high level may be 0~15V, and the value range of a low level is 0~–15V. For example, the high level is 7V, and the low level is –7V. The value range of the data signal may be 0~8V, for example, 2~5V. The value range of the first power voltage Vdd may be 3~6V. The value range of the second power voltage Vss may be 0~–6V.

Figure 3:
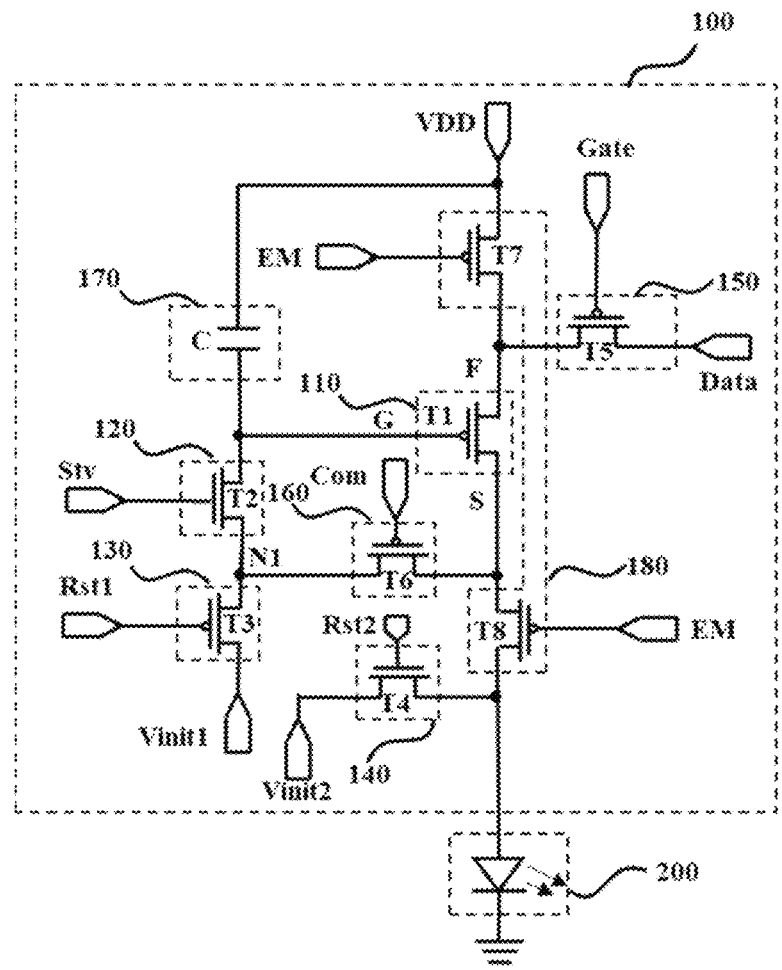
FIG. 3 shows a schematic diagram of the pixel circuit in FIG. 2 according to an embodiment of the present disclosure.

FIG. 3 shows a schematic diagram of the pixel circuit 100 in FIG. 2. As shown in FIG. 3, the driving circuit 110 includes a driving transistor T1, the voltage-stabilizing circuit 120 includes a voltage-stabilizing transistor T2, the driving reset circuit 130 includes a driving reset transistor T3, the light-emitting reset circuit 140 includes a light-emitting reset transistor T4, the data writing circuit 150 includes a data writing transistor T5, the compensation circuit 160 includes a compensation transistor T6, the storage circuit 170 includes a storage capacitor C, and the light-emitting control circuit 180 includes a first light-emitting control transistor T7 and a second light-emitting control transistor T8.

As shown in FIG. 3, a first electrode of the driving transistor T1 is coupled to the first terminal F of the driving circuit 110, a second electrode of the driving transistor T1 is coupled to the second terminal S of the driving circuit 110, and a gate of the driving transistor T1 is coupled to the control terminal G of the driving circuit 110.

A first electrode of the voltage-stabilizing transistor T2 is coupled to the control terminal G of the driving circuit 110, a gate of the voltage-stabilizing transistor T2 is coupled to the voltage-stabilizing control signal input terminal Sty, and a second electrode of the voltage-stabilizing transistor T2 is coupled to the first node N1.

A first electrode of the driving reset transistor T3 is coupled to the driving reset voltage terminal Vinit1, a gate of the driving reset transistor T3 is coupled to the driving reset control signal input terminal Rst1, and a second electrode of the driving reset transistor T3 is coupled to the first node N1.

A first electrode of the light-emitting reset transistor T4 is coupled to the light-emitting reset voltage terminal Vinit2, a gate of the light-emitting reset transistor T4 is coupled to the light-emitting reset control signal input terminal Rst2, and a second electrode of the light-emitting reset transistor T4 is coupled to the anode of the light-emitting device 200. Further, the second electrode of the light-emitting reset transistor T4 is also coupled to a second electrode of the second light-emitting control transistor T8.

A first electrode of the data writing transistor T5 is coupled to the data signal input terminal Data, a gate of the data writing transistor T5 is coupled to the scan signal input terminal Gate, and a second electrode of the data writing transistor T5 is coupled to the first terminal F of the driving circuit 110.

A first electrode of the compensation transistor T6 is coupled to the second terminal S of the driving circuit 110, a gate of the compensation transistor T6 is coupled to the compensation control signal input terminal Com, and a second electrode of the compensation transistor T6 is coupled to the first node N1.

A first electrode of the storage capacitor C is coupled to the first power voltage terminal VDD, and a second electrode of the storage capacitor C is coupled to the control terminal G of the driving circuit 110. The storage capacitor is configured to store the voltage difference between the first power voltage terminal VDD and the control terminal G of the driving circuit 110.

A first electrode of the first light-emitting control transistor T7 is coupled to the first power voltage terminal VDD, a gate of the first light-emitting control transistor T7 is coupled to the light-emitting control signal input terminal EM, and a second electrode of the first light-emitting control transistor T7 is coupled to the first terminal F of the driving circuit 110.

A first electrode of the second light-emitting control transistor T8 is coupled to the second terminal S of the driving circuit 110, a gate of the second light-emitting control transistor T8 is coupled to the light-emitting control signal input terminal EM, and a second electrode of the second light-emitting control transistor T8 is coupled to the anode of the light-emitting device 200.

In an embodiment of the present disclosure, active layers of the voltage-stabilizing transistor T2 and the light-emitting reset transistor T4 may include an oxide semiconductor material, such as a metal oxide semiconductor material. Active layers of the driving transistor T1, the driving reset transistor T3, the data writing transistor T5, the compensation transistor T6, the first light-emitting control transistor T7 and the second light-emitting control transistor T8 may include a silicon semiconductor material.

In an embodiment of the present disclosure, in the case that the light-emitting reset control signal and the light-emitting control signal may be the same signal, the light-emitting reset transistor T4 and the first light-emitting control transistor T7 and the second light-emitting control transistor T8 may be different types of transistors. For example, the light-emission reset transistor T4 may be an N-type transistor, and the first light-emission control transistor T7 and the second light-emission control transistor T8 may be P-type transistors. The stabilizing transistor T2 may be an N-type transistor. The driving transistor T1, the driving reset transistor T3, the data writing transistor T5, and the compensation transistor T6 may be P-type transistors.

In an embodiment of the present disclosure, in the case where the light-emitting reset control signal and the light-emitting control signal may be the same signal, the light-emitting reset transistor T4 and the data writing transistor T5 are transistors of the same type. For example, the light-emitting reset transistor T4 and the data writing transistor T5 may be P-type transistors. The stabilizing transistor T2 may be an N-type transistor. The driving transistor T1, the driving reset transistor T3, the compensation transistor T6, the first light-emitting control transistor T7 and the second light-emitting control transistor T8 may be P-type transistors.

In addition, it should be noted that the transistors used in embodiments of the present disclosure may all be P-type transistors or N-type transistors, as long as respective electrodes of the transistors of the selected type are connected by referring to the connection manner of respective electrodes of corresponding transistors in embodiments of the present disclosure and corresponding voltage terminals are provided with corresponding high voltages or low voltages. For example, for an N-type transistor, its input terminal is the drain and its output terminal is the source, and its control terminal is the gate. For a P-type transistor, its input terminal is the source and its output terminal is the drain, and its control terminal is the gate. For different types of transistors, the level of the control signal at control terminals are also different. For example, for an N-type transistor, when the control signal is at a high level, the N-type transistor is in an on state; and when the control signal is at a low level, the N-type transistor is in an off state. For a P-type transistor, when the control signal is at a low level, the P-type transistor is in an on state; and when the control signal is at a high level, the P-type transistor is in an off state. The oxide semiconductor may include, for example, Indium Gallium Zinc Oxide (IGZO). The silicon semiconductor material may include Low Temperature Polysilicon (LTPS) or amorphous silicon (e.g., hydrogenated amorphous silicon). Low temperature polysilicon generally refers to the case where the crystallization temperature of polysilicon obtained by crystallization of amorphous silicon is lower than 600 degrees Celsius.

Figure 4:
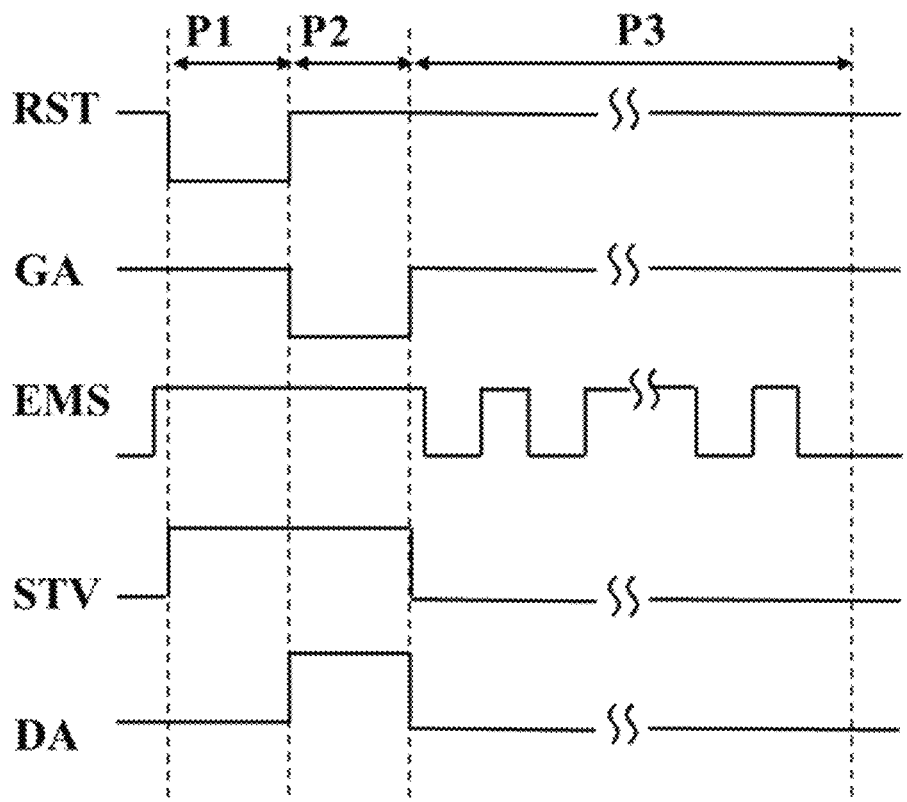
FIG. 4 illustrates a timing diagram of signals for driving the pixel circuit in FIG. 3 according to an embodiment of the present disclosure.

In addition, it should be noted that, in embodiments of the present disclosure, the pixel circuit of the sub-pixel may include other numbers of transistors in addition to the 8T1C (i.e., eight transistors and one capacitor) structure shown in FIG. 4, such as a 8T2C structure, a 7T1C structure, a 7T2C structure, a 6T1C structure, a 6T2C structure, or a 9T2C structure, and embodiments of the present disclosure do not impose specific limitations on this.

FIG. 4 is a timing diagram of signals for driving the pixel circuit in FIG. 3. As shown in FIG. 3, the working procedure of the pixel circuit 100 includes three stages, namely a first stage P1, a second stage P2 and a third stage P3.

The working procedure of the pixel circuit in FIG. 4 will be described below with reference to FIG. 3 by taking the following case as an example where the light-emitting reset control signal and light-emitting control signal are the same signal, the voltage-stabilizing control signal and the scan signal are the same signal, the voltage-stabilizing transistor T2 and the light-emitting reset transistor T4 are N-type transistors, the driving transistor T1, the driving reset transistor T3, the data writing transistor T5, the compensation transistor T6, the first light-emitting control transistor T7 and the second light-emitting control transistor T8 are P-type transistors.

As shown in FIG. 4, in the first stage P1, a low-level driving reset control signal RST, a high-level scan signal GA, a high-level light-emitting control signal EMS, a high-level voltage-stabilizing control signal STV and a low-level data signal DA are input. As shown in FIG. 4, the rising edge of the light-emitting control signal EMS is earlier than the starting point of the first stage P1, that is, earlier than the rising edge of the voltage-stabilizing control signal STV.

In the first phase P1, the gate of the driving reset transistor T3 receives the low-level driving reset control signal RST, and the driving reset transistor T3 is turned on, thereby applying the driving reset voltage VINT1 to the first node N1. The gate of the voltage-stabilizing transistor T2 receives the high-level voltage-stabilizing control signal STV, and the voltage-stabilizing transistor T2 is turned on, thereby applying the driving reset voltage VINT1 at the first node N1 to the gate of the driving transistor T1 to reset the gate of the driving transistor T1 is reset, so that the driving transistor T1 is ready for the data writing in the second stage P2. In embodiments of the present disclosure, the value of the driving reset voltage VINT1 may be set to be lower, e.g., a larger voltage opposite to the first power voltage Vdd, so that the difference between the gate and the first electrode of the driving transistor T1 is larger in the second stage, thereby speeding up the procedure of data writing and compensation in the second stage. It should be noted that the influence of the driving reset voltage VINT1 on the driving transistor T1 tends to be saturated as the driving reset voltage VINT1 increases in the reverse direction. The procedure of data writing and compensation will be described in the second stage P2 below. In addition, in the first stage P1, the voltage of one electrode of the storage capacitor C is the first power voltage Vdd, the voltage of the other electrode is the driving reset voltage VINT1, and the storage capacitor C is charged. In embodiments of the present disclosure, considering the influence of the driving reset voltage VINT1 on data writing and compensation and circuit energy consumption related to the charging of the storage capacitor C and the hardware limitation of the power supply, the value range of the driving reset voltage VINT1 may be −1 to −5V, for example, −3V This can shorten the time required for data writing and compensation while keeping the power consumption of the circuit low, thereby improving the compensation effect during a fixed time period, such as the second stage P2, and thus improving the display effect.

In the first stage P1, the gate of the light-emitting reset transistor T4 receives the high-level light-emitting control signal EMS, and the light-emitting reset transistor T4 is turned on, so that the light-emitting reset voltage VINT2 is applied to the anode of the OLED to reset the anode of the OLED, and the OLED does not emit light before the third stage P3. In embodiments of the present disclosure, the value of the light-emitting reset voltage VINT2 is set such that the OLED is in a state where it is just not emitting light, i.e., the OLED is forward biased to a near-on state. Specifically, when the range of the second power voltage Vss is 0 to −6V, the value range of the light-emitting reset voltage VINT2 may be −2 to −6V, for example, equal to the second power voltage Vss, which is 0 to −6V. This can reduce the charging time of the PN junction before the OLED is turned on, and reduce the response time of the OLED to the light-emitting signal. When the required brightness is consistent, the probability of OLED brightness differences is reduced. Therefore, the uniformity of brightness can be improved, and the low frequency Flicker and the low grayscale Mura can be reduced.

In addition, in the first stage P1, the gate of the data writing transistor T5 receives the high-level scan signal GA, and the data writing transistor T5 is turned off. The gate of the compensation transistor T6 receives the high-level scan signal GA, and the compensation transistor T6 is turned off. The gate of the first light-emitting control transistor T7 receives the high-level light-emitting control signal EMS, and the first light-emitting control transistor T7 is turned off. The gate of the second light-emitting control transistor T8 receives the high-level light-emitting control signal EMS, and the second light-emitting control transistor T8 is turned off.

In the second stage P2, a high-level driving reset control signal RST, a low-level scan signal GA, a high-level light-emitting control signal EMS, a high-level voltage-stabilizing control signal STV and a high-level data signal DA are input.

In the second stage P2, the gate of the data writing transistor T5 receives the low-level scan signal GA, and the data writing transistor T5 is turned on, thereby writing the high-level data signal DA to the first electrode of the driving transistor T1, that is, the first terminal F of the driving circuit 110. The gate of the compensation transistor T6 receives the low-level scan signal GA, and the compensation transistor T3 is turned on, thereby writing the high-level data signal DA of the first terminal F into the first node N1. The gate of the voltage-stabilizing transistor T2 receives the high-level voltage-stabilizing control signal STV, and the voltage-stabilizing transistor T2 is turned on, thereby writing the high-level data signal DA of the first node N1 into the gate of the driving transistor T1, that is, the control terminal G of the driving circuit 110. Since the data writing transistor T5, the driving transistor T1, the compensation transistor T6 and the voltage-stabilizing transistor T2 are all turned on, the data signal DA charges the storage capacitor C again through the data writing transistor T5, the driving transistor T1, the compensation transistor T6 and the voltage-stabilizing transistor T2, that is, charging the gate of the driving transistor T1 (i.e., the control terminal G). Thus, the voltage of the gate of the driving transistor T1 is gradually increased.

It can be understood that, in the second stage P2, since the data writing transistor T5 is turned on, the voltage of the first terminal F remains at Vda. Meanwhile, according to the characteristics of the driving transistor T1, when the voltage of the control terminal G rises to Vda+Vth, the driving transistor T1 is turned off, and the charging procedure ends. Here, Vda represents the voltage of the data signal DA, and Vth represents the threshold voltage of the driving transistor T1. Since the driving transistor T1 is described by taking a P-type transistor as an example in this embodiment, the threshold voltage Vth here may be a negative value.

After the second stage P2, the voltage of the gate of the driving transistor T1 is Vda+Vth, that is to say, the voltage information of the data signal DA and the threshold voltage Vth is stored in the storage capacitor C for subsequent use in the third stage P3, so as to compensate the threshold voltage of the driving transistor T1.

In addition, in the second stage P2, the gate of the driving reset transistor T3 receives the high-level driving reset control signal RST, and the driving reset transistor T3 is turned off. The gate of the light-emitting reset transistor T4 receives the high-level light-emitting reset control signal EMS, and the light-emitting reset transistor T4 is turned off. The gate of the first light-emitting control transistor T7 receives the high-level light-emitting control signal EMS, and the first light-emitting control transistor T7 is turned off. The gate of the second light-emitting control transistor T8 receives the high-level light-emitting control signal EMS, and the second light-emitting control transistor T8 is turned off.

In the third stage P3, a high-level driving reset control signal RST, a high-level scan signal GA, a low-level light-emitting control signal EMS, a low-level voltage-stabilizing control signal STV and a low-level data signal DA are input. As shown in FIG. 4, in an embodiment of the present disclosure, the low-level light-emitting control signal EMS may be a low-level active pulse width modulation signal. As shown in FIG. 4, the falling edge of the light-emitting control signal EMS is later than the end point of the second phase P1, that is, later than the falling edge of the voltage-stabilizing control signal STV.

In the third stage P3, the gate of the first light-emitting control transistor T7 receives the light-emitting control signal EMS. According to an embodiment of the present disclosure, the light-emitting control signal EMS may be pulse width modulated. When the light-emitting control signal EMS is at a low level, the first light-emitting control transistor T7 is turned on, so that the first power voltage Vdd is applied to the first terminal F. The gate of the second light-emitting control transistor T8 receives the light-emitting control signal EMS. When the light-emitting control signal EMS is at a low level, the second light-emitting control transistor T8 is turned on, thereby applying the driving current generated by the driving transistor T1 to the anode of the OLED.

In addition, in the third stage P3, the gate of the voltage-stabilizing transistor T2 receives the low-level voltage-stabilizing control signal Sty, and the voltage-stabilizing transistor T2 is turned off. As described above, the active layer of the voltage-stabilizing transistor T2 includes an oxide semiconductor material, and the leakage current of the oxide semiconductor material is $10^{-16}$ to $10^{-19}$ A. Compared with a single-gate low-temperature polysilicon transistor and a double-gate low-temperature polysilicon transistor, the leakage current is smaller, and thus the electrical leakage of the storage circuit can be further reduced to improve the uniformity of brightness.

In addition, in the third stage P3, the gate of the light-emitting reset transistor T4 receives the light-emitting control signal EMS. When the light-emitting control signal EMS is at a high level, the light-emitting reset transistor T4 is turned on. The light-emitting reset voltage is supplied to the anode of the OLED to reset the anode of the OLED. In the case where the light-emitting control signal EMS is a pulse width modulation signal, this can enable the anode of the OLED to be reset before each light-emitting of the OLED under the control of the light-emitting control signal EMS, thereby further improving the uniformity of brightness.

In addition, the gate of the driving reset transistor T3 receives the high-level driving reset control signal RST, and the driving reset transistor T3 is turned off. The gate of the data writing transistor T5 receives the high-level scan signal GA, and the data writing transistor T5 is turned off. The gate of the compensation transistor T6 receives the high-level scan signal GA, and the compensation transistor T6 is turned off.

It is easy to understand that in the third stage P3, since the first light-emitting control transistor T7 is turned on, the voltage of the first terminal F is the first power voltage Vdd, and the voltage of the control terminal G is Vda+Vth, and thus the driving transistor T1 is also turned on.

In the third stage P3, the anode and cathode of the OLED are respectively connected to the first power voltage Vdd (high voltage) and the second power voltage Vss (low voltage), and thus the OLED emits light driven under the driving current generated by the driving transistor T1.

Based on the saturation current formula of the driving transistor T1, the driving current ID for driving the OLED to emit light can be obtained according to the following formula:

$$ID = K(VGS - Vth)^2$$
$$= K[(Vda + Vth - Vdd) - Vth]^2$$
$$= K(Vda - Vdd)^2$$

In the above formula, Vth represents the threshold voltage of the driving transistor T1, VGS represents the voltage between the gate and the source of the driving transistor T1, and K is a constant. It can be seen from the above formula that the driving current ID flowing through the OLED is no longer related to the threshold voltage Vth of the driving transistor T1, but is only related to the voltage Vda of the data signal DA, so that the threshold voltage Vth of the driving transistor T1 can be compensated. This solves the problem of threshold voltage drift of the driving transistor T1 caused by the process and long-term operation, and eliminates the influence of the threshold voltage on the driving current ID, thereby improving the display effect.

For example, K in the above formula can be expressed as:

$$K = 0.5n Cox(W/L),$$

where n is the electron mobility of the driving transistor T1, Cox is the gate capacitance per unit of the driving transistor T1, W is the channel width of the driving transistor T1, and L is the channel length of the driving transistor T1.

Alternatively, in some embodiments of the present disclosure, the light-emitting reset control signal RST, the compensation control signal COM, and the scan signal GA may be the same signal. The voltage-stabilizing transistor T2 may be an N-type transistor, while the driving transistor T1, the driving reset transistor T3, the light-emitting reset transistor T4, the data writing transistor T5, the compensation transistor T6, the first light-emitting control transistor T7 and the second light-emitting control transistor T8 are P type transistors. The difference from the working procedure of the pixel circuit in the above-mentioned embodiment is that, in the first stage P1, the light-emitting reset transistor T4 receives the high-level scan signal GA, and the light-emitting reset transistor T4 is turned off. The light-emitting reset voltage VINT2 is not supplied to the anode of the light-emitting device OLED, and thus the anode of the light-emitting device OLED is not reset. In the second stage P2, the light-emitting reset transistor T4 receives the low-level scan signal GA, and the light-emitting reset transistor T4 is turned on. The light-emitting reset voltage VINT2 is supplied to the anode of the light-emitting device OLED to reset the anode of the light-emitting device OLED. The remaining operation processes of the pixel circuit in the first period P1, the second period P2 and the third period P3 are similar to the above-mentioned embodiments, and are not repeated here.

In addition, it should be noted that the relationship between the driving reset control signal RST, the scan signal GA, the light-emitting control signal EMS, the voltage-stabilizing control signal STV, and the data signal DA and respective stages is only illustrative. The durations of the high level or the low level of the driving reset control signal RST, the scan signal GA, the light-emitting control signal EMS, the voltage-stabilizing control signal STV, and the data signal DA are only illustrative. For example, the duration of each high level of the light-emitting control signal EMS may be the same.

FIG. 5 to FIG. 11 illustrate schematic plan views of layers in an array substrate according to embodiments of the present disclosure. A pixel circuit as shown in FIG. 3 is taken as an example for description. In the pixel circuit, the light-emitting reset control signal RST and the light-emitting control signal EMS are the same signal, the voltage-stabilizing control signal COM and the scan signal GA are the same signal, and the voltage-stabilizing transistor T2 and the light-emitting reset transistor T4 are metal oxide transistors.

The following describes the positional relationship of respective circuits in the pixel circuit on the substrate with reference to FIGS. 5 to 11. Those skilled in the art will understand that the scales in FIGS. 5 to 11 are drawing scales in order to more clearly represent the positions of various parts, and should not be regarded as true scales of components. Those skilled in the art can determine the size of each component based on actual requirements, which is not specifically limited in the present disclosure.

In an embodiment of the present disclosure, the array substrate includes a first active semiconductor layer 310 on the substrate 300.

Figure 5:
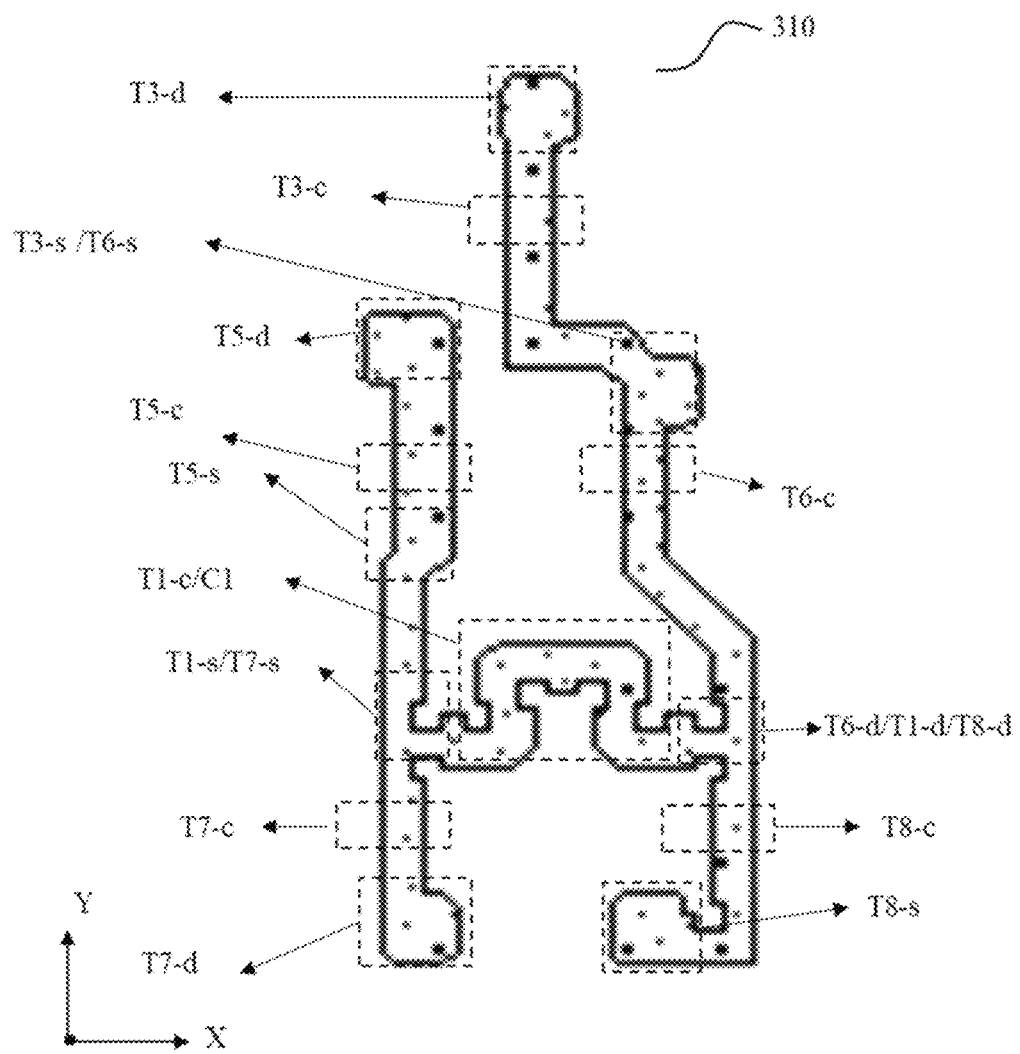
FIGS. 5 to 11 illustrate schematic plan views of layers in an array substrate according to an embodiment of the present disclosure.

FIG. 5 shows a schematic plan view of the first active semiconductor layer 310 in the array substrate according to an embodiment of the present disclosure. In the exemplary embodiment of the present disclosure, the driving transistor T1, the driving reset transistor T3, the light-emitting reset transistor T4, the data writing transistor T5, the compensation transistor T6, the first light-emitting control transistor T7, and the second light-emitting control transistor T8 in the pixel circuit are silicon transistors, such as low temperature polysilicon transistors. In an exemplary embodiment of the present disclosure, the first active semiconductor layer 310 may be used to form active regions of the above-described driving transistor T1, the driving reset transistor T3, the light-emitting reset transistor T4, the data writing transistor T5, the compensation transistor T6, the first light-emitting control transistor of T7 and the second light-emitting control transistor T8. In an exemplary embodiment of the present disclosure, the first active semiconductor layer 310 includes channel region patterns and doping region patterns of the transistors (i.e., first source/drain regions and second source/drain regions of the transistors). In an embodiment of the present disclosure, the channel region patterns and the doped region patterns of respective transistors are integrally arranged.

It should be noted that, in FIG. 5, a dotted frame is used to denote regions in the first active semiconductor layer 310 for source/drain regions and channel regions of respective transistors.

As shown in FIG. 5, the first active semiconductor layer 310 includes a channel region T3-c of the driving reset transistor T3, a channel region T5-c of the data writing transistor T5, a channel region T6-c of the compensation transistor T6, a channel region T1-c of the driving transistor T1, a channel region T7-c of the first light-emitting control transistor T7, and a channel region T8-c of the second light-emitting control transistor T8 along the Y direction (column direction) and the X direction (row direction) in sequence.

In an exemplary embodiment of the present disclosure, the first active semiconductor layer for the above-described transistors may include an integrally formed low temperature polysilicon layer. The source region and the drain region of each transistor may be conductive by doping or the like to realize electrical connection of structures. That is, the first active semiconductor layer of the transistors is an overall pattern formed of p-silicon or n-silicon, and each transistor in the same pixel circuit includes a pattern of doped regions (i.e., the source region s and the drain region d) and a channel region pattern. The active layers of different transistors are separated by doping structures.

As shown in FIG. 5, the first active semiconductor layer 310 further includes: a drain region T3-*d* of the driving reset transistor T3, a drain region T5-*d* of the data writing transistor T5, a source region of the driving reset transistor T3 and a source region of the compensation transistor T6 (T3-*s*/T6-*s*), a source region T5-*s* of the data writing transistor T5, a source region of the driving transistor T1 and a source region of the first light-emitting control transistor T7 (T1-*s*/T7-*s*), a drain region of the compensation transistor T6 and a drain region of the driving transistor T1 and a drain region of the second light-emitting control transistor T8 (T6-*d*/T1-*d*/T8-*d*), a drain region T7-*d* of the first light-emitting control transistor T7, and a source region T8-*s* of the second light-emitting control transistor T8 along the Y direction and the X direction.

In an exemplary embodiment of the present disclosure, the first active semiconductor layer 310 may be formed of a silicon semiconductor material such as amorphous silicon, polysilicon, or the like. The above-mentioned source regions and drain regions may be regions doped with n-type impurities or p-type impurities. For example, the source and drain regions of the first light-emitting control transistor T7, the data writing transistor T5, the driving transistor T1, the compensation transistor T6, and the second light-emitting control transistor T8 are all regions doped with P-type impurities.

In an embodiment of the present disclosure, the array substrate further includes a first conductive layer 320 on a side of the first active semiconductor layer away from the substrate.

Figure 6:
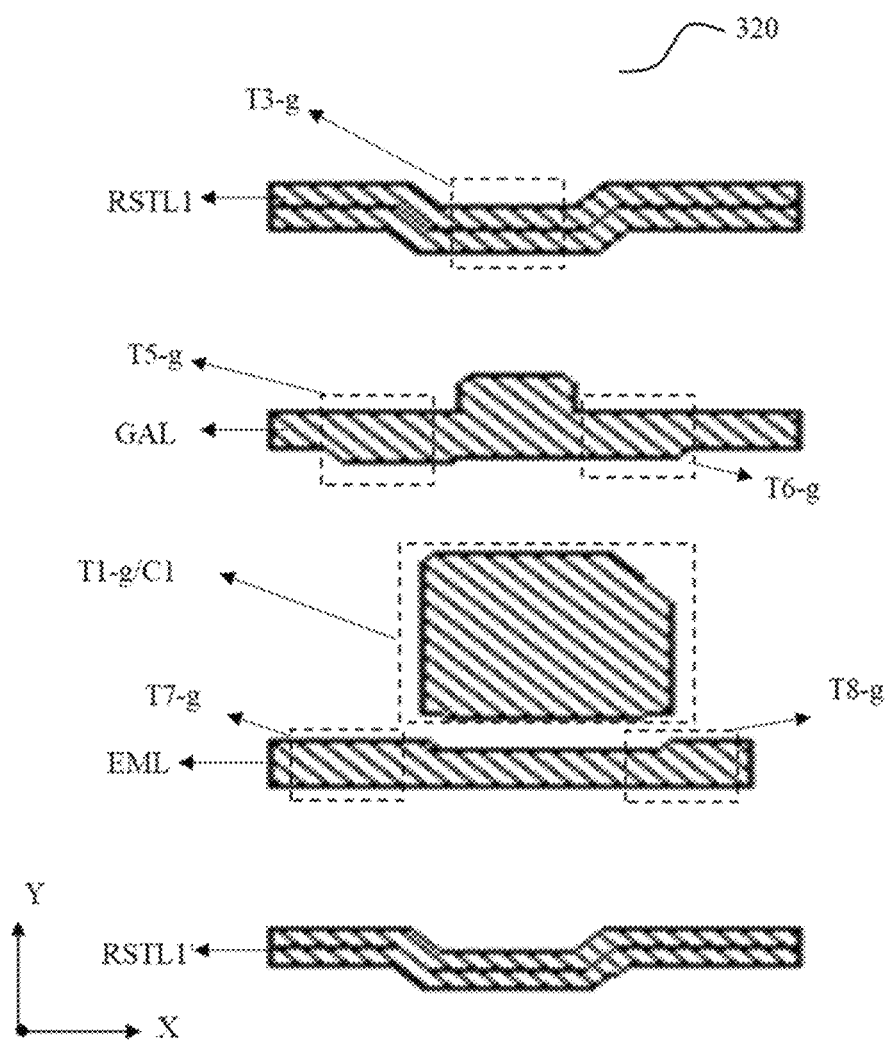

FIG. 6 is a schematic plan view of the first conductive layer 320 in the array substrate according to an embodiment of the present disclosure. As shown in FIG. 6, the first conductive layer 320 includes a driving reset control signal line RSTL1, a scan signal line GAL, a first electrode C1 of the capacitor C, and a light-emitting control signal line EML sequentially arranged along the Y direction. In addition, the first conductive layer 320 further includes a driving reset control signal line RSTL1' used for an adjacent pixel circuit along the Y direction. The effect of the driving reset control signal line RSTL1' used for the adjacent pixel circuit on the adjacent pixel circuit is the same as the effect of the driving reset control signal line RSTL1 on the pixel circuit, and repeated descriptions thereof will be omitted below.

In an embodiment of the present disclosure, the light-emitting control signal line EML is coupled to the light-emitting control signal input terminal EM, and is configured to provide the light-emitting control signal input terminal EM with the light-emitting control signal EMS.

In an embodiment of the present disclosure, the scan signal line GAL is coupled to the scan signal input terminal Gate and the compensation control signal input terminal Com, and is configured to provide the scan signal GA to the scan signal input terminal Gate, and is configured to provide the compensation control signal COM to the compensation control signal input terminal Com.

In an embodiment of the present disclosure, the first electrode C1 of the capacitor C and the gate T1-*g* of the driving transistor T1 are formed as an integral structure.

In an embodiment of the present disclosure, the driving reset control signal line RSTL1 is coupled to the driving reset control signal input terminal Rst1 to provide the driving reset control signal RST to the driving reset control signal input terminal Rst1.

In an embodiment of the present disclosure, referring to FIGS. 5 and 6, an overlapping portion of an orthographic projection of the driving reset control signal line RSTL1 on the substrate and an orthographic projection of a portion 311 of the first active semiconductor layer 310 on the substrate is the gate T3-*g* of the driving reset transistor T3 in the pixel circuit. Overlapping portions between an orthographic projection of the scan signal line GAL on the substrate and the orthographic projection of the portion 311 of the first active semiconductor layer 310 on the substrate are the gate T6-*g* of the compensation transistor T6 and the gate T5-*g* of the data writing transistor T5 in the pixel circuit. An overlapping portion between an orthographic projection of the first electrode C1 of the capacitor C on the substrate and an orthographic projection of the portion 311 of the first active semiconductor layer 310 on the substrate is the gate T1-*g* of the driving transistor T1 in the pixel circuit. Overlapping portions between an orthographic projection of the light-emitting control signal line EML on the substrate and an orthographic projection of the portion 311 of the first active semiconductor layer 310 on the substrate are the gate T7-*g* of the first light-emitting control transistor T7 and the gate T8-*g* of the second light-emitting control transistor T8 in the pixel circuit.

In an embodiment of the present disclosure, as shown in FIG. 6, in the Y direction, the gate T3-*g* of the driving reset transistor T3, the gate T6-*g* of the compensation transistor T6 and the gate T5-*g* of the data writing transistor T5 are located on a first side of the gate T1-*g* of the driving transistor T1. The gate T7-*g* of the first light-emitting control transistor T7 and the gate T8-*g* of the first light-emitting control transistor T8 are located on a second side of the gate T1-*g* of the driving transistor T1.

It should be noted that the first side and the second side of the gate T1-*g* of the driving transistor T1 are opposite sides of the gate T1-*g* of the driving transistor T1 in the Y direction. For example, as shown in FIG. 6, in the XY plane, the first side of the gate T1-*g* of the driving transistor T1 may be the upper side of the gate T1-*g* of the driving transistor T1, and the second side of the gate T1-*g* of the driving transistor T1 may be the lower side of the gate T1-*g* of the driving transistor T1. In the description of the present disclosure, the "lower side" is, for example, the side of the array substrate for bonding with ICs. For example, the lower side of the gate T1-*g* of the driving transistor T1 is the side of the gate T1-*g* of the driving transistor T1 close to the IC (not shown in the figure). The upper side is the opposite side to the lower side, e.g., the side of the gate T1-*g* of the driving transistor T1 away from the IC.

More specifically, the gate T3-*g* of the driving reset transistor T3 is located on the upper side of the gate T6-*g* of the compensation transistor T6 and the gate T5-*g* of the data writing transistor T5. The gate T3-*g* of the driving reset transistor T3 is aligned with the gate T1-*g* of the driving transistor T1 in the Y direction.

In an embodiment of the present disclosure, in the X direction, as shown in FIG. 6, the gate T5-*g* of the data writing transistor T5 and the gate T7-*g* of the first light-emitting control transistor T7 are located on a third side of the gate T1-*g* of the driving transistor T1. The gate T6-*g* of the compensation transistor T6 and the gate T8-*g* of the second light-emitting control transistor T8 are located on a fourth side of the gate T1-*g* of the driving transistor T1.

It should be noted that the third side and the fourth side of the gate T1-*g* of the driving transistor T1 are opposite sides of the gate T1-*g* of the driving transistor T1 in the X direction. For example, as shown in FIG. 6, in the XY plane, the third side of the gate T1-g of the driving transistor T1 may be the left side of the gate T1-g of the driving transistor T1, and the fourth side of the gate T1-g of the driving transistor T1 may be the right side of the gate T1-g of the driving transistor T1.

More specifically, the gate T7-g of the first light-emitting control transistor T7 is on the left side of the gate T5-g of the data writing transistor T5. The gate T8-g of the second light-emitting control transistor T8 is located on the right side of the gate T6-g of the compensation transistor T6.

It should be noted that the active regions of the transistors shown in FIG. 6 correspond to respective regions where the first conductive layer 320 and the first active semiconductor layer 310 overlap.

In an embodiment of the present disclosure, the array substrate further includes a second conductive layer located on a side of the first conductive layer away from the substrate and insulated from the first conductive layer.

Figure 7:
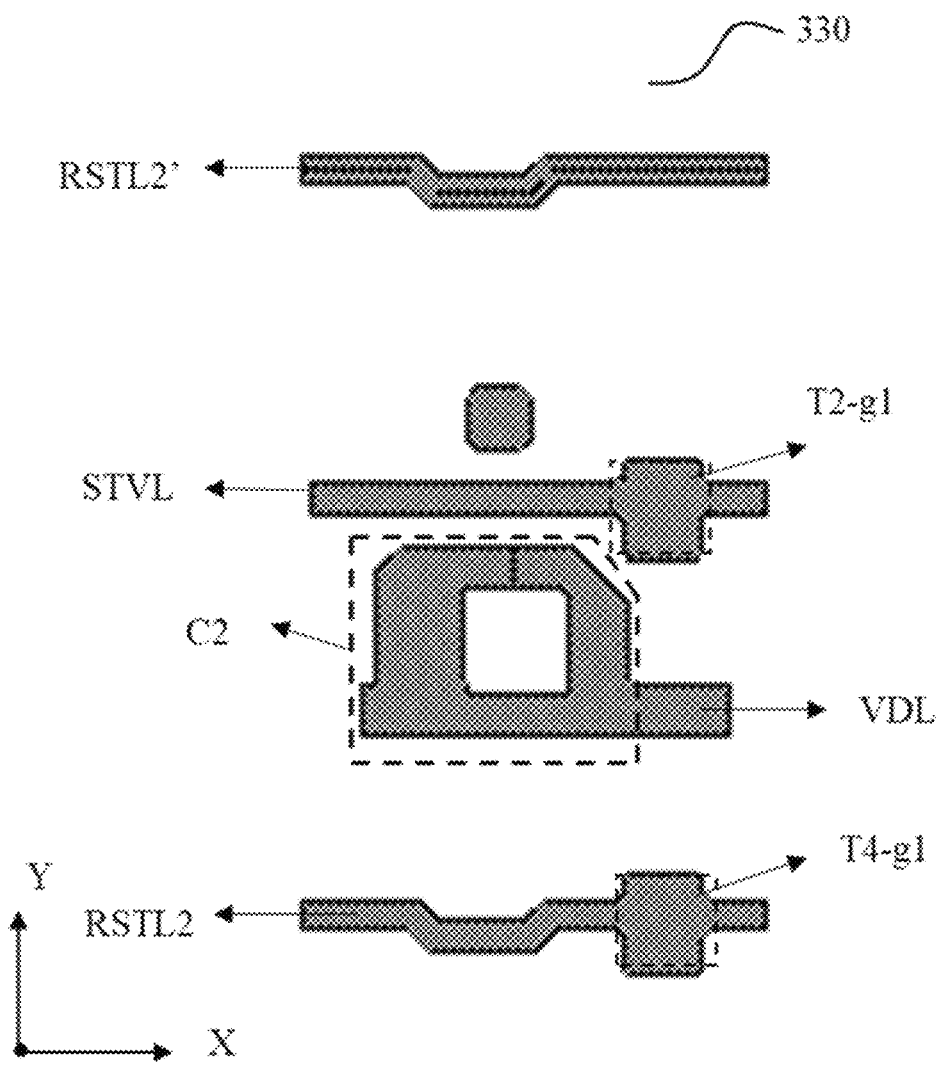

FIG. 7 shows a schematic plan view of the second conductive layer 330 in the array substrate according to an embodiment of the present disclosure. As shown in FIG. 7, the second conductive layer 330 includes a voltage-stabilizing control signal line STVL, a second electrode C2 of the capacitor, a first power voltage line VDL and a light-emitting reset control signal line RSTL2 arranged along the Y direction. In addition, the second conductive layer 330 further includes a light-emitting reset control signal line RSTL2' used for an adjacent pixel circuit along the Y direction. The effect of the light-emitting reset control signal line RSTL2' used for the adjacent pixel circuit on the adjacent pixel circuit is the same as the effect of the light-emitting reset control signal line RSTL2 on the pixel circuit, and repeated descriptions will be omitted below.

In an embodiment of the present disclosure, referring to FIGS. 6 and 7, the projections of the second electrode C2 of the capacitor C and the first electrode C1 of the capacitor C on the substrate at least partially overlap.

In an embodiment of the present disclosure, as shown in FIG. 7, the first power voltage line VDL extends in the X direction and is integrally formed with the second electrode C2 of the capacitor C. The first power voltage line is coupled to the first power voltage terminal VDD, and is configured to provide the first power voltage Vdd to the first power voltage terminal VDD. The voltage-stabilizing control signal line STVL is coupled to the voltage-stabilizing control signal input terminal Sty, and is configured to provide the voltage-stabilizing control signal STV to the voltage-stabilizing control signal input terminal Sty. The light-emitting reset control signal line RSTL2 is coupled to the light-emitting reset control signal input terminal Rst2, and is configured to provide the light-emitting reset control signal to the light-emitting reset control signal input terminal Rst2. In an embodiment of the present disclosure, the light-emitting reset control signal and the scan signal EMS are the same signal.

In an embodiment of the present disclosure, as shown in FIG. 7, in the Y direction, the voltage-stabilizing control signal line STVL is located on a first side of the second electrode C2 of the capacitor. The first power signal line VDL and the light-emitting reset control signal line RSTL2 are located on a second side of the second electrode C2 of the capacitor. Similar to the description above with respect to the first and second sides of the gate T1-g of the driving transistor T1, the first and second sides of the second electrode C2 of the capacitor are opposite sides of the second electrode C2 of the capacitor in the Y direction. The first side of the second electrode C2 of the capacitor is the upper side of the second electrode C2 of the capacitor in the Y direction, and the second side of the second electrode C2 of the capacitor is the lower side of the second electrode C2 of the capacitor in the Y direction.

Specifically, in the Y direction, the voltage-stabilizing control signal line STVL is located on the upper side of the second electrode C2 of the capacitor. The first power signal line VDL and the light-emitting reset control signal line RSTL2 are located on the lower side of the second electrode C2 of the capacitor.

In an embodiment of the present disclosure, as shown in FIG. 7, the voltage-stabilizing control signal line STVL is provided with a first gate T2-g1 of the voltage-stabilizing transistor T2. The light-emitting reset control signal line RSTL2 is provided with a first gate T4-g1 of the light-emitting reset transistor T4. The specific positions of the first gate T2-g1 of the voltage-stabilizing transistor T2 and the first gate T4-g1 of the light-emitting reset transistor T4 will be described in detail below with reference to FIG. 8.

Specifically, as shown in FIG. 7, the first gate T2-g1 of the voltage-stabilizing transistor T2 is on the first side of the first gate T4-g1 of the light-emitting reset transistor T4 in the Y direction. Similar to the above description of the first side of the gate T1-g of the driving transistor T1, the first side of the first gate T4-g1 of the light-emitting reset transistor T4 is the upper side of the first gate T4-g1 of the light-emitting reset transistor T4. That is, the first gate T2-g1 of the voltage-stabilizing transistor T2 is on the upper side of the first gate T4-g1 of the light-emitting reset transistor T4. In the X direction, the first gate T2-g1 of the voltage-stabilizing transistor T2 is at the same position as the first gate T4-g1 of the light-emitting reset transistor T4.

In an embodiment of the present disclosure, the array substrate further includes a second active semiconductor layer located on a side of the second conductive layer away from the substrate and insulated from the second conductive layer.

Figure 8:
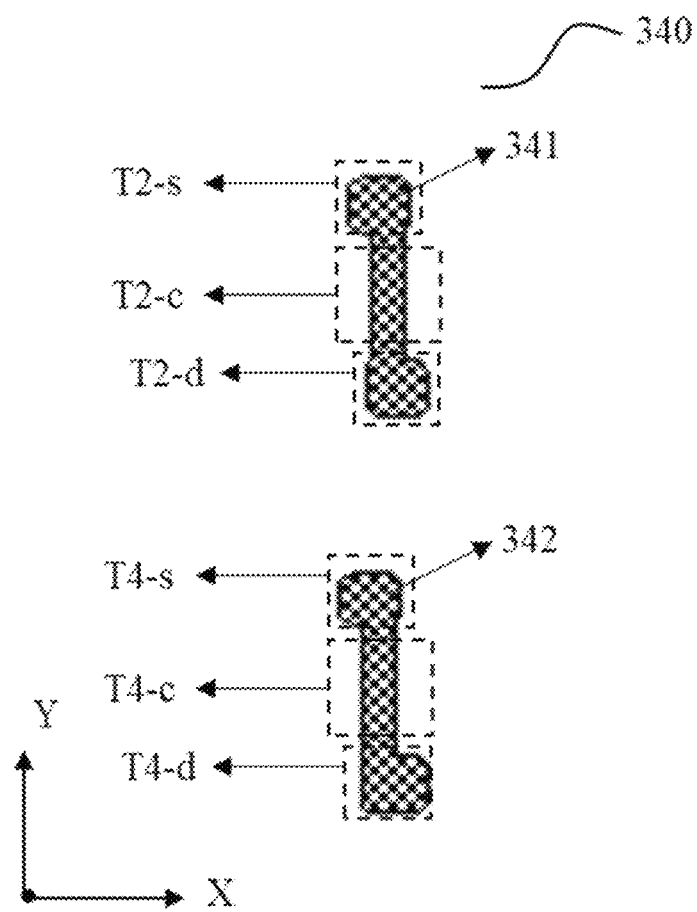

FIG. 8 shows a schematic plan view of the second active semiconductor layer 340 in the array substrate according to an embodiment of the present disclosure. As shown in FIG. 8, the second active semiconductor layer 340 includes a first part 341 and a second part 342 sequentially arranged in the Y direction. The first part 341 of the second active semiconductor layer 340 and the second part 342 of the second active semiconductor layer 340 are aligned with each other. In an exemplary embodiment of the present disclosure, the second active semiconductor layer 340 may be used to form the active layers of the voltage-stabilizing transistor T2 and the light-emitting reset transistor T4 described above. Specifically, the first part 341 of the second active semiconductor layer 340 may be used to form the active layer of the voltage-stabilizing transistor T2. The second part 342 of the second semiconductor layer 340 may be used to form the active layer of the voltage-stabilizing transistor T7. In an exemplary embodiment of the present disclosure, similar to the first active semiconductor layer 310, the second active semiconductor layer 340 includes channel patterns and doped region patterns of the transistors (i.e., the first source/drain regions and the second source/drain regions of the transistors).

In FIG. 8, dotted boxes are used to illustrate regions in the second active semiconductor layer 340 for source/drain regions and channel regions of respective transistors.

As shown in FIG. 8, the first part 341 of the second active semiconductor layer 340 includes a source region T2-s of the voltage-stabilizing transistor T2, a channel region T2-c of the voltage-stabilizing transistor T2 and a drain region T2-d of the voltage-stabilizing transistor T2 sequentially arranged along the Y direction. The second part 342 of the second active semiconductor layer 340 includes a source region T4-s of the light-emitting reset transistor T4, a channel region T4-c of the light-emitting reset transistor T4, and a drain region T4-d of the light-emitting reset transistor T4 sequentially arranged in the Y direction.

In an embodiment of the present disclosure, referring to FIG. 7 and FIG. 8, an overlapping portion between an orthographic projection of the voltage-stabilizing control signal line STVL on the substrate and an orthographic projection of the second active semiconductor layer 340 on the substrate is the first gate T2-g1 of the voltage-stabilizing transistor T2. The projection of the channel region T8-c of the voltage-stabilizing transistor T2 on the substrate completely overlaps with the projection of the first gate T2-g1 of the voltage-stabilizing transistor T2 on the substrate. An overlapping portion between an orthographic projection of the light-emitting control signal line RSTL2 on the substrate and an orthographic projection of the second active semiconductor layer 340 on the substrate is the first gate T4-g1 of the light-emitting reset transistor T4. The projection of the channel region T4-c of the light-emitting reset transistor T4 on the substrate completely overlaps with the projection of the first gate T4-g1 of the light-emitting reset transistor T4 on the substrate.

In an exemplary embodiment of the present disclosure, the second active semiconductor layer 340 may be formed of an oxide semiconductor material, e.g., indium gallium zinc oxide (IGZO). The above-mentioned source regions and drain regions may be regions doped with n-type impurities or p-type impurities. For example, both the source regions and the drain regions of the voltage-stabilizing transistor T2 and the light-emitting reset transistor T4 are regions doped with N-type impurities.

In an embodiment of the present disclosure, the array substrate further includes a third conductive layer located on a side of the second active semiconductor layer away from the substrate and insulated from the second active semiconductor layer.

Figure 9:
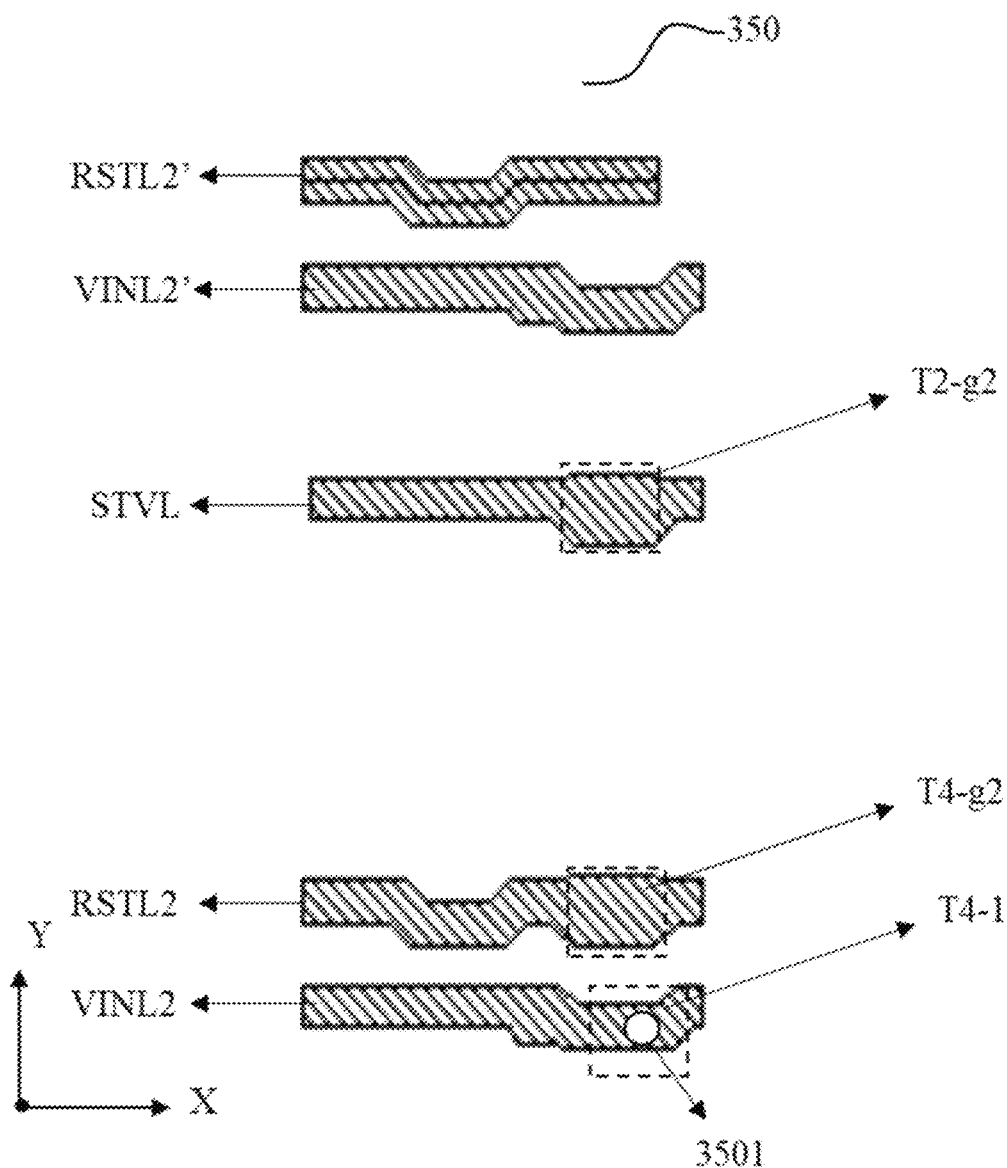

FIG. 9 shows a schematic plan view of the third conductive layer 350 in the array substrate according to an embodiment of the present disclosure. As shown in FIG. 9, the third conductive layer 350 includes a voltage-stabilizing control signal line STVL, a light-emitting reset control signal line RSTL2, and a light-emitting reset voltage line VINL2. In addition, the third conductive layer 350 further includes a light-emitting reset control signal line RSTL2' and a light-emitting reset voltage line VINL2' for an adjacent pixel circuit along the Y direction. The light-emitting reset control signal line RSTL2' and light-emitting reset voltage line VINL2' used for the adjacent pixel circuit have the same effect on the adjacent pixel circuit as the light-emitting reset control signal line RSTL2 and light-emitting reset voltage line VINL2 h on the pixel circuit, and repeated descriptions will be omitted below.

Specifically, as shown in FIG. 9, the voltage-stabilizing control signal line STVL, the light-emitting reset control signal line RSTL2, and the light-emitting reset voltage line VINL2 are sequentially arranged in the Y direction.

In an embodiment of the present disclosure, as shown in FIG. 9, the voltage-stabilizing control signal line STVL is provided with the second gate T2-g2 of the voltage-stabilizing transistor T2. The light-emitting reset control signal line RSTL2 is provided with a second gate T4-g2 of the light-emitting reset transistor T4. Specifically, an overlapping portion of an orthographic projection of the voltage-stabilizing control signal line STVL on the substrate and an orthographic projection of the second active semiconductor layer 340 on the substrate is the second gate T2-g2 of the voltage-stabilizing transistor T2. An overlapping portion of an orthographic projection of the light-emitting reset control signal line RSTL2 on the substrate and an orthographic projection of the second active semiconductor layer 340 on the substrate is the second gate T4-g2 of the light-emitting reset transistor T4.

Similar to the first gate T2-g1 of the voltage-stabilizing transistor T2 and the first gate T4-g1 of the light-emitting reset transistor T4 shown in FIG. 7, the second gate T2-g2 of the voltage-stabilizing transistor T2 is arranged on a first side of the second gate T4-g2 of the light-emitting reset transistor T4 in the Y direction, as shown in FIG. 9. The first side of the second gate T4-g2 of the light-emitting reset transistor T4 is the upper side of the second gate T4-g2 of the light-emitting reset transistor T4. That is, the second gate T2-g2 of the voltage-stabilizing transistor T2 is on the upper side of the second gate T4-g2 of the light-emitting reset transistor T4. In the X direction, the second gate T2-g2 of the voltage-stabilizing transistor T2 is at the same position as the second gate T4-g2 of the light-emitting reset transistor T4.

In an embodiment of the present disclosure, referring to FIGS. 7, 8 and 9, the projections of the second gate T2-g2 of the voltage-stabilizing transistor T2, the channel region T2-c of the voltage-stabilizing transistor T2 and the first gate T2-g1 of the voltage-stabilizing transistor T2 on the substrate completely overlap. The projections of the second gate T4-g2 of the light-emitting reset transistor T4, the channel region T4-c of the light-emitting reset transistor T4 and the first gate T4-g1 of the light-emitting reset transistor T4 on the substrate completely overlap.

It should be noted that, in embodiments of the present disclosure, an insulating layer or a dielectric layer is further provided between adjacent active semiconductor layers and conductive layers. Specifically, an insulating layer or a dielectric layer is provided between the first active semiconductor layer 310 and the first conductive layer 320, between the first conductive layer 320 and the second conductive layer 330, between the second conductive layer 330 and the second active semiconductor layer 340, between the second active semiconductor layer 340 and the third conductive layer 350, between the third conductive layer 350 and a fourth conductive layer 360 (which will be described in detail below with reference to FIG. 12), and between the fourth conductive layer 360 and a fifth conductive layer 370 (which will be described in detail below with reference to FIG. 11). Details will be provided with reference to cross-sectional views.

It should be noted that via holes described below are via holes simultaneously penetrating through insulating layers or dielectric layers provided between adjacent active semiconductor layers and conductive layers or between adjacent conductive layers. Specifically, the via holes penetrate simultaneously an insulating layer or a dielectric layer between the first active semiconductor layer 310 and the first conductive layer 320, between the first conductive layer 320 and the second conductive layer 330, between the second conductive layer 330 and the second active semiconductor layer 340, between the second active semiconductor layer 340 and the third conductive layer 350, between the third conductive layer 350 and the fourth conductive layer 360, and between the fourth conductive layer 360 and the fifth conductive layer 370.

In the drawings of the present disclosure, white circles are used to indicate regions corresponding to vias. Referring to FIG. 9, the light-emitting reset voltage line VINL2 is coupled to the second active semiconductor layer 340 through a via hole 3501 to form the first electrode T4-1 of the light-emitting reset transistor T4. Specifically, referring to FIGS. 8 and 9, the projection of the light-emitting reset voltage line VINL2 in FIG. 9 overlaps with the projection of the drain region T7-d of the light-emitting reset transistor T4 of the second part 342 in FIG. 8 on the substrate. The light-emitting reset voltage line VINL2 is coupled to the drain region T4-d of the light-emitting reset transistor T4 through the via hole 3501.

In an embodiment of the present disclosure, the array substrate further includes a fourth conductive layer located on a side of the third conductive layer away from the substrate and insulated from the third conductive layer.

Figure 10:
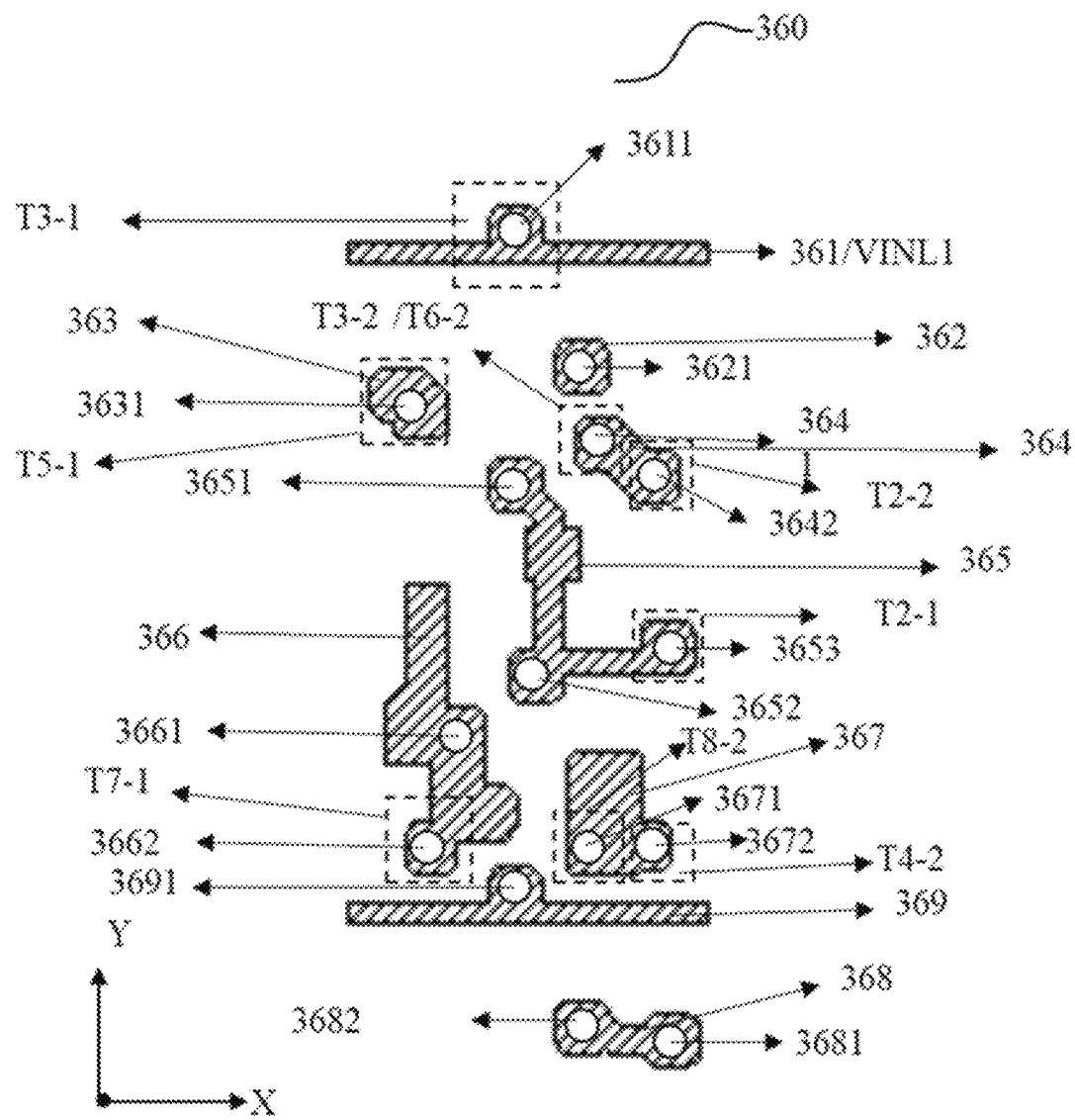

FIG. 10 shows a schematic plan view of the fourth conductive layer 360 in the array substrate according to an embodiment of the present disclosure. As shown in FIG. 10, the fourth conductive layer 360 includes a first connection portion 361, a second connection portion 362, a third connection portion 363, a fourth connection portion 364, a fifth connection portion 365, a sixth connection portion 366, a seventh connection portion 367, an eighth connection portion 368. In addition, the fourth conductive layer 360 further includes a ninth connection portion 369 for an adjacent pixel circuit along the Y direction. The ninth connection portion 369 and a via hole 3691 thereon may serve as the first connection portion 361 and the via hole 3611 thereon for the adjacent pixel circuit. The specific connection manner and function thereof are similar to the first connection portion 361 in the pixel circuit and the via hole 3611 thereon, which will not be repeated below. For patterning needs, the first connection portion 361 for the adjacent pixel circuit and the via holes 3611 thereon are arranged as above.

In an embodiment of the present disclosure, the second connection portion 362, the third connection portion 363, the fourth connection portion 364, the fifth connection portion 365, the sixth connection portion 366, the seventh connection portion 367, and the eighth connection portion 368 are provided on the second side of the first connection portion 361. Similar to the second side of the gate T1-g of the driving transistor T1, in the XY coordinate system, the second side of the first connection portion 361 is the lower side of the first connection portion 361. That is, the second connection portion 362, the third connection portion 363, the fourth connection portion 364, the fifth connection portion 365, the sixth connection portion 366, the seventh connection portion 367, and the eighth connection portion 368 are provided on the lower side of the first connection portion 361. The third connection portion 363 and the sixth connection portion 366 are sequentially arranged along the Y direction. The second connection portion 362, the fourth connection portion 364, the fifth connection portion 365, the seventh connection portion 367, and the eighth connection portion 368 are sequentially arranged along the Y direction. The second connection portion 362, the fourth connection portion 364, the fifth connection portion 365, the seventh connection portion 367, and the eighth connection portion 368 are located on the third side of the third connection portion 363 and the sixth connection portion 366. Similar to the third side of the gate T1-g of the above-mentioned driving transistor T1, in the XY plane, the third side of the third connection portion 363 and the sixth connection portion 366 is the right side of the third connection portion 363 and the sixth connection portion 366. That is, the second connection portion 362, the fourth connection portion 364, the fifth connection portion 365, the seventh connection portion 367, and the eighth connection portion 368 are on the right side of the third connection portion 363 and the sixth connection portion 366.

The first connection portion 361 is coupled to the first active semiconductor layer 310 through a via hole 3611. Specifically, the first connection portion 361 is coupled to the drain region T3-d of the driving reset transistor T3 through the via hole 3611 to form the first electrode T3-1 of the driving reset transistor T3. The first connection portion 361 serves as the driving reset voltage line VINL1.

The second connection portion 362 is coupled to the third conductive layer 350 through a via hole 3621. Specifically, the second connection portion 362 is coupled to the light-emitting reset voltage line VINL2 through the via hole 3621.

The third connection portion 363 is coupled to the first active semiconductor layer 310 through a via hole 3631. Specifically, the third connection portion 363 is coupled to the drain region T5-d of the data writing transistor T5 through the via hole 363 to form the first electrode T5-1 of the data writing transistor T5.

The fourth connection portion 364 is coupled to the first active semiconductor layer 310 through a via hole 3641. Specifically, the fourth connection portion 364 is coupled to the source region of the driving reset transistor T3 and the source region of the compensation transistor T6 (T3-s/T6-s) through the via hole 3641 to form the second electrode of the driving reset transistor T3 and the second electrode of the compensation transistor T6 (T3-2/T6-2). The fourth connection portion 364 is coupled to the second active semiconductor layer 340 through the via hole 3642. Specifically, the fourth connection portion 364 is coupled to the source region T2-s of the voltage-stabilizing transistor T2 through the via hole 3642 to form the second electrode T2-2 of the voltage-stabilizing transistor T2.

The fifth connection portion 365 is coupled to the third conductive layer 330 through a via hole 3651. The fifth connection portion 365 is coupled to the second conductive layer 320 through a via hole 3652. Specifically, the fifth connection portion 365 is coupled to the gate electrode T1-g of the driving transistor T1 and the first electrode C1 of the capacitor C through the via hole 3652. The fifth connection portion 365 is coupled to the second active semiconductor layer 340 through a via hole 3653. Specifically, the fifth connection portion 365 is coupled to the drain region T2-d of the voltage-stabilizing transistor T2 through the via hole 3653 to form the first electrode T2-1 of the voltage-stabilizing transistor T2.

The sixth connection portion 366 is coupled to the first active semiconductor layer 310 through a via hole 3662. Specifically, the sixth connection portion 366 is coupled to the drain region T7-d of the first light-emitting control transistor T7 through the via hole 3662 to form the first electrode T7-1 of the first light-emitting control transistor T7.

The seventh connection portion 367 is coupled to the first active semiconductor layer 310 through a via hole 3671. Specifically, the seventh connection portion 367 is coupled to the source region T8-s of the second light-emitting control transistor T8 through the via hole 3671 to form the second electrode T8-2 of the second light-emitting control transistor T8. The seventh connection portion 367 is coupled to the second active semiconductor layer 340 through a via hole 3672. Specifically, the seventh connection portion 367 is coupled to the source region T4-s of the light-emitting reset transistor T4 through the via hole 3672 to form the second electrode T4-2 of the light-emitting reset transistor T4.

The eighth connection portion 368 is coupled to the second active semiconductor layer 340 through a via hole 3681. Specifically, the eighth connection portion 368 is coupled to the source region T4-d of the light-emitting reset transistor T4 through the via hole 3681 to form the first electrode T4-1 of the light-emitting reset transistor T4. In addition, the eighth connection portion 368 and the via hole 3682 thereon may serve as the second connection portion 362 and the via hole 3621 thereon for the adjacent pixel circuit along the Y direction. The specific connection method and function thereof are similar to the second connection portion 362 in the pixel circuit and the via hole 3621 thereon, and are not repeated here. For patterning needs, the second connection portion 362 for the adjacent pixel circuit and the via hole 3621 thereon are arranged as described above.

In an embodiment of the present disclosure, the array substrate further includes a fifth conductive layer located on a side of the fourth conductive layer away from the substrate and insulated from the fourth conductive layer.

Figure 11:
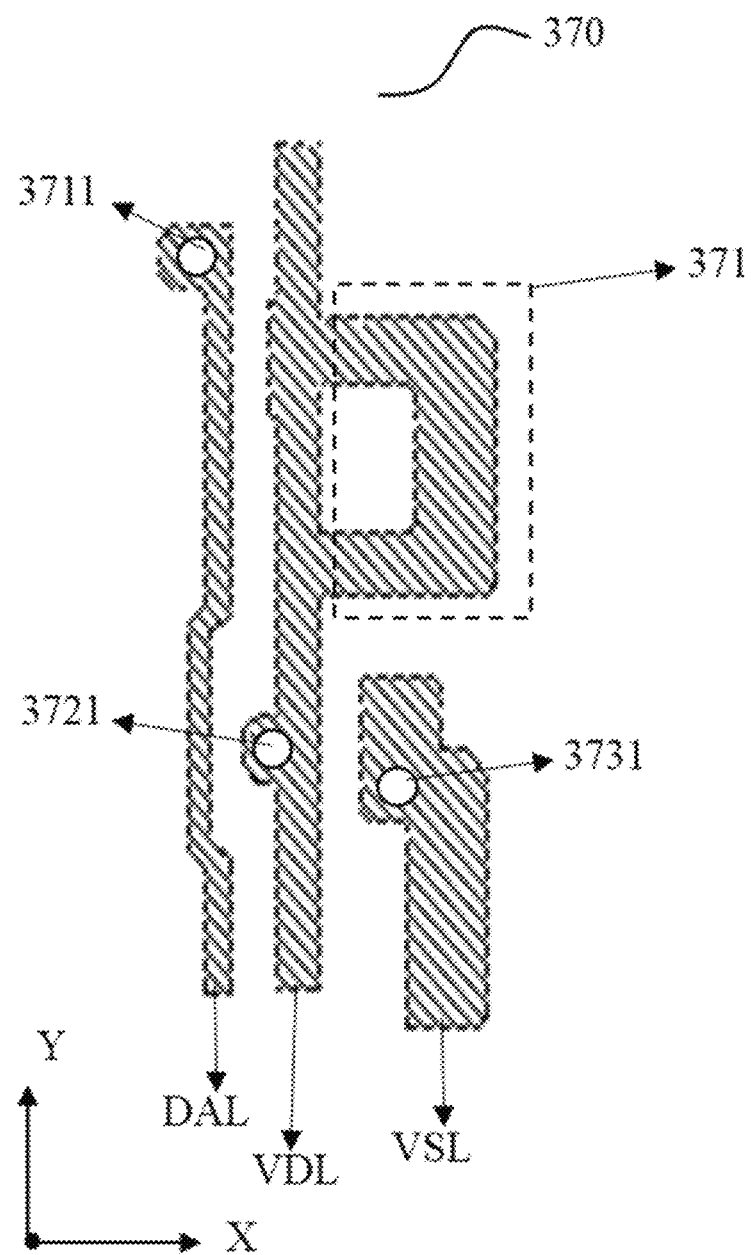

FIG. 11 shows a schematic plan view of the fifth conductive layer 370 in the array substrate according to an embodiment of the present disclosure. As shown in FIG. 11, the fifth conductive layer includes a data signal line DAL, a first power voltage line VDL, and a second power voltage line VSL arranged along the row direction X. The data signal line DAL extends along the column direction Y, and is coupled to the third connection portion 363 of the fourth conductive layer 360 through a via hole 3711. The first power voltage line VDL extends along the column direction Y, and is coupled to the third connection portion 363 of the fourth conductive layer 360 through a via hole 3721. The second power voltage line VSL extends along the column direction Y, and is coupled to the seventh connection portion 367 of the fourth conductive layer 360 through a via hole 3731. In an embodiment of the present disclosure, the distance over which the second power voltage line VSL extends in the column direction Y is smaller than that of the data signal line DAL and the first power voltage line VDL. The second power voltage line VSL may be used as a cathode of a light-emitting device such as an OLED.

In an embodiment of the present disclosure, the first power voltage line VDL has a closed rectangular part 371. Referring to FIG. 8 and FIG. 11, an orthographic projection of a second edge of the rectangular member 371 extending in the Y direction and disposed along the row direction X on the substrate overlaps with an orthographic projection of the first part 341 of the second active semiconductor layer 340 on the substrate. This arrangement can isolate the second active semiconductor layer 340 from an encapsulation layer on a side of the fifth conductive layer 370 away from the substrate and adjacent to the fifth conductive layer 370, thereby preventing the hydrogen element in the encapsulation layer from causing properties of oxide materials in the second active semiconductor layer 340 (such as metal oxide materials) to be unstable.

In an embodiment of the present disclosure, an orthographic projection of the second power voltage line VSL on the substrate overlaps an orthographic projection of the second part 342 of the second active semiconductor layer 340 on the substrate. This arrangement of the second power voltage line VSL has a similar effect to the arrangement of the first power voltage line VDL described above. This arrangement can isolate the second active semiconductor layer 340 from the encapsulation layer on a side of the fifth conductive layer 370 away from the substrate and adjacent to the fifth conductive layer 370, thereby preventing the hydrogen element in the encapsulation layer from causing properties of oxide materials in the second active semiconductor layer 340 (such as metal oxide materials) to be unstable.

Figure 12:
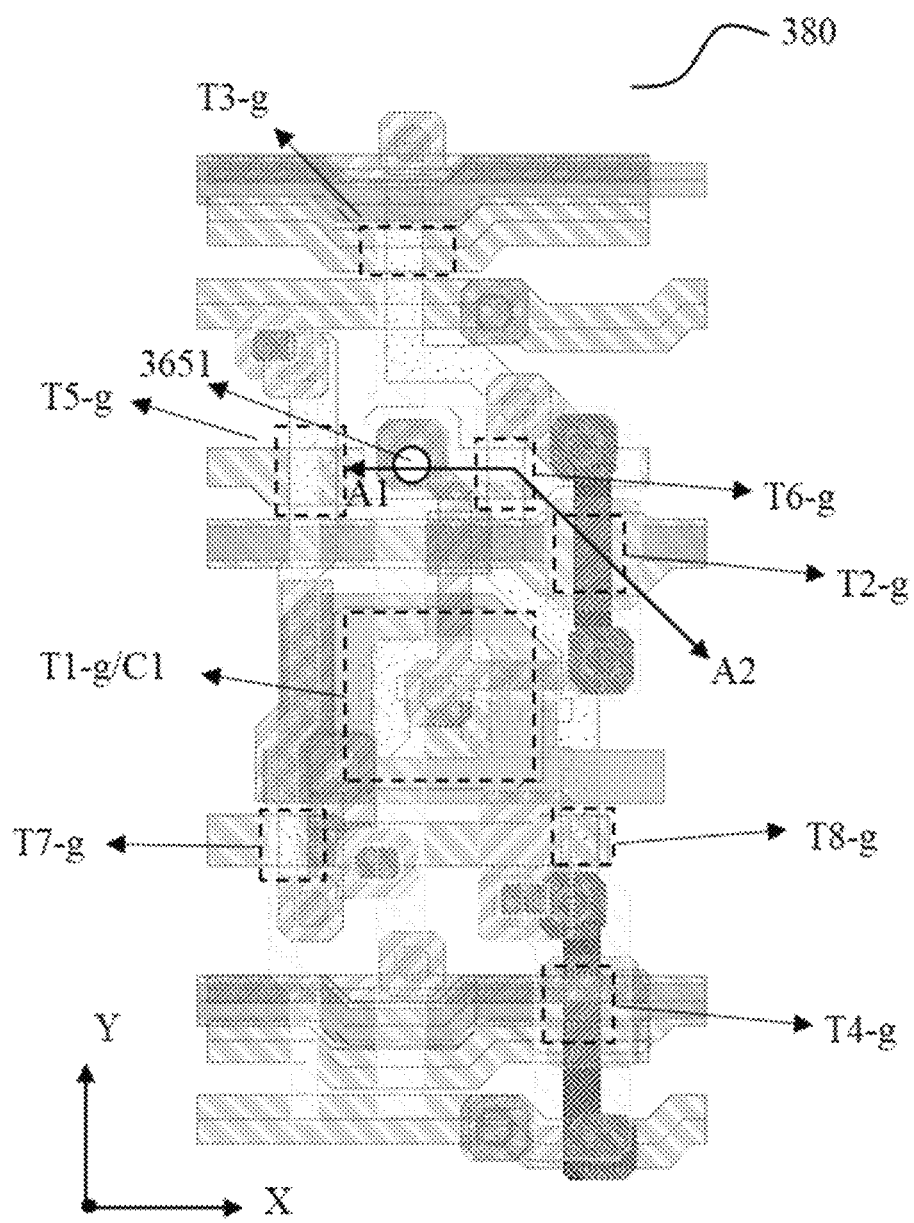
FIG. 12 shows a schematic plan layout of a pixel circuit including an active semiconductor layer, a first conductive layer, a second conductive layer, a third conductive layer and a fourth conductive layer which are stacked.

FIG. 12 a schematic plan layout of a pixel circuit (and an array substrate formed by the pixel circuit) including a first active semiconductor layer, a first conductive layer, a second conductive layer, a second active semiconductor layer, a third conductive layer and a fourth conductive layer which are stacked. As shown in FIG. 12, the plan layout diagram 380 includes the first active semiconductor layer 310, the first conductive layer 320, the second conductive layer 330, the second active semiconductor layer 340, the third conductive layer 350, the fourth conductive layer 360 and the fifth conductive layer 370. For ease of viewing, FIG. 12 shows the gate T1-g of the driving transistor T1, the gate T2-g of the voltage-stabilizing transistor T2, the gate T3-g of the driving reset transistor T3, the gate T4-g of the light-emitting reset transistor T4, the gate T5-g of the data writing transistor T5, the gate T6-g of the compensation transistor T6, the first electrode plate C1 of the storage capacitor C, the gate T7-g of the first light-emitting control transistor T7 and the gate T8-g of the second light-emitting control transistor T8. FIG. 12 also shows a line A1A2 passing through the array substrate where the via hole 3651, the gate T6-g of the compensation transistor T6 and the gate T2-g of the voltage-stabilizing transistor T2 are located. A cross-sectional view taken along the line A1A2 will be described below with reference to FIG. 13.

Figure 13:
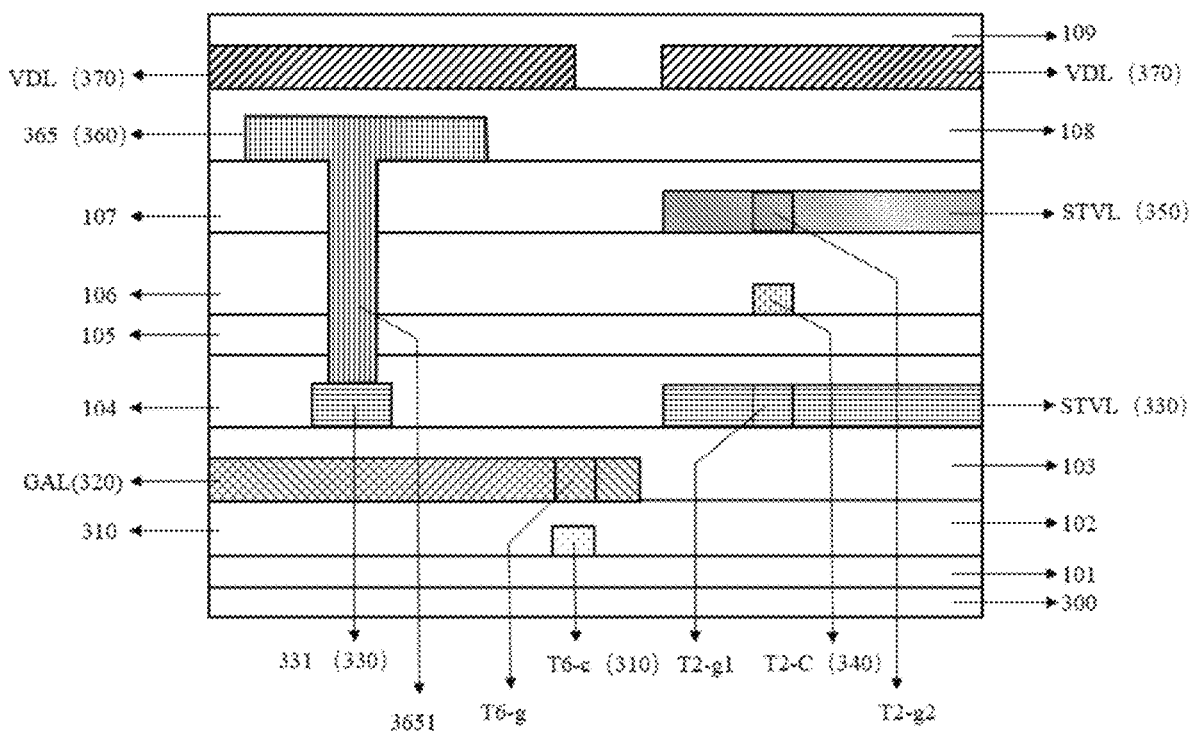
FIG. 13 shows a schematic cross-sectional structure diagram of the array substrate taken along a line A1A2 in FIG. 12 according to an embodiment of the present disclosure.

FIG. 13 shows a schematic cross-sectional structure diagram of the array substrate taken along the line A1A2 in FIG. 12 according to an embodiment of the present disclosure. As shown in FIG. 13, and referring to FIGS. 5 to 12, the array substrate 10 includes: a substrate 300; a first buffer layer 101 on the substrate 300; and a first active semiconductor layer 310 on the first buffer layer 101. The cross-sectional view shows the channel region T6-c of the compensation transistor T6 included in the first active semiconductor layer 310.

In an embodiment of the present disclosure, as shown in FIG. 13, the array substrate 10 further includes: a first gate insulating layer 102 covering the first buffer layer 101 and the first active semiconductor layer 310; and a first conductive layer 320 on a side of the first gate insulating layer 102 away from the substrate 300. The cross-sectional view shows the scan signal line GAL included in the first conductive layer 320. As shown in FIG. 13, an overlapping portion of the orthographic projection of the scan signal line GAL on the substrate 300 and the orthographic projection of the channel region T6-c of the compensation transistor T6 included in the first active semiconductor layer 310 on the substrate 300 is the gate T6-g of the compensation transistor T6.

In an embodiment of the present disclosure, as shown in FIG. 13, the array substrate 10 further includes: a first interlayer insulating layer 103 located on a side of the first conductive layer 320 away from the substrate 300; the second conductive layer 330 located on a side of the first interlayer insulating layer 103 away from the substrate 300. The cross-sectional view shows the voltage-stabilizing control signal line STVL and one connection portion 331 included in the second conductive layer. The voltage-stabilizing control signal line STVL includes the first gate T2-g1 of the voltage-stabilizing transistor T2.

In an embodiment of the present disclosure, as shown in FIG. 13, the array substrate 10 further includes: a second interlayer insulating layer 104 located on s side of the second conductive layer 330 away from the substrate 300; and a second buffer layer 105 covering the second interlayer insulating layer 104; and the second active semiconductor layer 340 located on a side of the second buffer layer 105 away from the substrate 300. The cross-sectional view shows that the orthographic projection of the channel region T2-c of the voltage-stabilizing transistor T2 on the substrate 300 overlaps with the orthographic projection of the first gate T2-g1 of the voltage-stabilizing transistor T2 on the voltage-stabilizing control signal line STVL on the substrate 300.

In an embodiment of the present disclosure, as shown in FIG. 13, the array substrate 10 further includes: a second gate insulating layer 106 covering the second active semiconductor layer 340 and the second buffer layer 105; and a third conductive layer 350 on a side of the second gate insulating layer 106 away from the substrate 300. The cross-sectional view shows that the third conductive layer 350 includes the voltage-stabilizing control signal line STVL. As shown in FIG. 13, an overlapping portion between the orthographic projection of the voltage-stabilizing control signal line STVL on the substrate 300 and the orthographic projection of the channel region T2-c of the voltage-stabilizing transistor T2 included in the second active semiconductor layer 320 on the substrate 300 is the second gate T2-g2 of the voltage-stabilizing transistor T2.

In an embodiment of the present disclosure, as shown in FIG. 13, the array substrate 10 further includes: a third interlayer insulating layer 107 covering the third conductive layer 350 and the second gate insulating layer 106; and a fourth conductive layer 360 on a side of the third interlayer insulating layer 107 away from the substrate 300. Referring to FIG. 10, the cross-sectional view shows the fifth connection portion 365. The fifth connection portion 365 is coupled to the connection portion 331 in the second conductive layer 330 through the via hole 3651.

In an embodiment of the present disclosure, as shown in FIG. 13, the array substrate 10 further includes: a first planarization layer 108 covering the fourth conductive layer 360 and the third interlayer insulating layer 107; and a fifth conductive layer 370 on a side of the first planarization layer 108 away from the substrate 300. The cross-sectional view shows the first power voltage line VDL.

In an embodiment of the present disclosure, as shown in FIG. 13, the array substrate 10 further includes a second planarization layer 109 covering the fifth conductive layer 370 and the first planarization layer 108.

Figure 14:
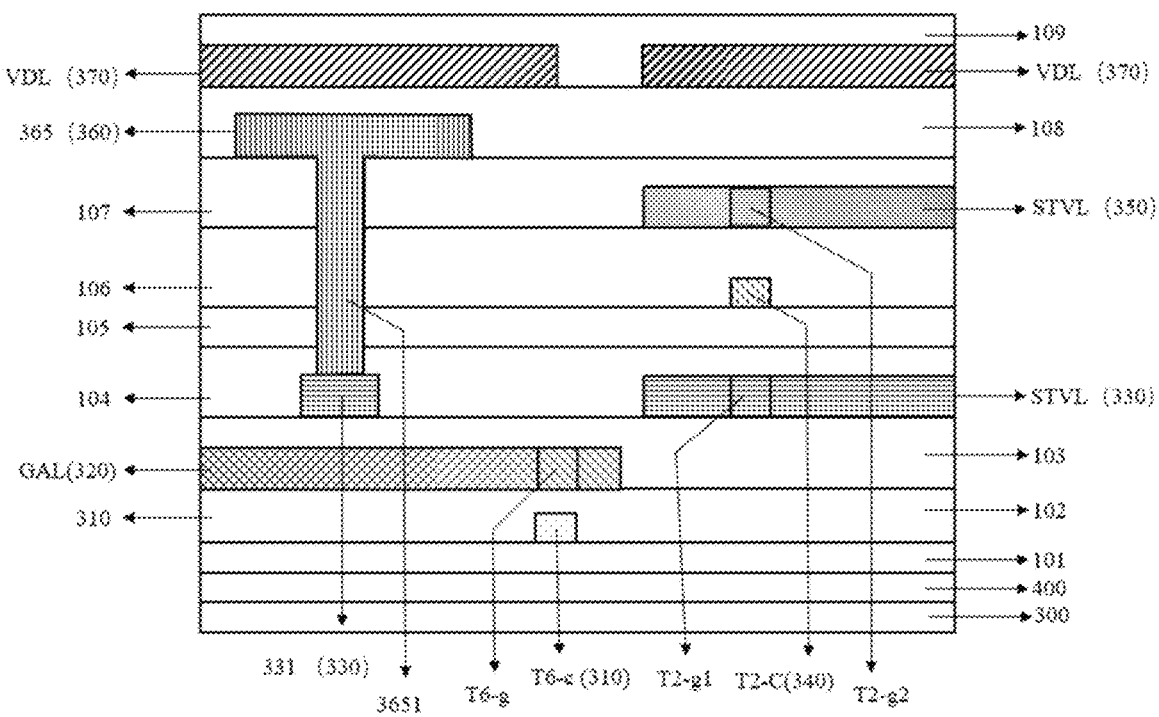
FIG. 14 shows a schematic cross-sectional structure diagram of the array substrate taken along the line A1A2 in FIG. 12 according to an embodiment of the present disclosure.

FIG. 14 shows a schematic cross-sectional structure diagram of the array substrate taken along the line A1A2 in FIG. 12 according to an embodiment of the present disclosure. In an embodiment of the present disclosure, as shown in FIG. 14, the array substrate 10 further includes a shielding layer 400 located between the substrate 100 and the first buffer layer 101. On the one hand, when the substrate 300 is a light-transmitting substrate, the shielding layer 400 is configured to at least partially block the light incident from a side of the substrate 300 on which no pixel circuit is provided to the active semiconductor layers of the transistors in the pixel circuits, in order to prevent photodegradation of the transistors. On the other hand, the shielding layer 400 is configured to block particles released from the substrate from entering the pixel circuits. The released particles can also degrade transistors performance if they enter the active semiconductor layers. In addition, in the case where the particles are charged particles, once embedded in the pixel circuit structure (e.g., in the dielectric layer of the circuit structure), the particles will also interfere with various signal voltages input to the pixel circuits, thereby affecting the display performance. For example, when the substrate 300 is a polyimide substrate, since the polyimide material always contains various impurity ions undesirably, during the thermal exposure process (e.g., growth of the active semiconductor layers and sputtering and evaporation of conductive layers such as metals), these impurity ions are released from the substrate 300 into the pixel circuits.

In an embodiment of the present disclosure, the shielding layer 400 may not be biased (i.e., suspended). In addition, a voltage bias can also be applied to the shielding layer 400 to further improve the shielding effect. According to an embodiment of the present disclosure, the voltage applied to the shielding layer may be a constant voltage. The voltage applied to the shielding layer may be selected from one of the following voltages: a first power voltage Vdd (an anode voltage of the light-emitting device), a second power voltage Vss (a cathode voltage of the light-emitting device), a driving reset voltage VINT1 or other voltages. According to an embodiment of the present disclosure, the range of the voltage applied to the shielding layer includes one selected from the following ranges: $-10V\sim+10V$, $-5V\sim+5V$, $-3V\sim+3V$, $-1V\sim+1V$, or $-0.5V\sim+0.5V$. According to an embodiment of the present disclosure, the voltage applied to the shielding layer may be selected from one of the following voltages: $-0.3V$, $-0.2V$, 0V, 0.1V, 0.2V, 0.3V, or 10.1V. According to an embodiment of the present disclosure, the voltage applied to the shielding layer may be greater than the second power voltage Vss and less than the first power voltage Vdd; or, the voltage applied to the shielding layer may be greater than the driving reset voltage VINT1 and less than the first power voltage Vdd.

Figure 15:
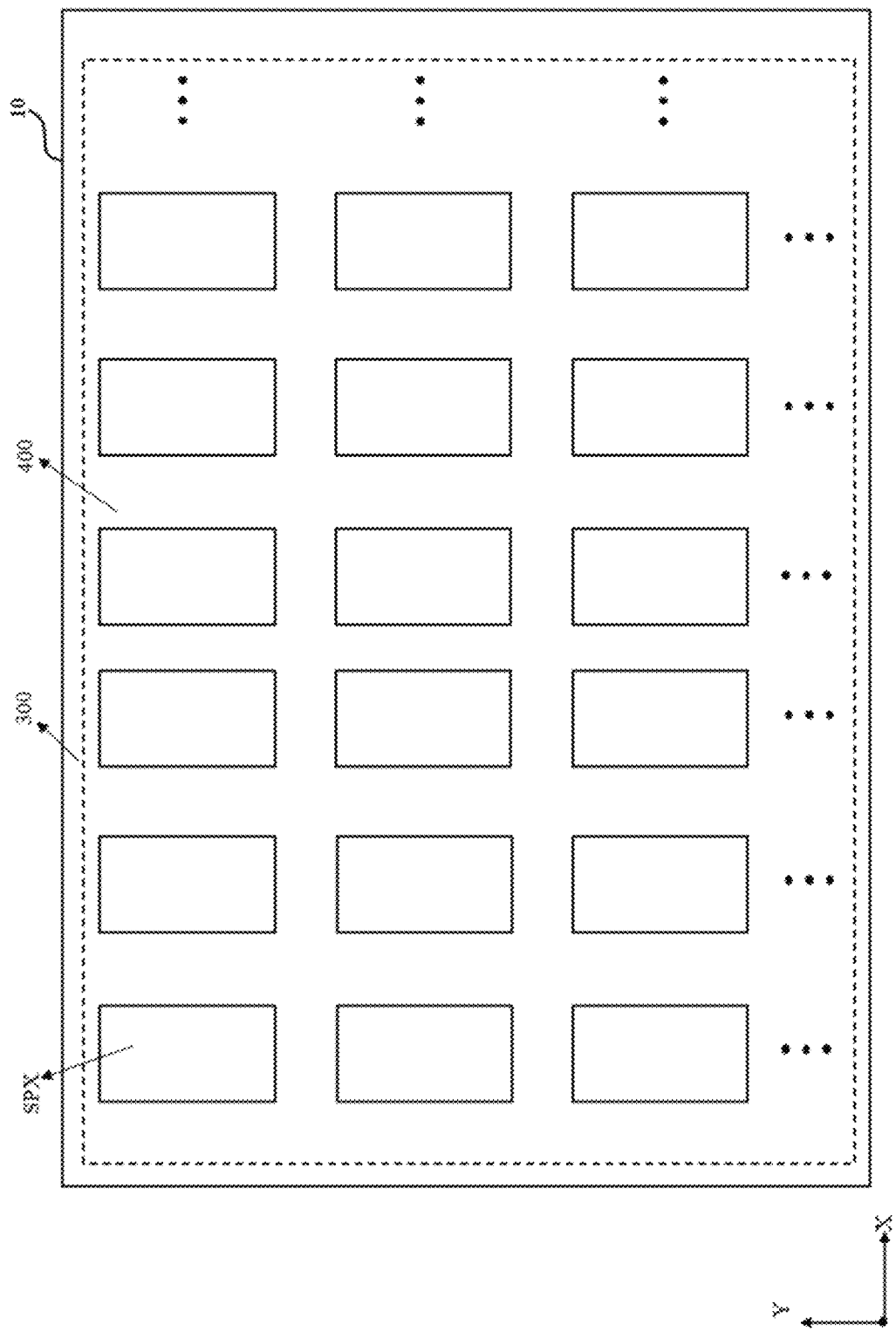
FIG. 15 shows a schematic block diagram of an array substrate according to an embodiment of the present disclosure.

FIG. 15 shows a schematic block diagram of an array substrate according to an embodiment of the present disclosure. FIG. 15 shows a configuration of a shielding layer 400a. In this configuration, the shielding layer 400a completely covers the substrate 300 on a region of the array substrate 10 where the pixel units are provided (i.e., the display region). The cross-sectional structure of FIG. 14 corresponds to this configuration. By completely covering the display region of the array substrate, the shielding layer can achieve the best protection effect.

Figure 16:
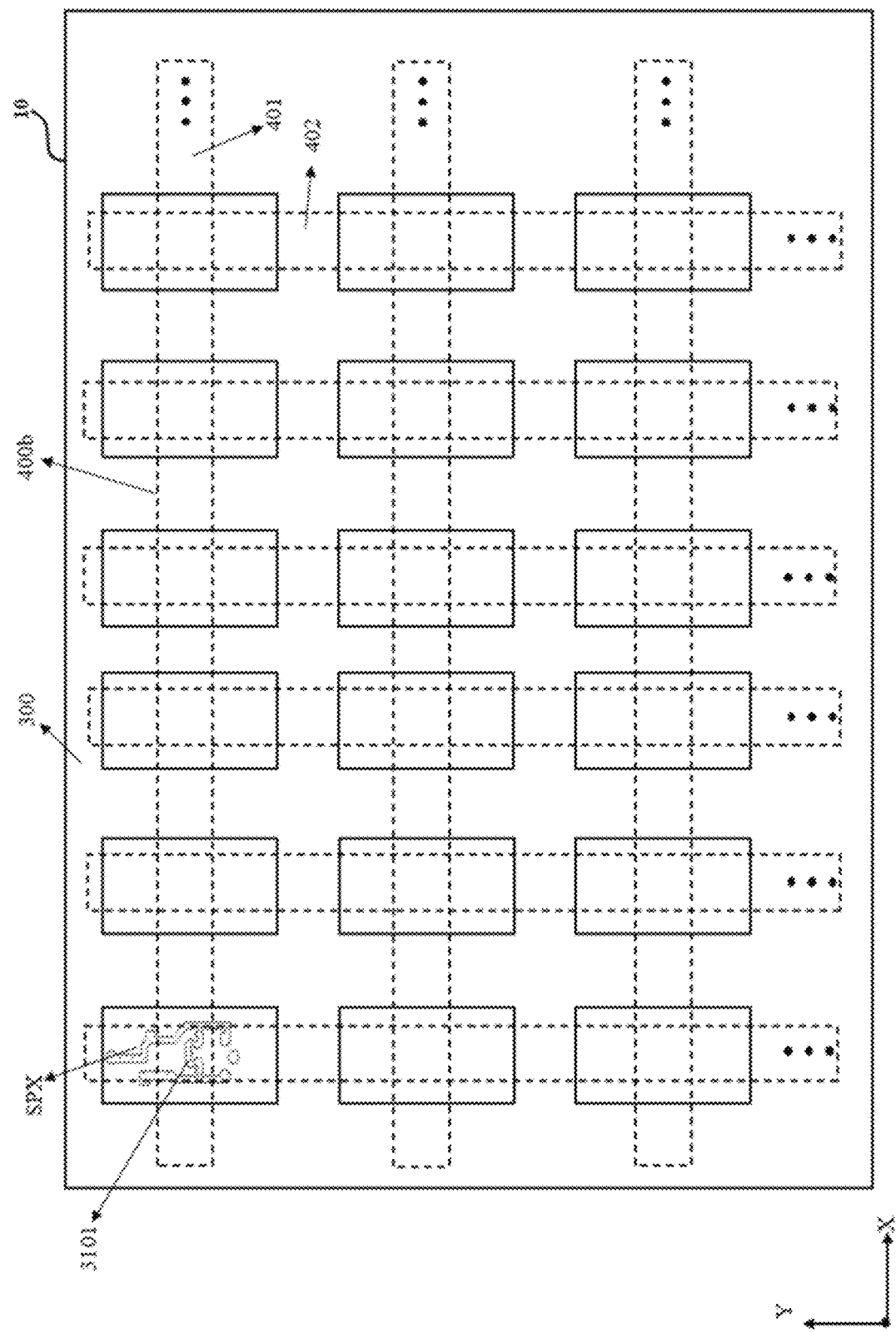
FIG. 16 shows a schematic block diagram of an array substrate according to an embodiment of the present disclosure.

FIG. 16 shows a schematic block diagram of an array substrate according to an embodiment of the present disclosure. FIG. 16 shows another configuration of the shielding layer 400b in which the shielding layer 400b does not completely cover the substrate 300 on a region of the array substrate 10 wherein the pixel units are provided (i.e., the display region). In this configuration, the shielding layer 400b includes first strips 401 extending in the row direction X and spaced apart from each other in the column direction Y, and second strips 402 extending in the column direction Y and spaced apart from each other in the row direction X. The first strips 401 and the second strips 402 have the same width (i.e., a size in a direction perpendicular to the extending direction of the strips). In addition, the orthographic projection of an intersecting portion of a first strip 401 and a second strip 402 on the substrate 300 and the orthographic projection of the active region 3101 of the driving transistor T1 (i.e., portions of the first active semiconductor layer 310 which constitute the channel region T1-c, the source region T1-s and the drain region T1-d of the driving transistor T1) on the substrate 300 at least partially overlap. This configuration can not only sufficiently protect the active region of the driving transistor T1 which is a key component of the pixel circuit, but also reduce undesired overlapping between the shielding layer 400b and the wiring on the array substrate 10 while ensuring the continuity of the entire shielding layer 400b, thereby reducing unwanted parasitic effects such as parasitic capacitance.

Figure 17:
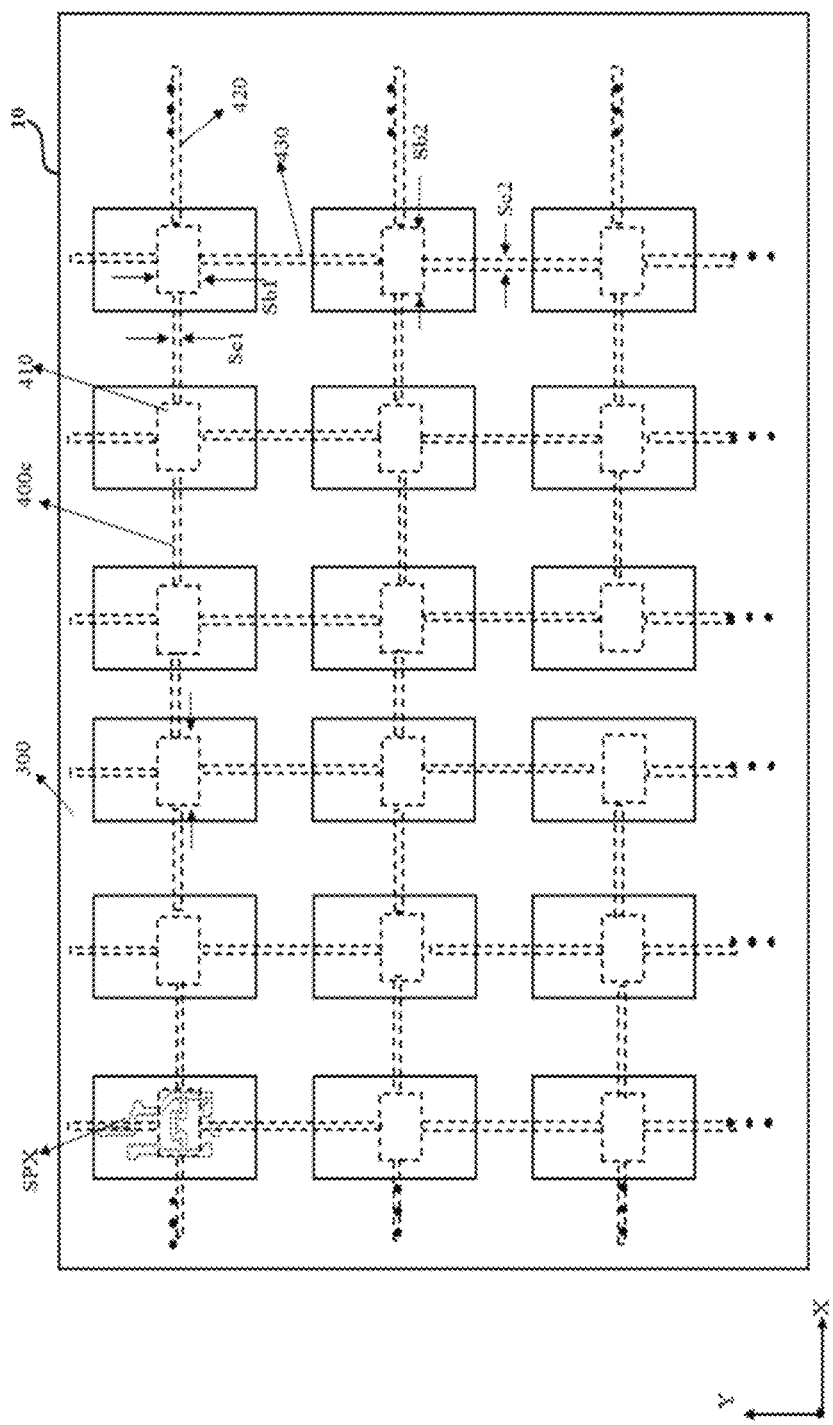
FIG. 17 shows a schematic block diagram of an array substrate according to an embodiment of the present disclosure.

FIG. 17 shows a schematic block diagram of an array substrate according to an embodiment of the present disclosure. FIG. 17 shows another configuration of the shielding layer 400c in which, similar to the configuration of the shielding layer 400b in FIG. 16, the shielding layer 400c also does not completely cover the substrate 300 on a region of the array substrate 10 where the pixel units are provided (i.e., the display region). In this configuration, the shielding layer 400b has a main body 410 in each subpixel, first connection portions 420 for connecting the main bodies 410 in the row direction X, and second connection portions 430 for connecting the main bodies 410 in the column direction Y. The size Sc1 of each first connection portion 420 along the column direction is smaller than the size Sb1 of the main body 410 along the column direction, and the sizes Sc2 of each second connection portion 430 along the row direction is smaller than the size Sb2 of the main body 410 along the row direction. It should be understood that in the present disclosure, the term "size" is intended to mean the largest size of a component. With this configuration, undesired overlapping between the shielding layer and the wiring in the array substrate can be further reduced, thereby suppressing potential parasitic effects.

In an embodiment of the present disclosure, the size Sc1 of the first connection portion 420 in the column direction may be the same as the size Sc2 of the second connection portion 430 in the row direction. In addition, the size Sc1 of the first connection portion 420 in the column direction may be different from the size Sc2 of the second connection portion 430 in the row direction. The size Sc1 of the first connection portion 420 in the column direction may be smaller than the sizes Sc2 of the second connection portion 430 in the row direction. The inventor found that the data line DAL of the pixel unit extending along the column direction Y (as shown in FIG. 11) is more sensitive to parasitic interference than the gate signal line (the driving reset control signal line RSTL1, the scan signal line GAL, light-emitting control signal line EML) in the pixel circuit extending along the row direction X. Therefore, by appropriately reducing the size Sc1 of the first connection portion 420 along the column direction and increasing the size Sc2 of the second connection portion 430 along the row direction, the conductivity of the entire shielding layer can be ensured while reducing the influence of parasitic effects. When a voltage bias is applied to the shielding layer, it can be ensured that the bias voltage is uniform across the shielding layer.

Figure 18:
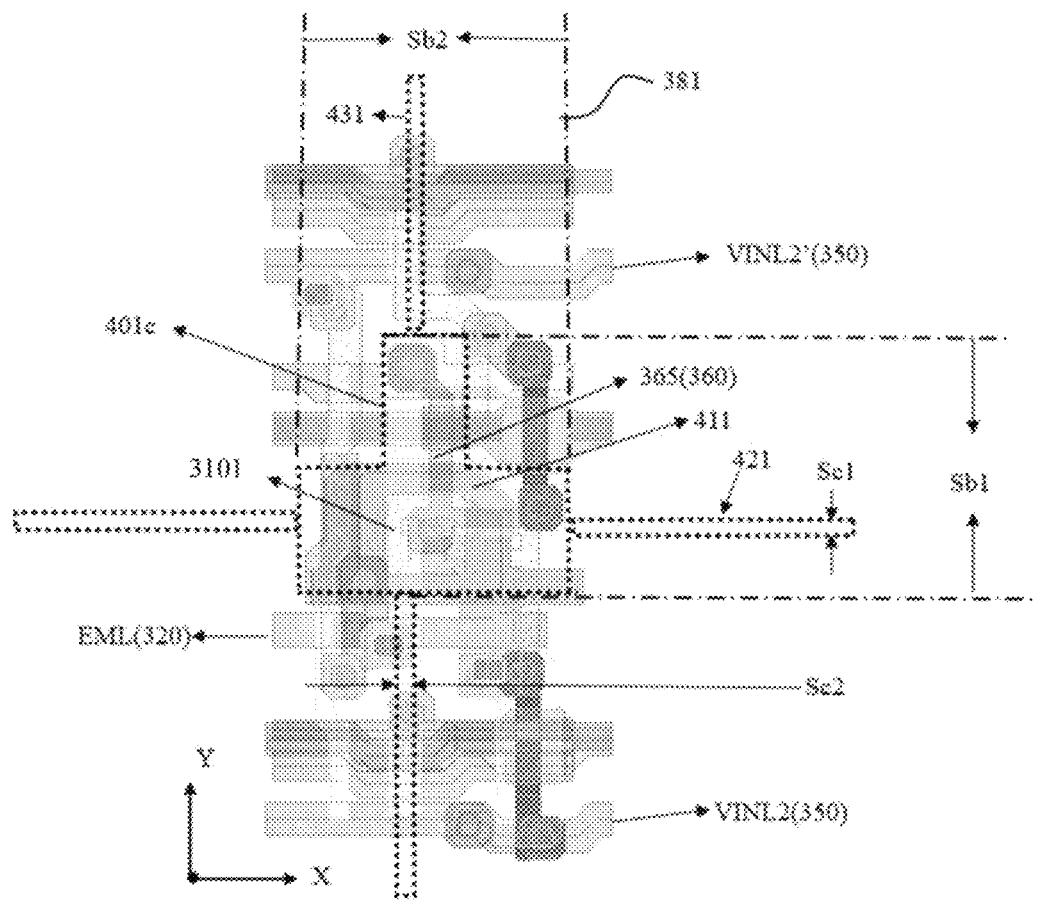
FIG. 18 shows a schematic plan layout of a pixel circuit including a shielding layer, an active semiconductor layer, a first conductive layer, a second conductive layer, a third conductive layer, and a fourth conductive layer which are stacked.

FIG. 18 shows a schematic plan layout of a pixel circuit including a shielding layer, an active semiconductor layer, a first conductive layer, a second conductive layer, a third conductive layer, and a fourth conductive layer which are stacked. In the plan layout 381 shown in FIG. 18, the shielding layer 401c has the configuration shown in FIG. 17. The shielding layer 401c has a main body 411 in each sub-pixel, first connection portions 421 for connecting the main bodies 411 in the row direction, and second connection portions 431 for connecting the main bodies 410 in the column direction. The size Sc1 of each first connection portion 421 in the column direction is smaller than the sizes Sb1 of the main body 410 in the column direction, and the sizes Sc2 of each second connection portion 430 in the row direction is smaller than the size Sb2 of the main body 410 in the column direction. In the configuration, the body 411 is shaped and sized to not only at least partially overlap the active region 3101 of the driving transistor T1 in a direction perpendicular to the substrate, but also at least partially overlap the fifth connection portion 365 of the fourth conductive layer 360. In an embodiment of the present disclosure, at least 10% of the area of the fifth connection portion overlaps with the main body 411 in a direction perpendicular to the substrate. For example, FIG. 18 only shows the case where the body 411 completely overlaps the active region 3101 of the driving transistor T1 and the fifth connection portion 365 of the fourth conductive layer 360, and however the scope of the present disclosure is not limited to this. Since the fifth connection portion 365 is connected to the gate of the driving transistor T1, shielding the fifth connection portion 365 can effectively avoid the impact of charged particles on the gate voltage of the driving transistor, and ensure normal display of images.

Furthermore, for the configurations of the shielding layer shown in FIGS. 17 and 18, the size (width) Sc2 of the second connection portions 430 and 431 in the row direction may vary in the column direction. In an embodiment of the present disclosure, the width of a portion of the second connection portion where the second connection portion overlaps a wire extending in the row direction for transmission of a signal of a relatively high frequency may be larger than the width of a portion of the second connection portion where the second connection portion overlaps a wire extending in the row direction for transmission of a signal of a relatively low frequency. The wire extending in the row direction for transmission of the signal having a relatively high frequency includes, for example, the light-emitting control signal line EML, the scan signal line GAL, and the like. The higher the signal frequency, the more significant the parasitic effect. Therefore, with this configuration, the limiting and interference of the shielding layer to the high-frequency signal can be effectively reduced. Similarly, the width of a portion of the first connection portion where the first connection portion overlaps a wire extending in the row direction for transmission of a signal of a relatively high frequency may be larger than the width of a portion of the first connection portion where the first connection portion overlaps a wire extending in the row direction for transmission of a signal of a relatively low frequency.

In addition, in an embodiment of the present disclosure, the width of a portion of the second connection portion where the second connection portion overlaps a wire extending in the row direction with a constant signal may be larger than the width of a portion of the second connection portion where the second connection portion overlaps a wire extending in the row direction not with a constant signal. The wire extending in the row direction with a constant signal may include, for example, the light-emitting reset voltage line VINL, the first power voltage line VDL, and the like. Similarly, the width of a portion of the first connection portion where the first connection portion overlaps a wire extending in the row direction with a constant signal may be larger than the width of a portion of the first connection portion where the first connection portion overlaps a wire extending in the row direction not with a constant signal.

Figure 19:
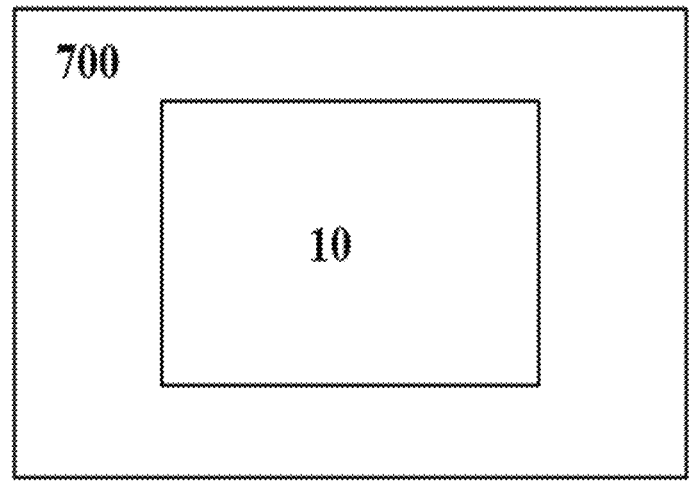
FIG. 19 shows a schematic structural diagram of a display panel according to an embodiment of the present disclosure.

FIG. 19 shows a schematic structural diagram of a display panel according to an embodiment of the present disclosure. As shown in FIG. 19, the display panel 700 may include the array substrate 20 according to any embodiment of the present disclosure or the array substrate including the pixel circuit 100 according to any embodiment of the present disclosure.

For example, the display panel 700 may further include other components, such as a timing controller, a signal decoding circuit, a voltage conversion circuit, etc. For example, these components may adopt existing conventional components, which will not be described in detail here.

For example, the display panel 700 may be a rectangular panel, a circular panel, an oval panel, a polygonal panel, or the like. In addition, the display panel 700 can be not only a flat panel, but also a curved panel, or even a spherical panel. For example, the display panel 700 may also have a touch function, that is, the display panel 700 may be a touch display panel.

An embodiment of the present disclosure also provides a display device including the display panel according to any embodiment of the present disclosure.

Figure 20:
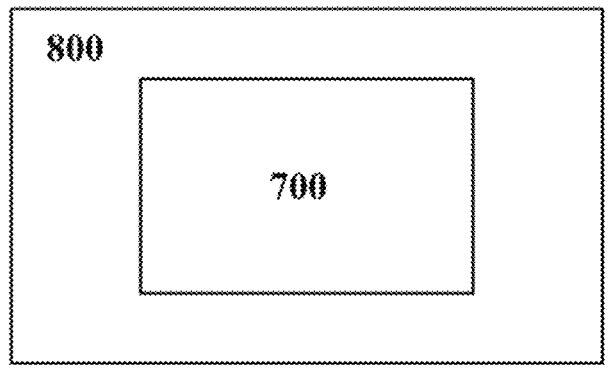
FIG. 20 shows a schematic structural diagram of a display device according to an embodiment of the present disclosure.

FIG. 20 shows a schematic structural diagram of a display device according to an embodiment of the present disclosure. As shown in FIG. 20, the display device 800 may include the display panel 700 according to any embodiment of the present disclosure.

The display device 800 may be any product or component with a display function, such as a mobile phone, a tablet computer, a television, a monitor, a notebook computer, a digital photo frame, a navigator, and the like.

Figure 21:
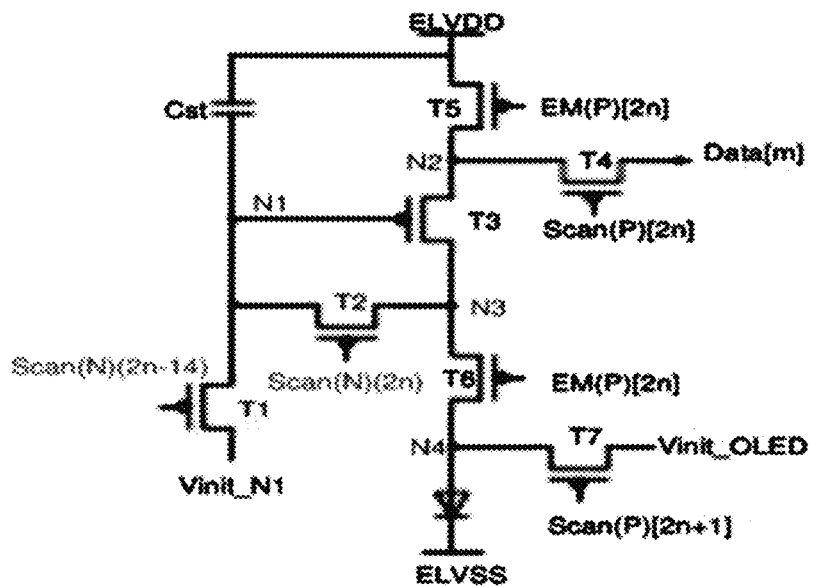
FIG. 21 shows a schematic diagram of a pixel circuit according to an embodiment of the present disclosure.

FIG. 21 shows a pixel circuit, which is a 7T1C structure including 7 transistors and 1 capacitor. In the pixel circuit, the active layers of the transistors T1 and T2 include oxide semiconductor materials, and the transistors T1 and T2 may be N-type oxide transistors. The active layers of transistors T3-T7 include silicon semiconductor material, such as low temperature polysilicon.

Figure 22:
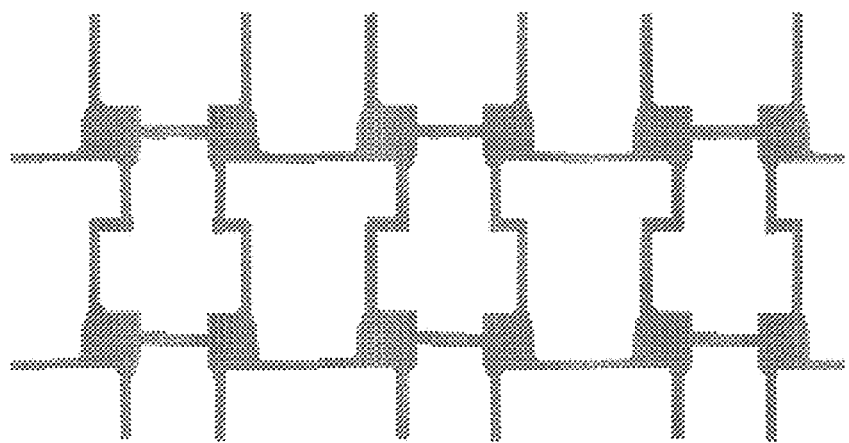
FIG. 22 shows a schematic diagram of a shielding layer according to an embodiment of the present disclosure.
Figure 26:
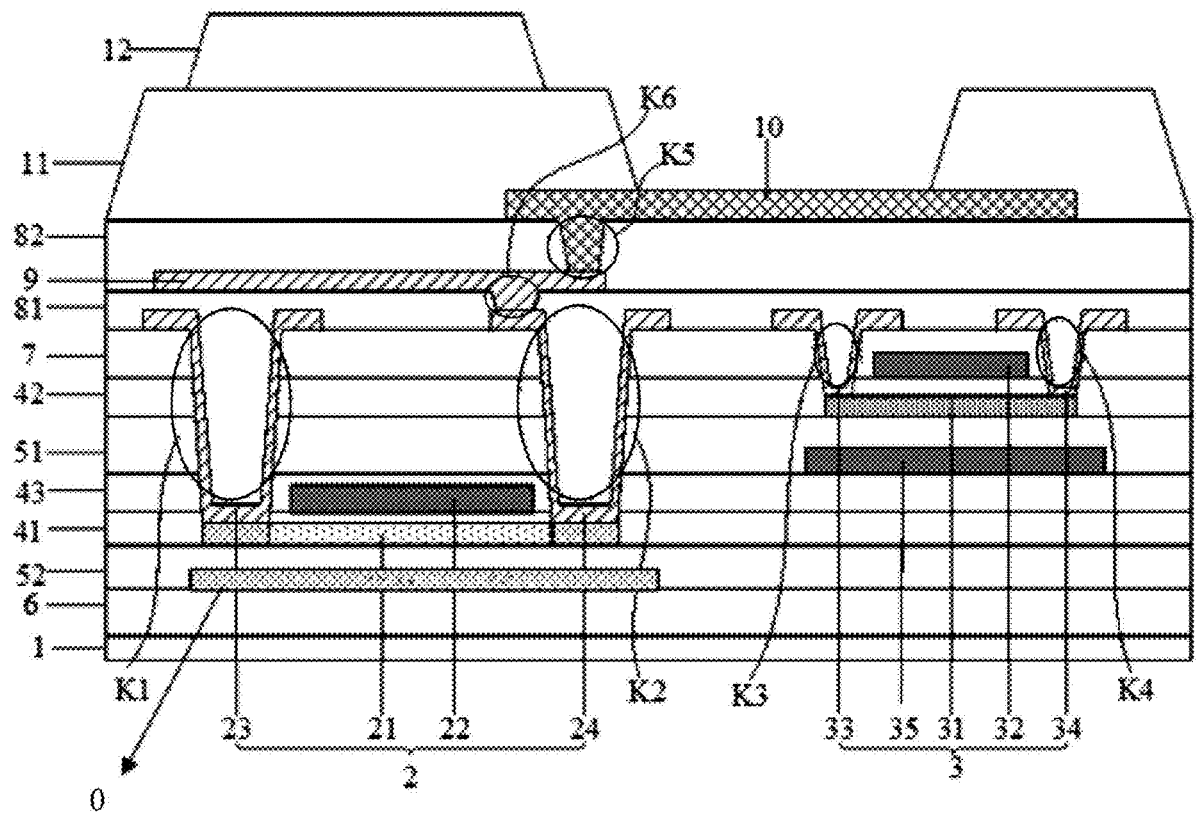
FIG. 26 shows a schematic cross-sectional structure diagram of an array substrate according to an embodiment of the present disclosure.

FIG. 22 shows a shielding layer for the circuit shown in FIG. 21. FIG. 26 shows the position of the shielding layer 0. In this embodiment, the shielding layer is located between the active semiconductor layer and the substrate and is at least insulated from the active semiconductor.

Figure 23:
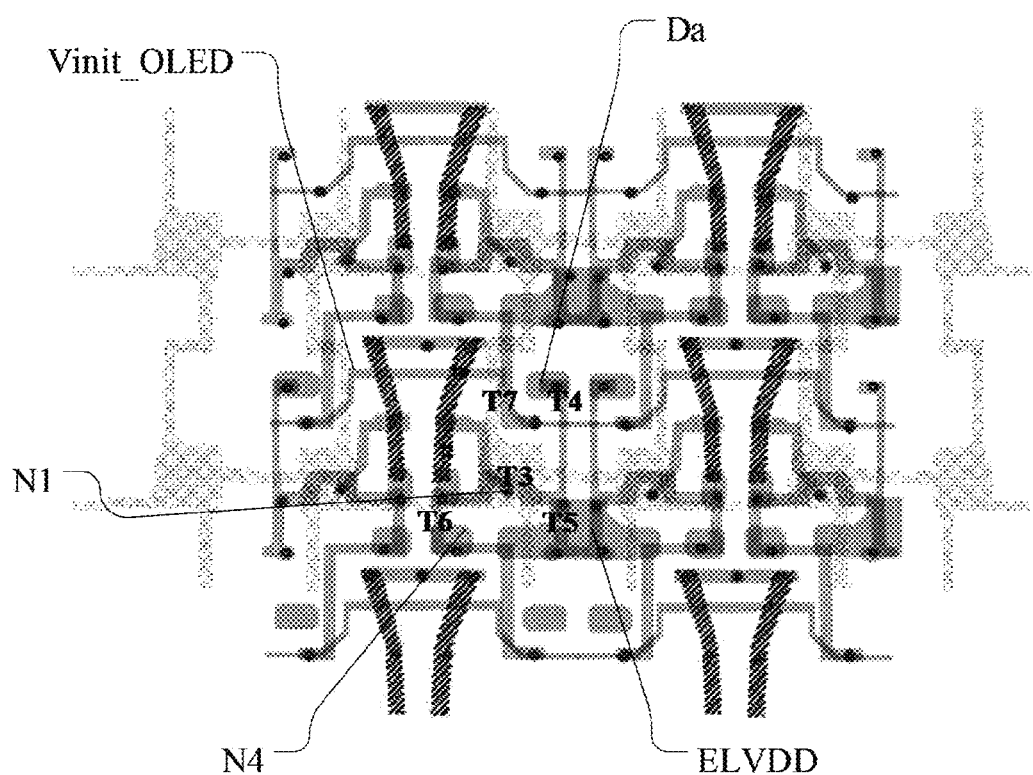
FIG. 23 shows a plan layout of a pixel circuit according to an embodiment of the present disclosure.

FIG. 23 shows a plan layout of functional layers (semiconductor layers and conductive layers) of the pixel circuit including the light shielding layer. The oxide semiconductors of T1 and T2 are mirrored designs; the shielding layer shields the silicon semiconductor material. As shown in FIG. 23, the overall plane layout of the pixel circuit including the light shielding layer is also a mirror design. In an embodiment of the present disclosure, the mirror design can also be, for example, the plane layout of the pixel circuit including the light shielding layer shown in FIG. 24 and FIG. 29. As shown in FIG. 23, Da is the access point of the data signal terminal Data[m] in FIG. 21, Vinit OLED is the access point of the initialization signal terminal Vinit OLED in FIG. 21, N1 is the potential point of the node N1 in FIG. 21, and N1 is located in the first source and drain layer. N4 is the potential point of the node N4 in FIG. 21, ELVDD is the potential point of the power terminal ELVDD in FIG. 21, and ELVDD is located in the first source and drain layer. The shielding layer meets at least one of the following conditions:

1. The main body of the shielding layer covers a silicon semiconductor material, and the coverage area of the N1 node and the shielding layer is greater than 10% to stabilize the N1 node.

2. The shielding layer does not overlap with the oxide channel, or the overlapping area is less than 90%, which alleviates the parasitic capacitance on the oxide layer.

Figure 29:
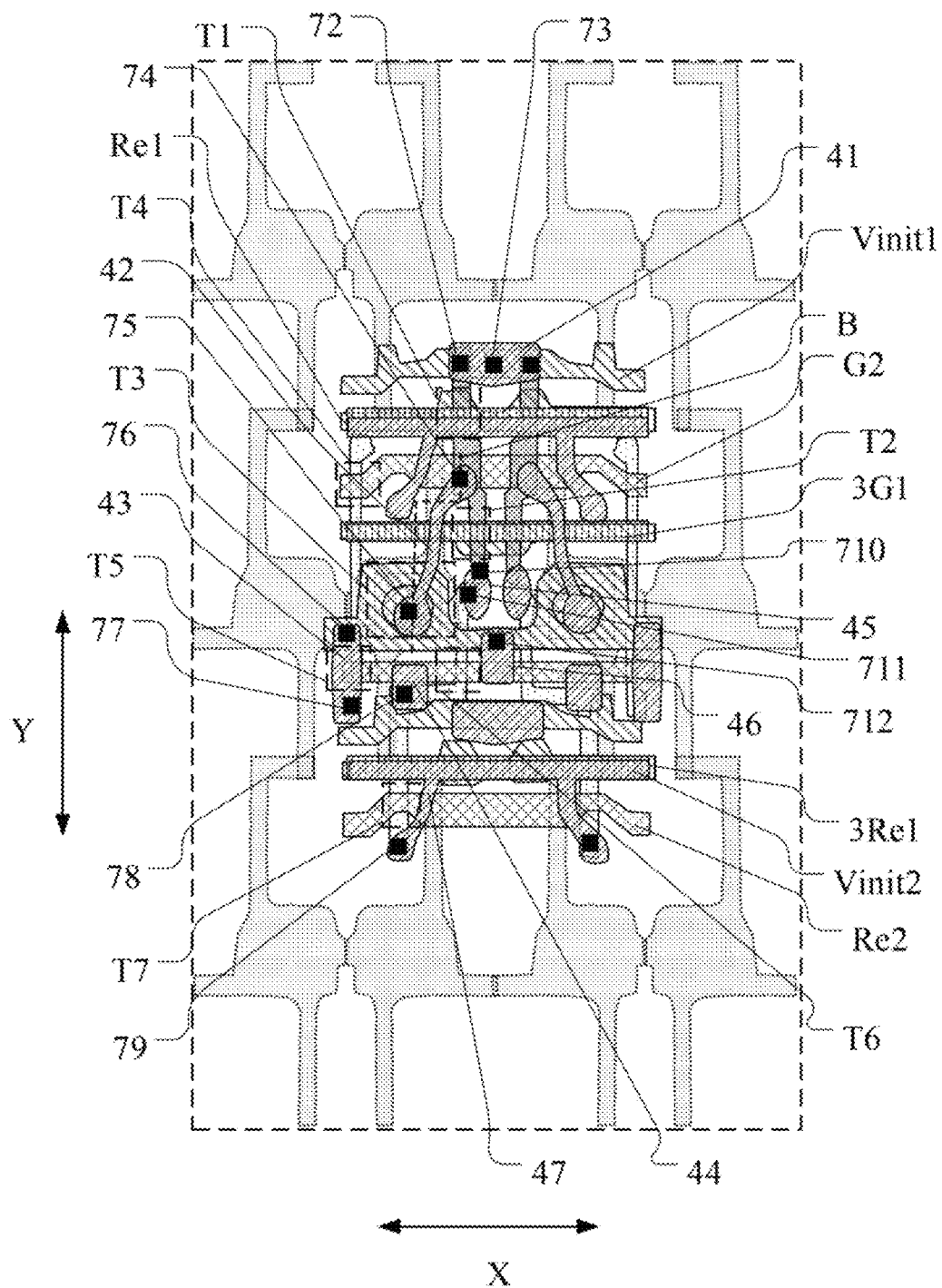
FIG. 29 is a structural layout of an exemplary embodiment of the disclosed array substrate.

3. The overlapping area between the shielding layer and the initialization signal line should be minimized to reduce the load on the initialization signal line. The layout is designed to avoid the arc-shaped line at the T7 position and only overlap the horizontal line. For example, as shown in FIG. 29, the orthographic projection of the conductive portion 47 on the base substrate is bent and extended to reduce the overlap between the light shielding layer and the second initialization signal line Vinit2.

4. The initialization signal line can be narrowed at the overlapping position with the shielding layer, and the shielding layer can also be narrowed.

Figure 24:
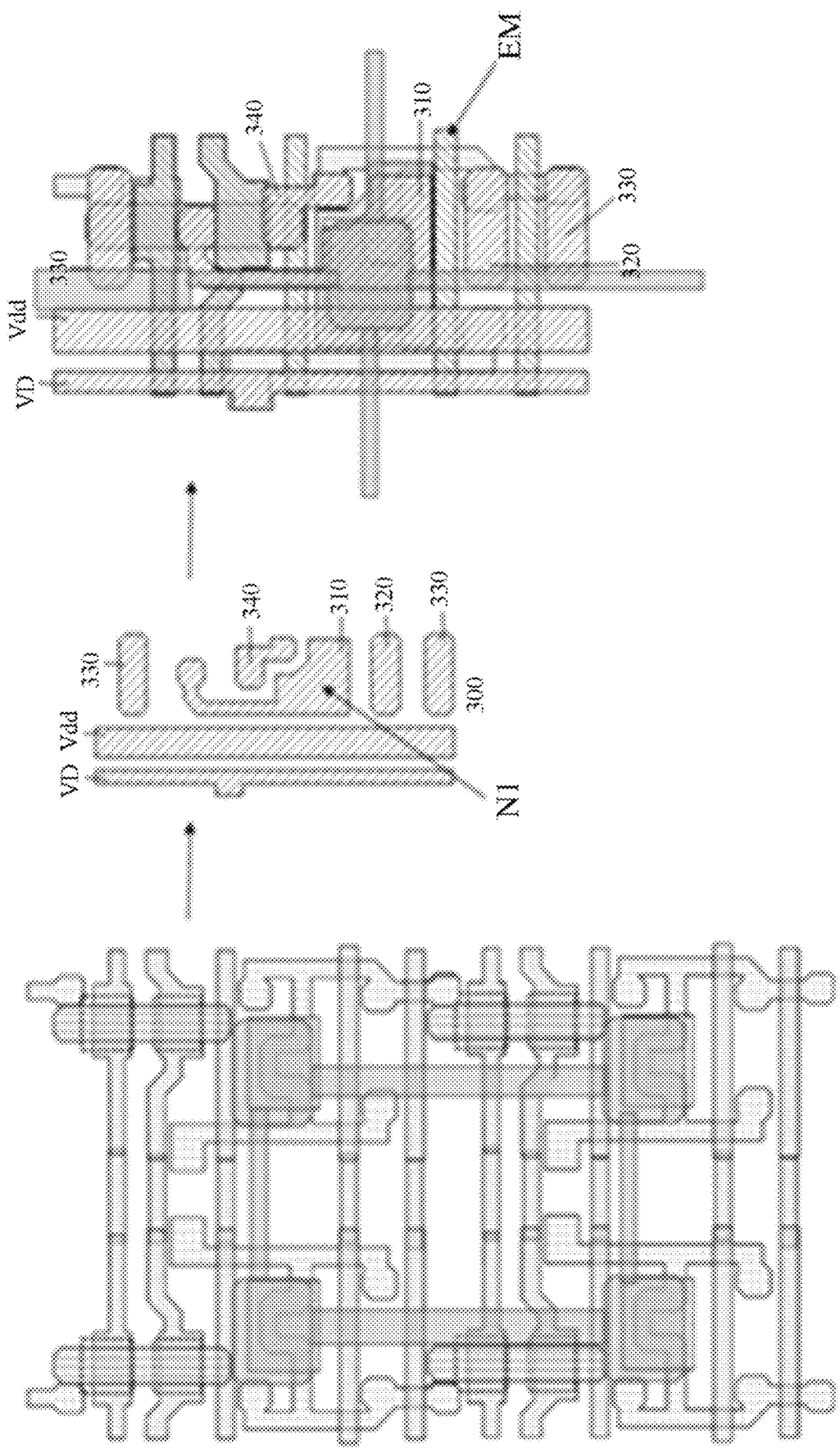
FIG. 24 shows a plan layout of a pixel circuit according to an embodiment of the present disclosure.

FIG. 24 shows a plan layout of a pixel circuit according to an embodiment of the present disclosure. The connection lines of the shielding layer along the row and column directions should avoid the scan lines as much as possible to avoid parasitic effects. N1 in FIG. 24 is the potential point of the node N1 in FIG. 21, and N1 is located in the first source and drain layer.

According to an embodiment of the present disclosure, the biasing of the shielding layer can be implemented in the following manner.

Figure 25:
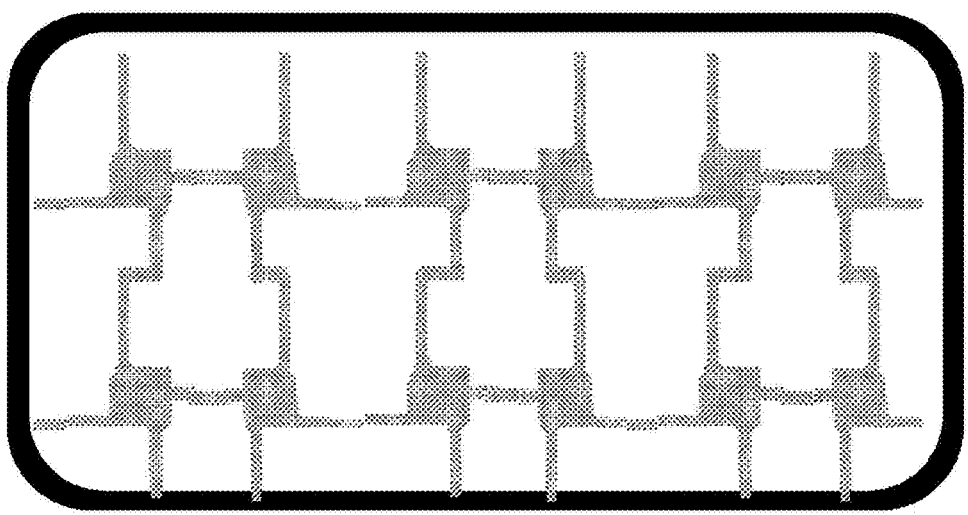
FIG. 25 shows a plan layout of a pixel circuit according to an embodiment of the present disclosure.

1. Extension is made to the periphery for constant potential connection. The electrical connection may be realized through a circle of signal line in the periphery, or the electrical connection may be realized not through a circle or signal line in the periphery, as long as signal connection can be achieved. One or more layers of gate1, gate2, SD1, SD2, and ITO layers may be used to achieve lap joint. This method is shown in FIG. 25.

2. The electrical connection is realized in the AA area, but other signal connection holes need to be avoided.

Embodiment 3: If a VDD or Vint signal is used, a hole can be formed at the overlapping position of the VDD line and the Vint line.

In specific implementations, the SD1 and SD2 layers are source and drain electrode film layers, and the material may include metal materials, such as one of molybdenum, aluminum, copper, titanium, and niobium or an alloy thereof, or molybdenum/titanium alloy or laminated molybdenum/titanium, etc., or laminated titanium/aluminum/titanium.

In specific implementations, the gate1 and gate2 layers are gate electrode film layers, which can be made of the same material as the gate of the oxide transistors or may be made in the same layer as the gate of the oxide transistors. For example, the material can be one of molybdenum, aluminum, copper, titanium, and niobium, or an alloy thereof, or a molybdenum/titanium alloy or a laminated molybdenum/titanium, etc. The potential loaded on the shielding layer may be the same as the potential loaded on the power line VDD (voltage source potential); or, the potential loaded on the shielding layer may be the same as the potential loaded on the initialization signal line; or, the potential loaded on the shielding layer may the same as the potential loaded on the cathode (cathode potential VSS); or, the potential loaded on the shielding layer may be other fixed potential. For example, the range of the fixed potential is −10V~+10 V. As another example, the range of the fixed potential is −5V~+5 V. As another example, the range of the fixed potential is −3V~+3 V. As another example, the range of the fixed potential is −1V to +1 V. As another example, the range of the fixed potential is −0.5V to +0.5 V. As another example, the range of the fixed potential is 0 V. As another example, the range of the fixed potential is 0.1 V. For example, the range of the fixed potential is 10.1 V. As another example, the range of the fixed potential is 0.2 V. As another example, the range of the fixed potential is −0.2 V. As another example, the range of the fixed potential is 0.3 V. As another example, the range of the fixed potential is −0.3V.

Specifically, the potential loaded on the light shielding layer may be greater than the potential loaded on the cathode (cathode potential VSS) and less than the potential loaded on the power line VDD; or, the potential loaded on the light shielding layer may be greater than the potential loaded on the initialization signal line and less than potential loaded on the power line VDD.

In specific implementations, the shielding layer may be an amorphous silicon material, or a metal material, or an oxide semiconductor material such as IGZO, or a polysilicon material, or a conductorized semiconductor material.

Figure 27:
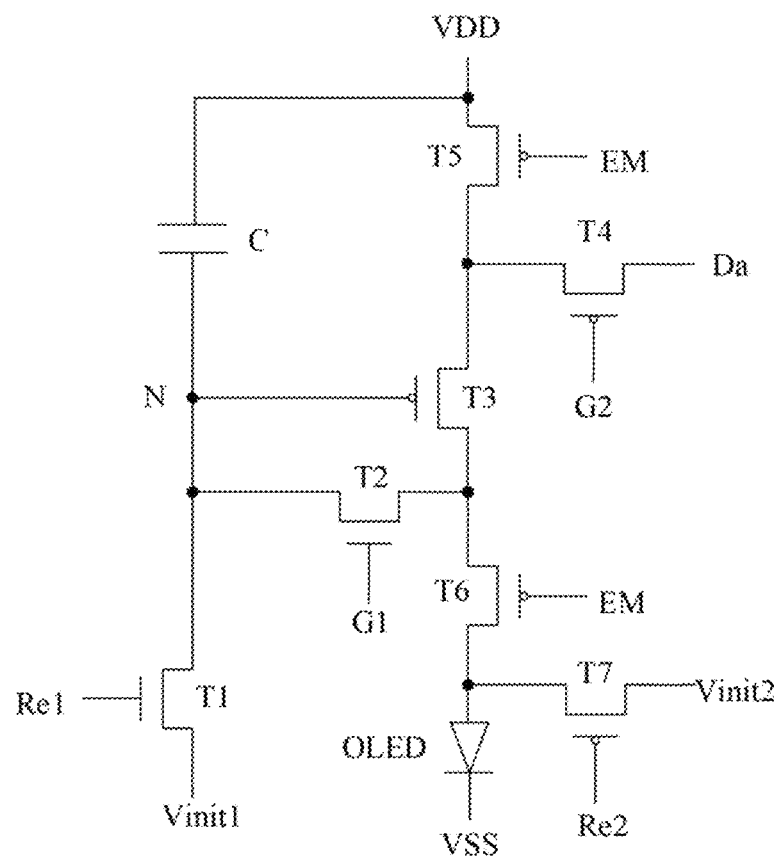
FIG. 27 is a schematic diagram of a circuit structure of a pixel driving circuit in the array substrate according to an exemplary embodiment of the present disclosure.

FIG. 27 is a schematic diagram of a circuit structure of a pixel driving circuit for an array substrate according to an exemplary embodiment of the present disclosure. The pixel driving circuit may include: a driving transistor T3, a first transistor T1, a second transistor T2, a third transistor T3, a fourth transistor T4, a fifth transistor T5, a sixth transistor T6, a seventh transistor T7, and a capacitor C. A first electrode of the fourth transistor T4 is connected to the data signal terminal Da, a second electrode of the fourth transistor T4 is connected to a first electrode of the driving transistor T3, a gate of the fourth transistor T4 is connected to a second gate driving signal terminal G2. A first electrode of the fifth transistor T5 is connected to a power terminal VDD, a second electrode of the fifth transistor T5 is connected to a first electrode of the driving transistor DT, and a gate of the fifth transistor T5 is connected to an enable signal terminal EM. A gate of the driving transistor T3 is connected to a node N. A first electrode of the second transistor T2 is connected to the node N, a second electrode of the second transistor T2 is connected to the second electrode of the driving transistor T3, and a gate of the second transistor T2 is connected to a first gate driving signal terminal G1. A first electrode of the sixth transistor T6 is connected to the second electrode of the driving transistor T3, a second electrode of the sixth transistor T6 is connected to a first electrode of the seventh transistor T7, and a gate of the sixth transistor T6 is connected to the enable signal terminal EM. A second electrode of the seventh transistor T7 is connected to a second initialization signal terminal Vinit2, and a gate of the seventh transistor T7 is connected to a second reset signal terminal Re2. A first electrode of the first transistor T1 is connected to the node N, a second electrode of the first transistor T1 is connected to a first initialization signal terminal Vinit1, and a gate of the first transistor T1 is connected to a first reset signal terminal Re1. The capacitor C is connected between the first power terminal VDD and the node N. The pixel driving circuit may be connected to a light-emitting unit OLED for driving the light-emitting unit OLED to emit light. The light-emitting unit OLED may be connected between the second electrode of the sixth transistor T6 and the second power terminal VSS. The first transistor T1 and the second transistor T2 may be N-type metal oxide transistors. The N-type metal oxide transistor has a smaller leakage current, and thus the leakage current of the node N through the first transistor T1 and the second transistor T2 in the light-emitting stage can be avoided. Meanwhile, the driving transistor T3, the third transistor T3, the fourth transistor T4, the fifth transistor T5, the sixth transistor T6, and the seventh transistor T7 may be low temperature polysilicon transistors. The low temperature polysilicon transistors have higher carrier mobility, which is conducive to realizing a display panel with high resolution, high response speed, high pixel density, and high aperture ratio. The first initialization signal terminal and the second initialization signal terminal can output the same or different voltage signals depending on actual situations.

Figure 28:
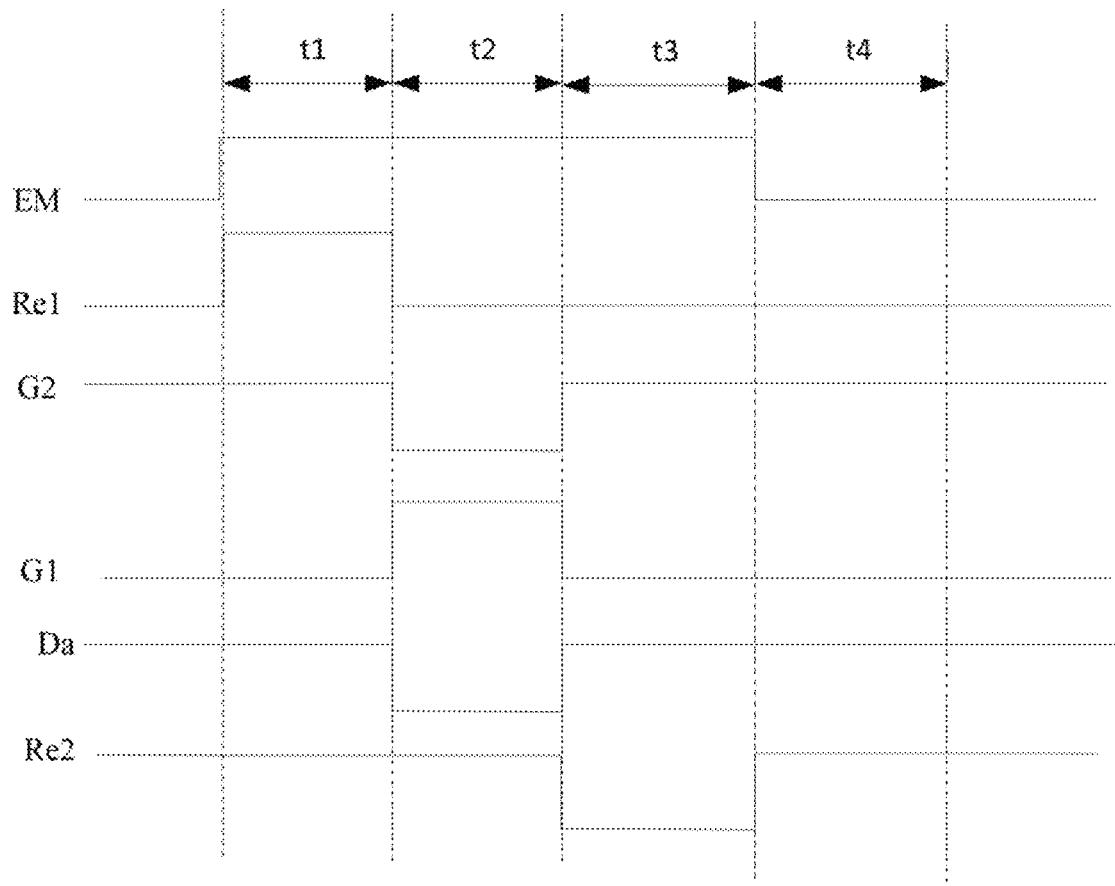
FIG. 28 is a timing diagram for nodes in a driving method for a pixel driving circuit in FIG. 27.

FIG. 28 is a timing diagram of signals at each node in a driving method for the pixel driving circuit in FIG. 27. G1 represents the timing of the first gate driving signal terminal G1, G2 represents the timing of the second gate driving signal terminal G2, Re1 represents the timing of the first reset signal terminal Re1, Re2 represents the timing of the second reset signal terminal Re2, EM represents the timing of the enable signal terminal EM, and Da represents the timing of the data signal terminal Da. The driving method for the pixel driving circuit may include a first reset stage t1, a compensation stage t2, a second reset stage T3, and a light-emitting stage t4. In the first reset stage t1: the first reset signal terminal Re1 outputs a high-level signal, the first transistor T1 is turned on, and the first initialization signal terminal Vinit1 inputs an initialization signal to the node N. In the compensation stage t2: the first gate driving signal terminal G1 outputs a high-level signal, the second gate driving signal terminal G2 outputs a low-level signal, the fourth transistor T4 and the second transistor T2 are turned on, and the data signal terminal Da outputs a driving signal to write the voltage Vdata+Vth to the node N, where Vdata is the voltage of the driving signal, and Vth is the threshold voltage of the driving transistor T3. In the second reset stage t3: the second reset signal terminal Re2 outputs a low-level signal, the seventh transistor T7 is turned on, and the second initialization signal terminal Vinit2 inputs an initialization signal to the second electrode of the sixth transistor T6. In the light-emitting stage t4: the enable signal terminal EM outputs a low-level signal, the sixth transistor T6 and the fifth transistor T5 are turned on, and the driving transistor T3 drives the light emitting device to emit light under the action of the voltage Vdata+Vth stored in the capacitor C. The output current formula of the driving transistor is $I=(\mu W C_{ox}/2L)(V_{gs}-V_{th})^2$, where $\mu$ is the carrier mobility, Cox is the gate capacitance per unit area, W is the width of the driving transistor channel, L is the length of the driving transistor channel, Vgs is the gate-source voltage difference of the driving transistor, and Vth is the threshold voltage of the driving transistor. The output current of the driving transistor in the pixel driving circuit of the present disclosure is $I=(\mu W C_{ox}/2L)(V_{data}+V_{th}-V_{dd}-V_{th})^2$. The pixel driving circuit can avoid the influence of the threshold value of the driving transistor on its output current.

Figure 30:
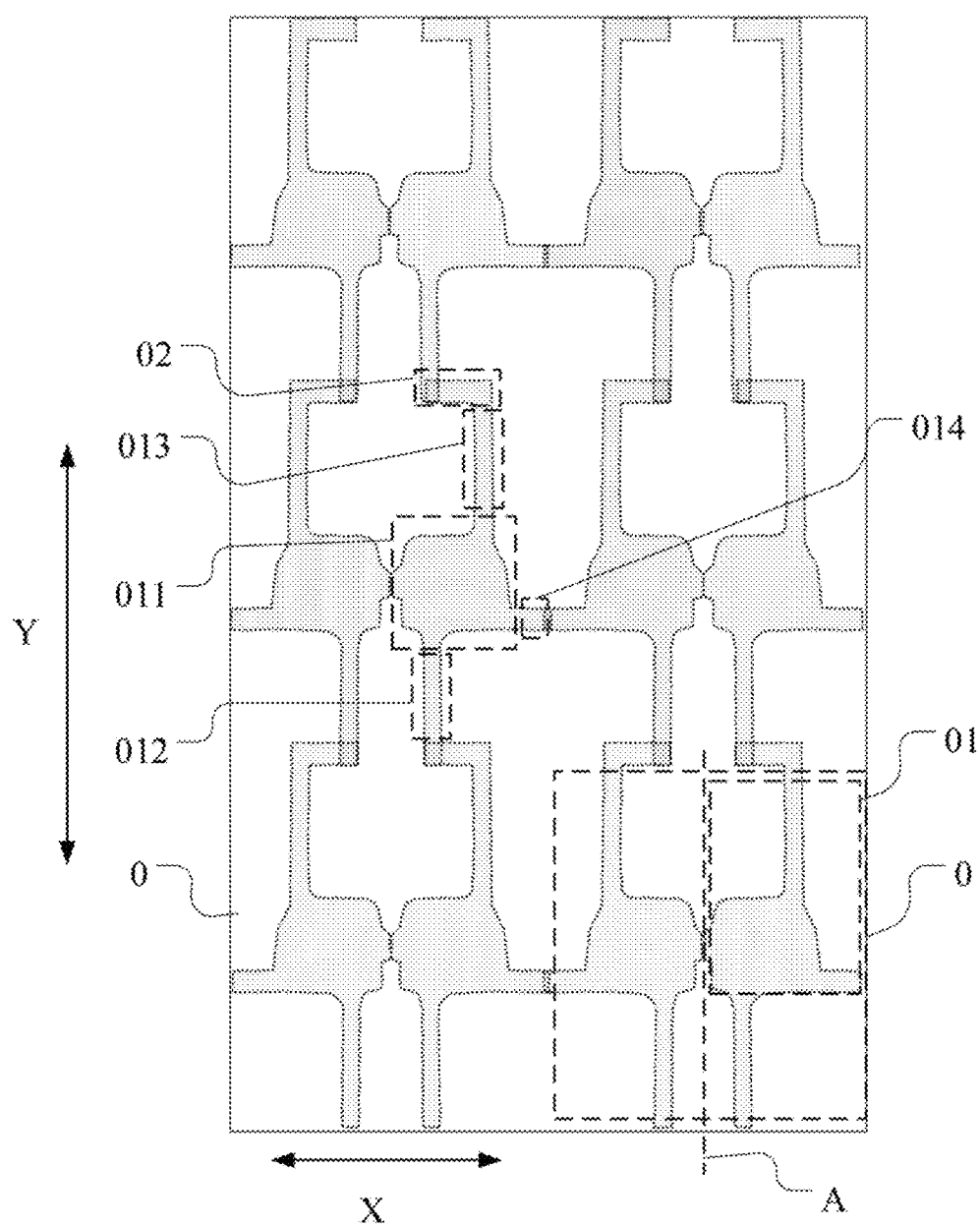
FIG. 30 is a structural layout of a light shielding layer in FIG. 29.
Figure 31:
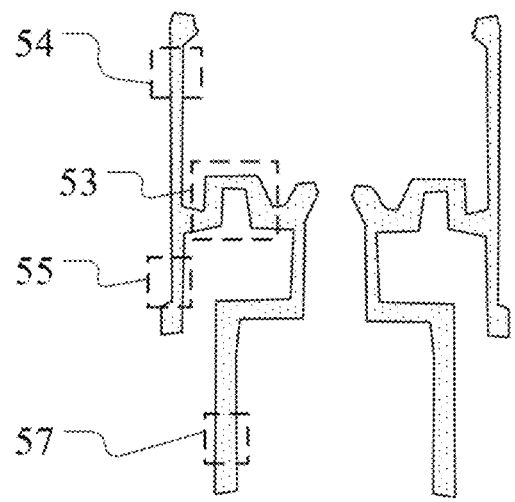
FIG. 31 is a structural layout of a first active layer in FIG. 29.
Figure 32:
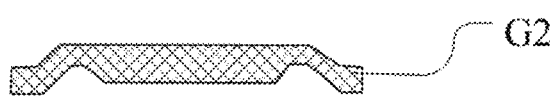
FIG. 32 is a structural layout of a first gate layer in FIG. 29.
Figure 32:
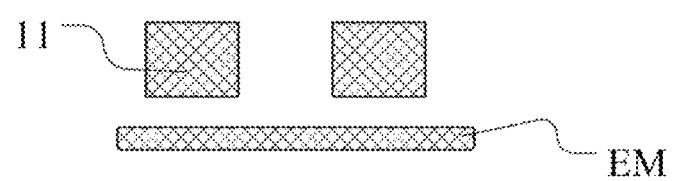
Figure 32:
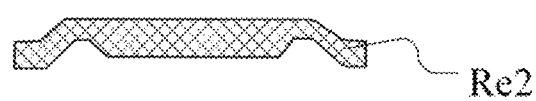
Figure 33:
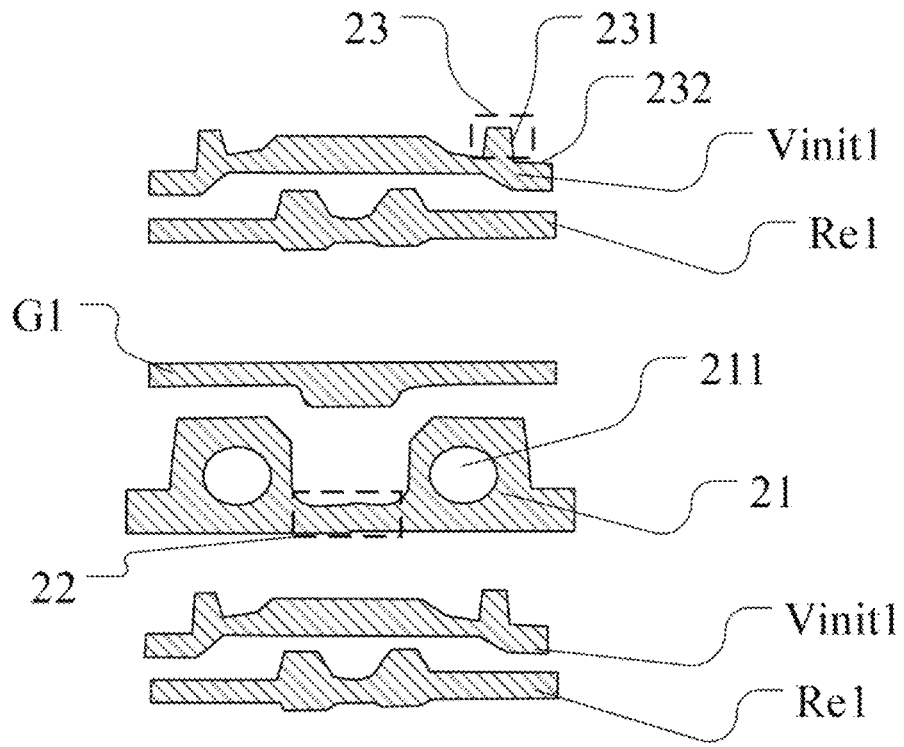
FIG. 33 is a structural layout of a second gate layer in FIG. 29.
Figure 34:
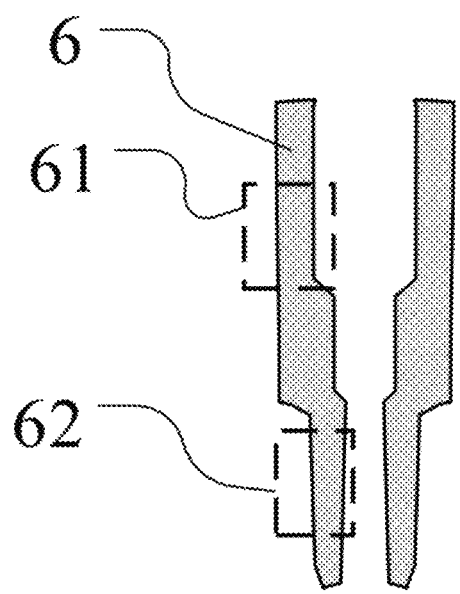
FIG. 34 is a structural layout of a second active layer in FIG. 29.
Figure 35:
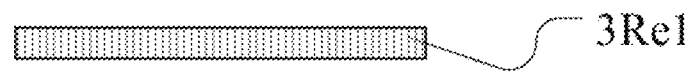
FIG. 35 is a structural layout of a third gate layer in FIG. 29.
Figure 35:
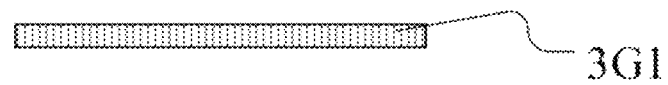
Figure 35:
Figure 36:
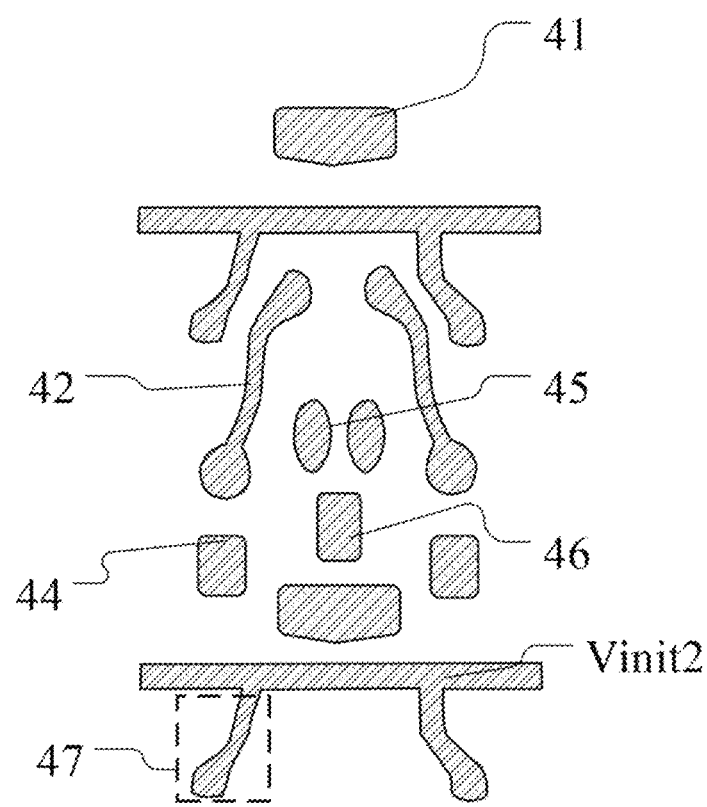
FIG. 36 is a structural layout of a first source and drain layer in FIG. 29.
Figure 37:
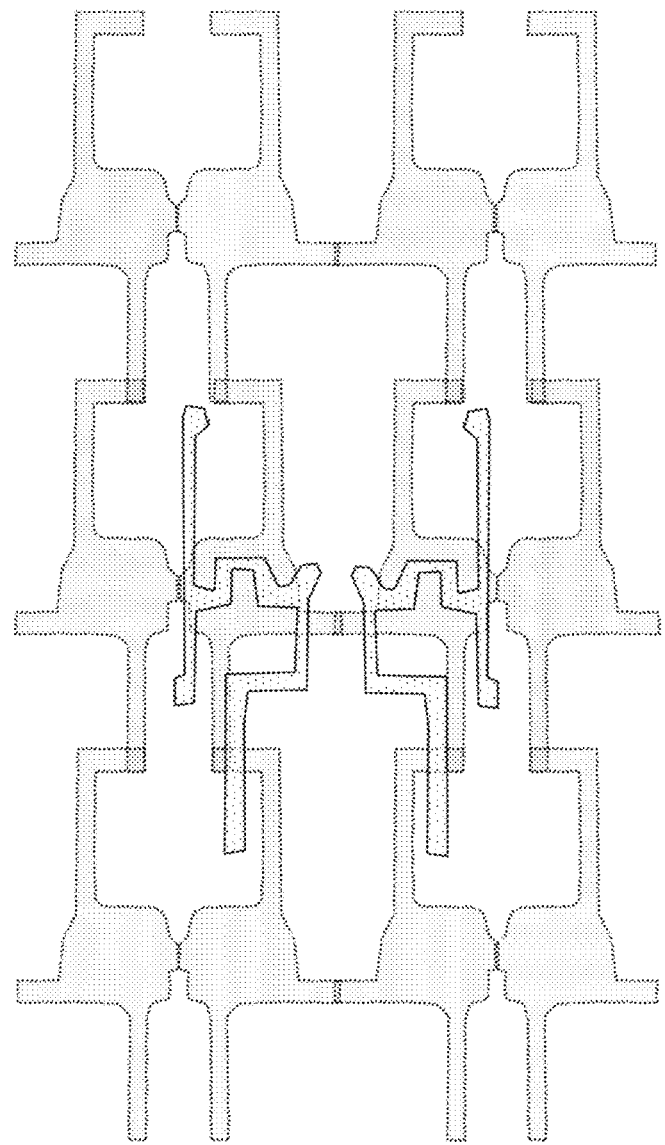
FIG. 37 is a structural layout of the light shielding layer and the first active layer in FIG. 29.
Figure 38:
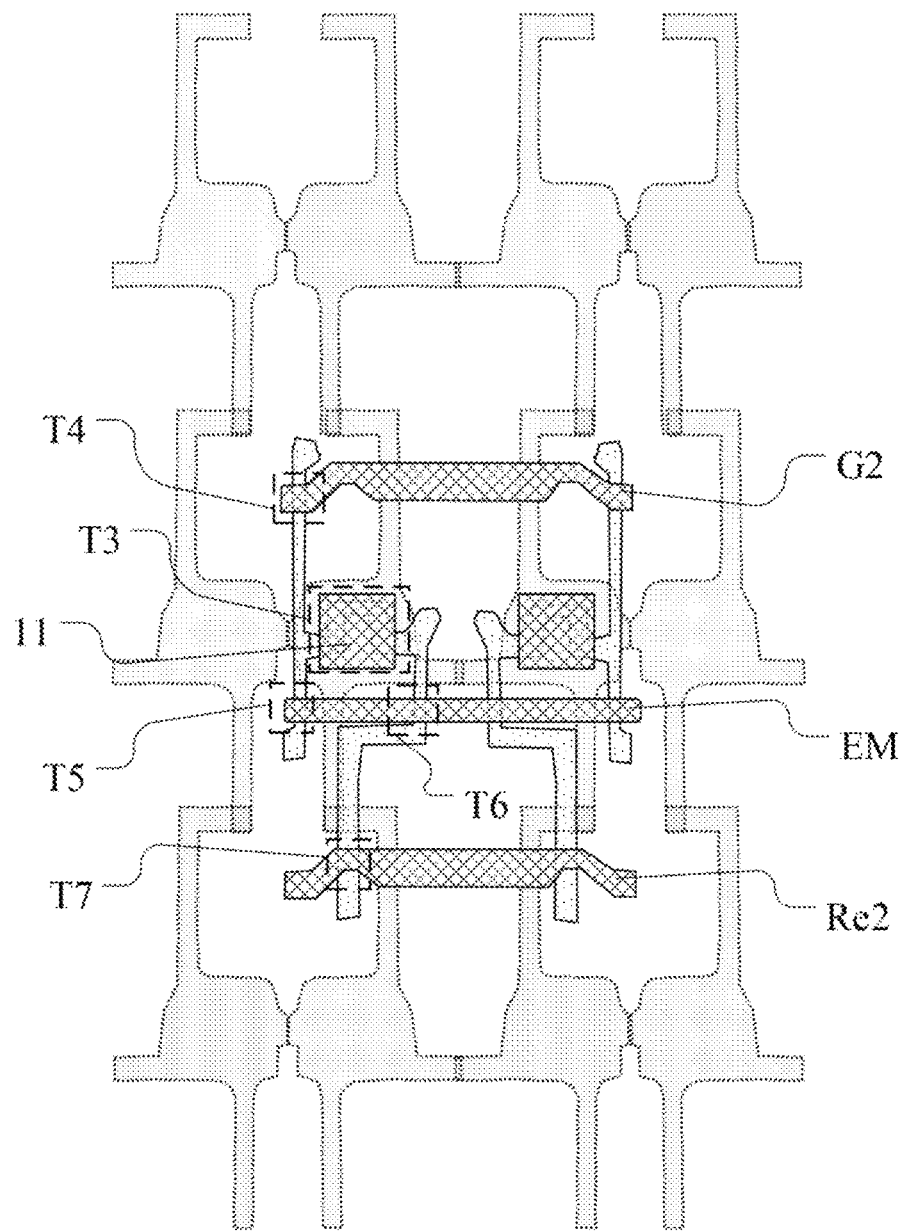
FIG. 38 is a structural layout of the light shielding layer, the first active layer, and the first gate layer in FIG. 29.
Figure 39:
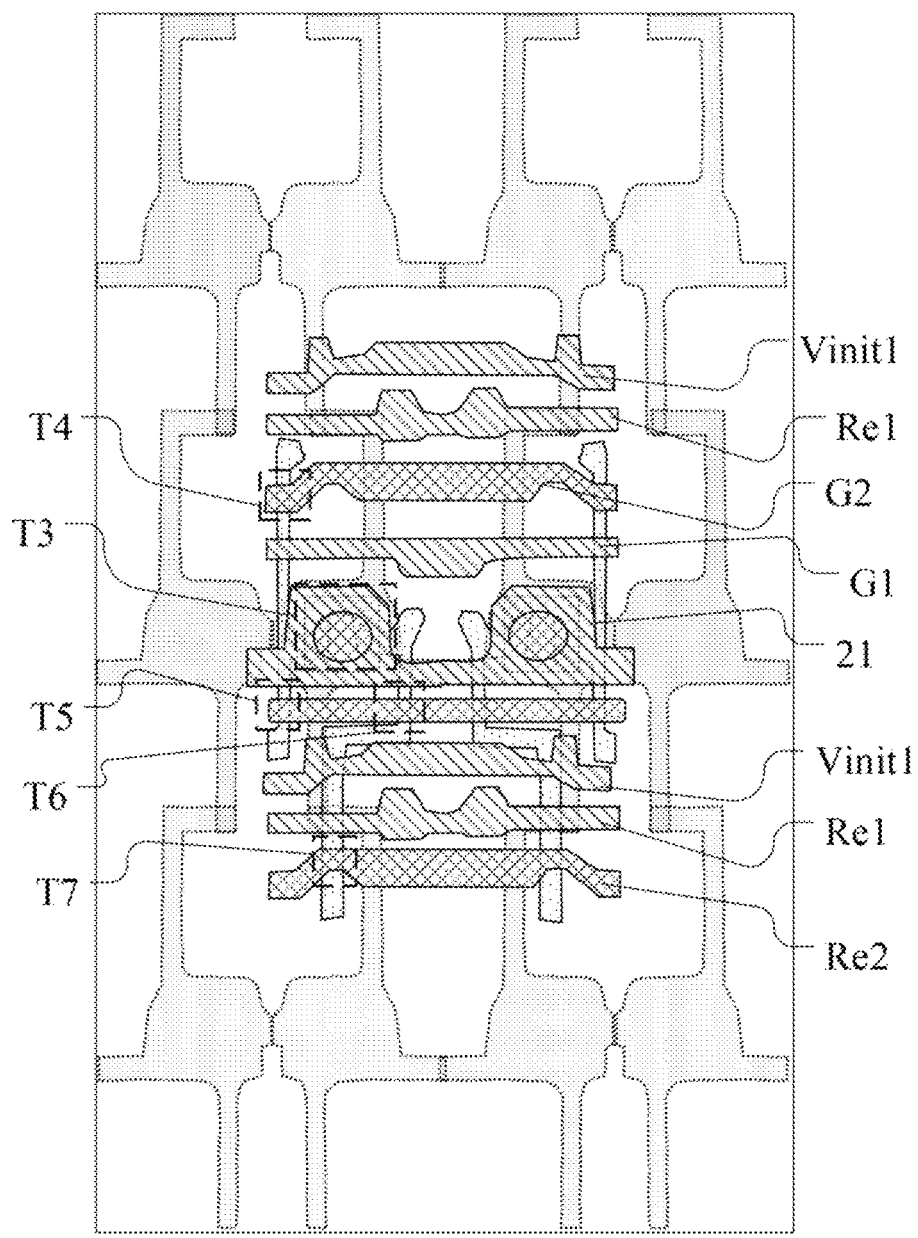
FIG. 39 is a structural layout of the light-shielding layer, the first active layer, the first gate layer, and the second gate layer in FIG. 29.
Figure 40:
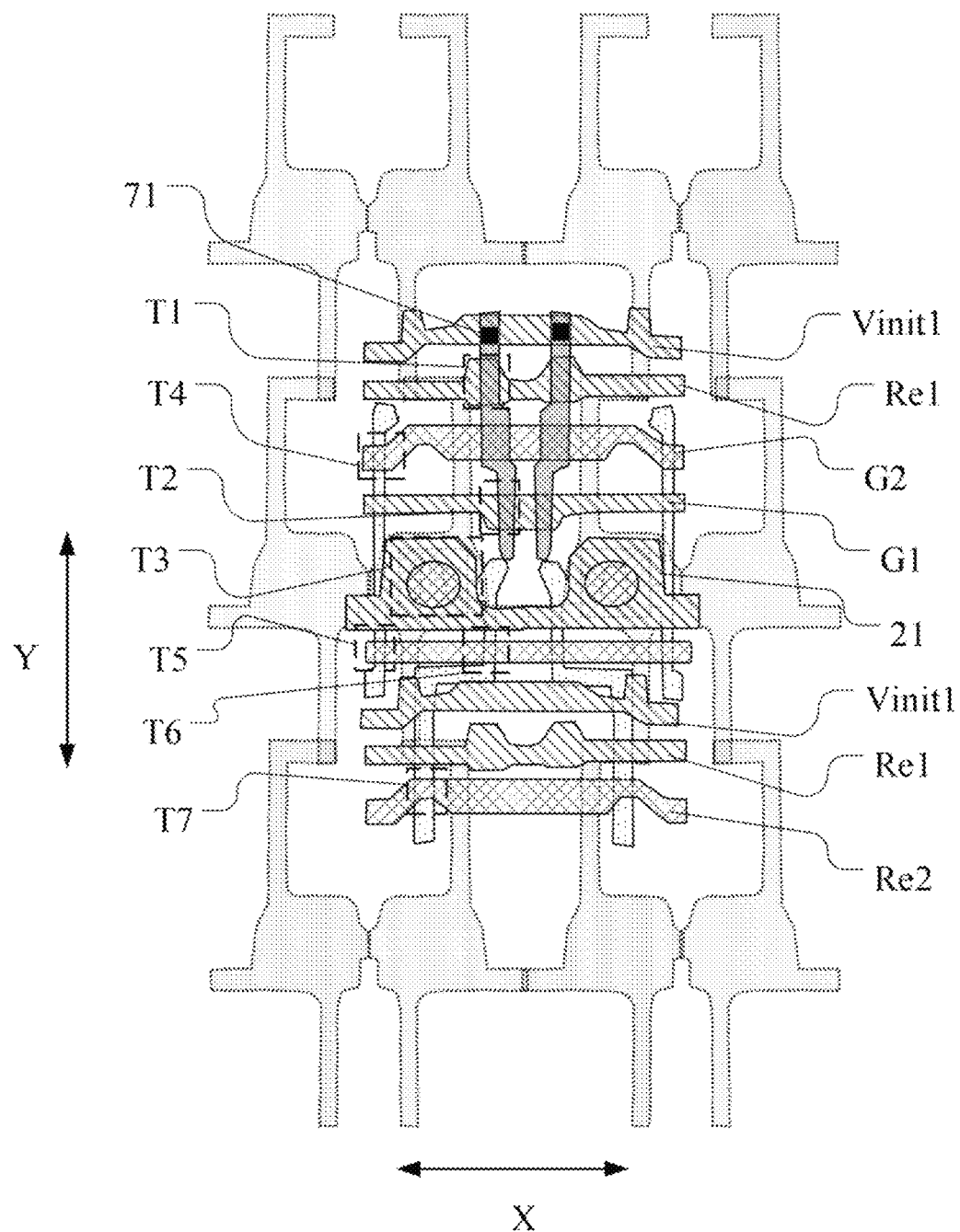
FIG. 40 is a structural layout of the light shielding layer, the first active layer, the first gate layer, the second gate layer, and the second active layer in FIG. 29.
Figure 41:
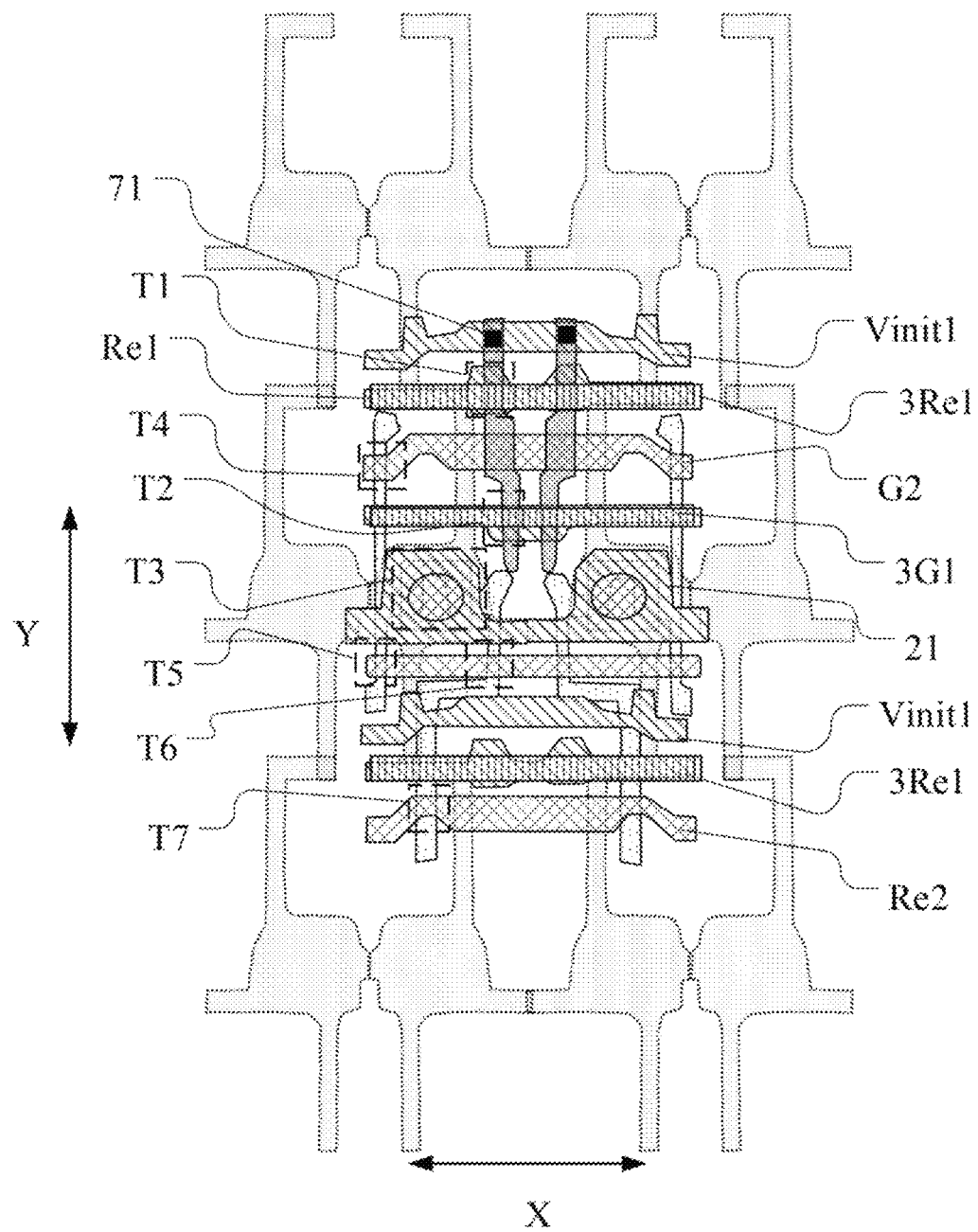
FIG. 41 is a structural layout of the light shielding layer, the first active layer, the first gate layer, the second gate layer, the second active layer, and the third gate layer in FIG. 29.

The array substrate may include a base substrate, a light shielding layer, a first active layer, a first gate layer, a second gate layer, a second active layer, a third gate layer, and a first source and drain layer, which are stacked in sequence, as shown in FIGS. 29-41. FIG. 29 is a structural layout of an array substrate according to an exemplary embodiment. FIG. 30 is a structural layout of the light shielding layer in FIG. 29. FIG. 31 is a structural layout of the first active layer in FIG. 29. FIG. 32 is a structural layout of the first gate layer in FIG. 29. FIG. 33 is a structural layout of the second gate layer in FIG. 29. FIG. 34 is a structural layout of the second active layer in FIG. 29. FIG. 35 is a structural layout of the third gate layer in FIG. 29. FIG. 36 is a structural layout of the first source and drain layer in FIG. 29. FIG. 37 is a structural layout of the light shielding layer and the first active layer in FIG. 29. FIG. 38 is a structural layout of the light shielding layer, the first active layer and the first gate layer in FIG. 29. FIG. 39 is a structure layout of the light shielding layer, the first active layer, the first gate layer and the second gate layer in FIG. 29. FIG. 40 is a structural layout of the light shielding layer, the first active layer, the first gate layer, the second gate layer, and the second active layer in FIG. 29. FIG. 41 is a structural layout of the light shielding layer, the first active layer, the second active layer, the first gate layer, the second gate layer, the second active layer, and the third gate layer in FIG. 29.

As shown in FIGS. 29, 30, 37, 38, 39, 40 and 41, the light shielding layer may include a plurality of repeating units 0 and connection portions 02 connected between the repeating units 0. Each of the repeating units 0 may include two light shielding parts 01 symmetrically arranged along the dotted line A. The dotted line A extends along the second direction Y As shown in FIG. 30, each light-shielding portion 01 may include a first light shielding portion 011, a second light shielding portion 012, a third light shielding portion 013, and a fourth light shielding portion 014. The orthographic projections of the second light shielding portion 012 and the third light shielding portion 013 on the base substrate may extend along the second direction Y, and the orthographic projection of the fourth light shielding portion 014 on the base substrate may extend along the first direction X. The second light shielding portion 012 and the third light shielding portion 013 may be respectively connected to two sides of the first light shielding portion 011 in the second direction Y, and the orthographic projection of the second light shielding portion 012 on the base substrate is space from the orthographic projection of the third light shielding portion 013 on the base substrate by a predetermined distance in the first direction X. The fourth light shielding portion 014 may be located on a side of the first light shielding portion in the first direction X. In the same repeating unit 0, two first light shielding portions 011 adjacent to each other in the first direction X are connected. In two adjacent repeating units 0 in the first direction X, two adjacent light shielding portions 01 are connected by respective fourth light shielding portions 014. In the second direction Y, two adjacent light shielding portions 01 may be connected by a connection portion 02, and the connection portion 02 may be respectively connected to a second shielding portion 012 and a third shielding portion 013 of the two shielding portions 01. The orthographic projection of the connection portion 02 on the base substrate extends along the first direction X. The first direction X and the second direction Y may intersect, for example, the first direction X may be a row direction, and the second direction may be a column direction.

As shown in FIGS. 29, 31, 37, 38, 39, 40 and 41, the first active layer may include an active portion 54, an active portion 53, an active portion 55, and an active portion 57. The active portion 54 may be used to form the channel region of the fourth transistor T4, the active portion 53 may be used to form the channel region of the driving transistor T3, the active portion 55 may be used to form the channel region of the fifth transistor T5, and the active portion 57 may be used to form the channel region of the seventh transistor T7. The first active layer may be formed of a polycrystalline silicon semiconductor material.

As shown in FIGS. 29, 32, 38, 39, 40 and 41, the first gate layer may include a second gate driving signal line G2, an enable signal line EM, a second reset signal line Re2, and a conductive portion 11. The orthographic projections of the second gate driving signal line G2, the enable signal line EM, and the second reset signal line Re2 on the base substrate may all extend along the first direction X. The second gate driving signal line G2 may be used to provide the second gate driving signal terminal in FIG. 27, the enable signal line EM may be used to provide the enable signal terminal in FIG. 27, and the second reset signal line Re2 may be used to provide the second reset signal terminal in FIG. 27. The orthographic projection of the second gate driving signal line G2 on the base substrate may cover the orthographic projection of the active portion 54 on the base substrate, and a partial structure of the second gate driving signal line G2 may be used to form the gate of the fourth transistor T4. The orthographic projection of the enable signal line EM on the base substrate may cover the orthographic projection of the active portion 55 on the base substrate, and a partial structure of the enable signal line EM may be used to form the gate of the fifth transistor T5. The orthographic projection of the second reset signal line Re2 on the base substrate covers the orthographic projection of the active portion 57 on the base substrate, and a partial structure of the second reset signal line Re2 may be used to form the gate of the seventh transistor T7. The orthographic projection of the conductive portion 11 on the base substrate may cover the orthographic projection of the active part 53 on the base substrate, the conductive portion 11 may be used to form the gate of the driving transistor T3, and at the same time, the conductive portion 11 can also form an electrode of the capacitor C. The first active layer may be doped by using the first gate layer as a mask, so that the first active layer covered by the first gate layer forms a semiconductor structure, and the first active layer not covered by the first gate layer forms a conductor structure.

As shown in FIGS. 29, 33, 39, 40 and 41, the second gate layer may include a first initialization signal line Vinit1, a first reset signal line Re1, a first gate driving signal line G1, a conductive portion 21, and a connection portion 22. The orthographic projections of the first initialization signal line Vinit1, the first reset signal line Re1, and the first gate driving signal line G1 on the base substrate may all extend along the first direction. The first initialization signal line Vinit1 may be used to provide the first initialization signal terminal in FIG. 27, the first reset signal line Re1 may be used to provide the first reset signal terminal in FIG. 27, and the first gate driving signal line G1 may be used to provide the first gate driving signal terminal in FIG. 27. The conductive portion 21 is used as the other electrode of the capacitor C. The conductive portions 21 adjacent to each other in the first direction X may be connected to each other through a connection portion 22, and through holes 211 may be formed in the conductive portions 21.

As shown in FIGS. 29, 34, 40 and 41, the second active layer may include an active portion 6, and the active portion 6 may include an active portion 61 and an active portion 62. The active portion 61 may form the channel region of the first transistor T1, and the active portion 62 may form the channel region of the second transistor T2. As shown in FIG. 40, the active portion 6 is located on a side of the active portion 61 away from the active portion 62 and may be connected to the first initialization signal line Vinit1 through a via hole 71 to connect the second electrode of the first transistor T1 and the first initialization signal line Vinit1. The second active layer may be formed of a metal oxide semiconductor material, for example, indium gallium zinc oxide.

As shown in FIGS. 29, 35 and 41, the third gate layer may include a gate line 3Re1, a gate line 3G1, and a gate line 3Re1. The orthographic projection of the gate line 3Re1 on the base substrate may extend in the first direction, and the orthographic projection of the gate line 3Re1 on the base substrate at least partially overlaps with the orthographic projection of the first reset signal line Re1 on the base substrate. The gate line 3Re1 may be connected to the first reset signal line Re1 through at least one via hole, and the via hole may be located in a non-display region or a display region of the display panel. The orthographic projection of the gate line 3G1 on the base substrate may extend along the first direction, and the orthographic projection of the gate line 3G1 on the base substrate may at least partially overlap with the orthographic projection of the first gate driving signal line G1 on the base substrate. The gate line 3G1 may be connected to the first gate driving signal line G1 through at least one via hole, and the via hole may be located in a non-display region or a display region of the display panel. The second active layer can be formed by conductorization using the third gate layer as a mask, that is, the second active layer covered by the third gate layer forms a semiconductor structure, and the part not covered by the third gate layer forms a conductor structure.

As shown in FIGS. 29 and 36, the first source and drain layer may include a conductive portion 41, a conductive portion 42, a conductive portion 43, a conductive portion 44, a conductive portion 45, a conductive portion 46, a conductive portion 47, and a second initialization signal line Vinit2. The second initialization signal line Vinit2 is connected to the conductive portion 47 for providing the second initialization signal terminal in FIG. 27. The orthographic projection of the second initialization signal line Vinit2 on the base substrate may at least partially overlap with the orthographic projection of the first reset signal line Re1 on the base substrate. The conductive portion 41 may be connected to the active portion 6 through a via hole 72 and connected to the first initialization signal line Vinit1 through a via hole 73, so as to connect the second electrode of the first transistor T1 and the first initialization signal line Vinit1. The conductive portion 41 may further increase the contact efficiency between the active portion 6 and the first initialization signal line Vinit1. The conductive portion 42 may be connected to a position of the active portion 6 between the active portion 61 and the active portion 62 through a via hole 74, and may be connected to the conductive portion 11 through a via hole 75, so as to connect the first electrode of the first transistor T1 and the gate of the driving transistor T3. The via hole 75 may penetrate through the through hole 211 in the conductive portion 21, and the conductor filled in the via hole 75 is not electrically connected to the conductive portion 21. The conductive portion 43 may be connected to the connection portion 22 through a via hole 76, and may be connected to the first active layer on a side of the active portion 55 through a via hole 77, so as to connect the capacitor C and the first electrode of the fifth transistor T5. The conductive portion 44 may be connected to the first active layer between the active portion 57 and the active portion 56 through a via hole 78 to connect the second electrode of the sixth transistor T6. The conductive portion 44 may be used to connect the anode of the light-emitting unit. The conductive portion 45 may be connected to the active portion 6 on a side of the active portion 62 away from the active portion 61 through a via hole 710, and may be connected to the first active layer on a side of the active portion 53 through a via hole 711, so as to connect the second electrode of the second transistor T2 and the second electrode of the driving transistor T3. The conductive portion 46 may be connected to the connection portion 22 through a via hole 712, and the conductive portion 46 may also be connected to the power line for providing the first power signal terminal VDD in FIG. 27. The conductive portion 47 may be connected to the first active layer on a side of the active portion 57 through a via hole 79, so as to connect the second initialization signal line Vinit2 and the second electrode of the seventh transistor T7.

In an exemplary embodiment, as shown in FIGS. 29 and 39, the orthographic projection of the fourth light shielding portion 014 on the base substrate at least partially overlaps with the orthographic projection of the connection portion 22 on the base substrate. This arrangement can minimize the shielding effect of the fourth light shielding portion 014 on light as much as possible, and increase the light transmittance of the array substrate.

In an exemplary embodiment, as shown in FIGS. 29 and 39, the orthographic projection of the connection portion 02 on the base substrate and the orthographic projection of the first reset signal line Re1 on the base substrate at least partially overlap. Similarly, this arrangement can minimize the shielding effect of the connection portion 02 on light as much as possible and increase the light transmittance of the array substrate. In addition, since the first reset signal line Re1 is located in the second gate layer, and the first reset signal line Re1 has a large distance from the light shielding layer, the capacitive coupling effect of the connection portion 02 on the first reset signal line Re1 is small. Compared with an arrangement in which the connection portion 02 is disposed directly under the gate line in the first gate layer, this arrangement can reduce the capacitive coupling effect of the connection portion 02 on the gate line.

As shown in FIGS. 29, 33 and 39, the second gate layer may further include a raised portion 23. The raised portion 23 is connected to the first initialization signal line Vinit1. The raised portion 23 includes a side edge 231, and the first initialization signal line Vinit1 includes a side edge 232 connected to the side edge 231. The included angle between the orthographic projection of the side edge 231 on the base substrate and the side edge 232 on the base substrate is less than 180°. The orthographic projection of the raised portion 23 on the base substrate and the orthographic projection of the second light shielding portion 012 on the base substrate at least partially overlap. The raised portion 23 may reduce the resistance of the first initialization signal line Vinit1. In addition, the orthographic projection of the base substrate of the raised portion 23 and the orthographic projection of the second light shielding portion 012 on the base substrate at least partially overlap, and thus the shading effect of the raised portion 23 on the array substrate may be reduced as much as possible. It should be understood that, in other exemplary embodiments, raised portions with similar structures may also be provided on gates extending in the row direction. The raised portion may reduce the resistance of the gate lines, as long as the raised portion does not affect the transmittance of the array substrate.

In an exemplary embodiment, the light shielding layer may be a conductor structure. For example, the light shielding layer may be located in a metal light shielding layer, and the light shielding layer may be connected to a stable voltage source. The stable voltage source may be any one of the first power signal terminal VDD, the second power signal terminal VSS, the first initialization signal terminal Vinit1, and the second initialization signal terminal Vinti2. The light shielding layer may be connected to the above-mentioned stable power supply in the non-display region or the display region of the array substrate. In addition, the above-mentioned stable voltage source may also be provided by other power sources. As shown in FIG. 29, the orthographic projection of the conductive portion 42 on the base substrate and the orthographic projection of the third light shielding portion 013 on the base substrate at least partially overlap. Since the third light shielding portion 013 is connected to a stable power supply, the third light shielding portion 013 has a voltage-stabilizing effect on the conductive portion 42. Also, since the conductive portion 42 is connected to the gate of the driving transistor T3 (the conductive portion 11), that is, the third light shielding portion 013 has a voltage-stabilizing effect on the gate of the driving transistor T3, this arrangement may reduce voltage fluctuations of the gate of the driving transistor T3 during the light-emitting stage.

As shown in FIG. 29, the orthographic projection of the first light shielding portion 011 on the base substrate may cover the orthographic projection of the active portion 53 on the base substrate. The first light shielding portion 011 may shield the active portion 53 from light, thereby reducing changes of output characteristics of the driving transistor T3 caused by illumination to the active portion 53. In addition, the orthographic projection of the first light shielding portion 011 on the base substrate can also cover the orthographic projection of the gate of the driving transistor T3 (conducting portion 11) on the base substrate, and thus the first light shielding portion 011 can stabilize the gate of the driving transistor T3, and accordingly reduce voltage fluctuations of the gate of the driving transistor T3 in the light-emitting stage. As shown in FIG. 29, the orthographic projection of the first light shielding portion 011 on the base substrate may at least partially overlap with the orthographic projection of the conductive portion 42 on the base substrate, and thus the first light shielding portion 011 can further stabilize the gate of the driving transistor T3. The area of the gate of the driving transistor (conductive portion 11) and the conductive portion 42 covered by the light shielding layer may be greater than 50% of the total area of the conductive portion 42 of the conductive portion 11, such as 60% to 70%, 80% to 90%, or a value between the range, or the gate of the driving transistor and the conductive portion 42 may be completely covered.

In addition, the array substrate may further include a second source/drain layer and an anode layer. The second source/drain layer may be located on a side of the first source/drain layer away from the base substrate, and the anode layer may be located at a side of the second source/drain layer away from the base substrate side. The second source and drain layer may include a data signal line for providing the data signal terminal, and a power line for providing the first power signal terminal in FIG. 27. The orthographic projections of the data signal line and the power line on the base substrate may both extend along the second direction Y. The anode layer may form the anode of the light-emitting unit.

Figure 42:
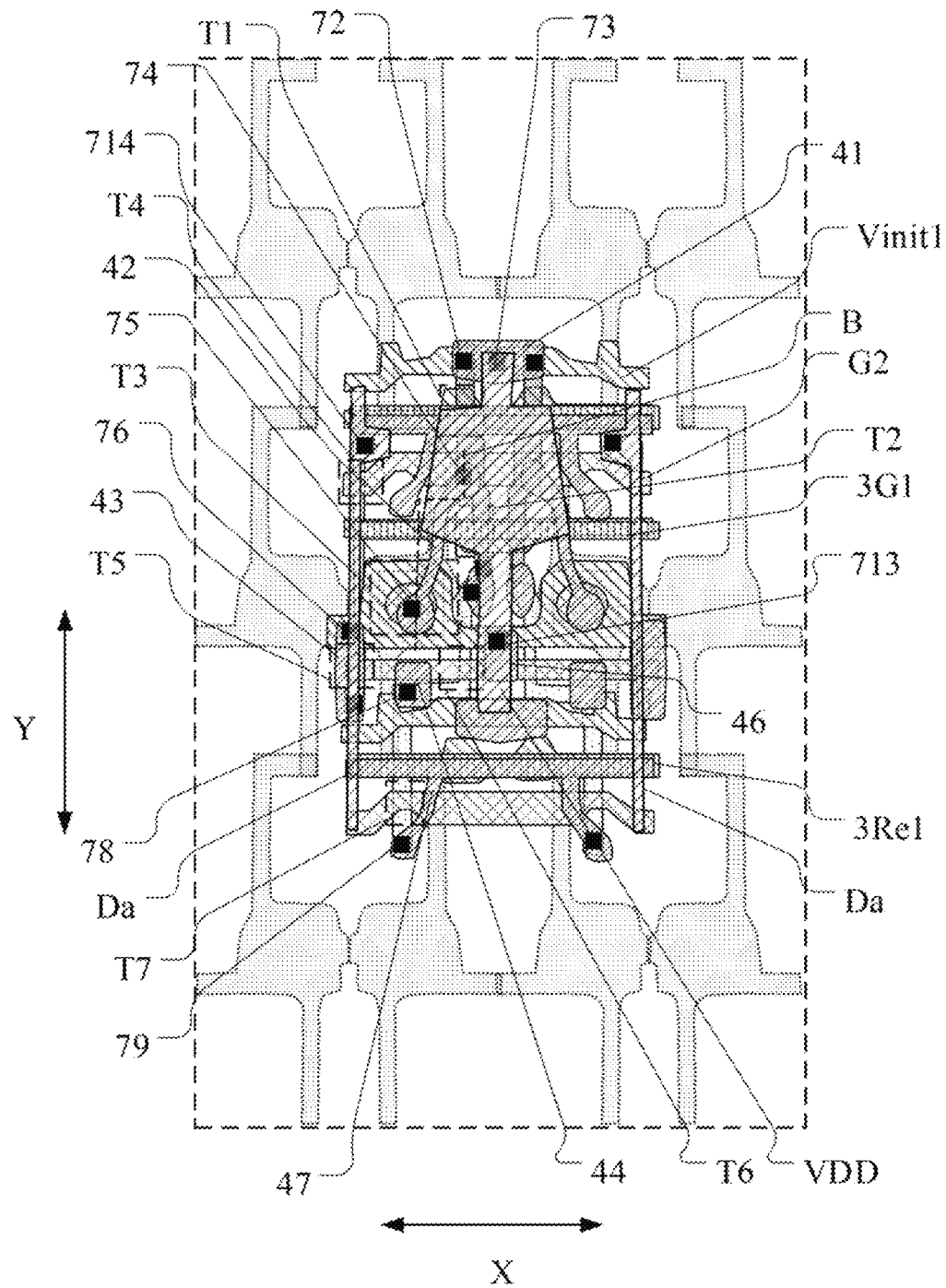
FIG. 42 is a structural layout of an exemplary embodiment of the disclosed array substrate.
Figure 43:
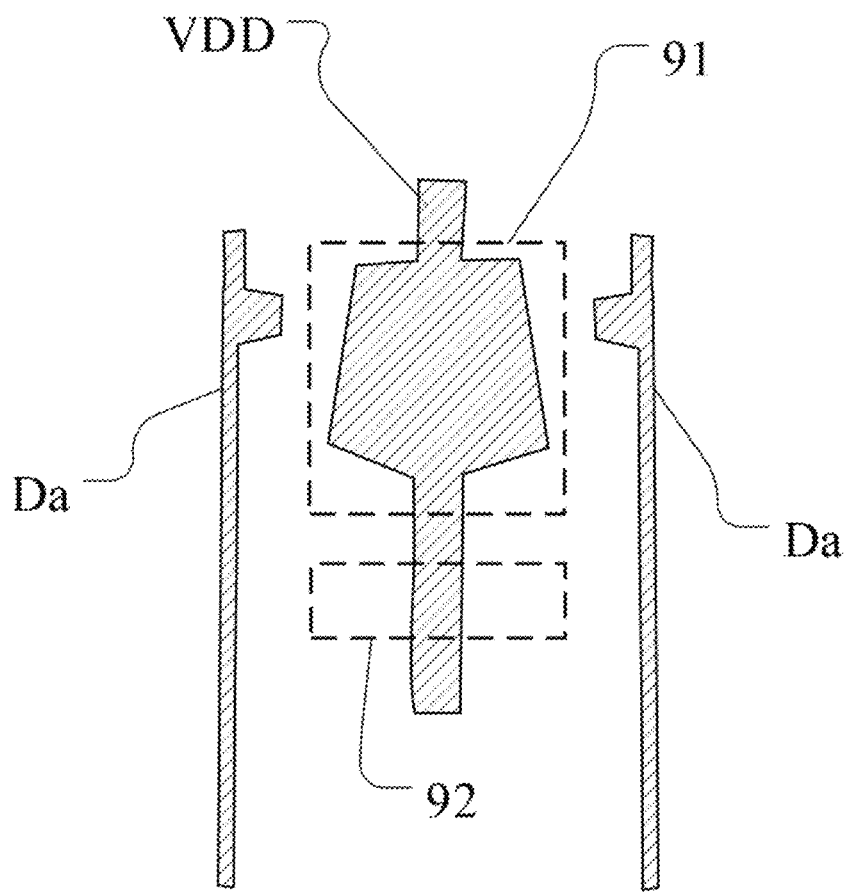
FIG. 43 is a structural layout of the second source and drain layer in FIG. 42.

In an exemplary embodiment, the array may basically further include a second source and drain layer, as shown in FIGS. 42 and 43. FIG. 42 is a structural layout of an array substrate according to an exemplary embodiment of the present disclosure. FIG. 43 is a structural layout of the second source and drain layer. The second source and drain layer may include a data line Da and a power line VDD. The orthographic projections of the data line Da and the power line VDD on the base substrate may extend along the second direction Y. The data line Da may be used to provide the data signal terminal in FIG. 27, and the power line VDD may be used to provide the first power signal terminal in FIG. 27. As shown in FIG. 42, the power line VDD may be connected to the connection portion 22 through the via hole 713 to connect the first power signal terminal and the capacitor C. The data line may be connected to the first active layer on a side of the active portion 54 through the via hole 714 to connect the first electrode of the fourth transistor T4 and the data signal terminal. The power line VDD may include an extension portion 91 and an extension portion 92 distributed along its extending direction. The size of the orthographic projection of the extension portion 91 on the base substrate in the first direction X may be larger than the size of the orthographic projection of the extension portion 92 on the base substrate in the first direction X. The orthographic projection of the extension portion 91 on the base substrate may cover the channel regions of the first transistor and the second transistor. On the one hand, this arrangement may shield the transistors by the power line VDD; on the other hand, this arrangement may reduce the resistance of the power line VDD.

Figure 44:
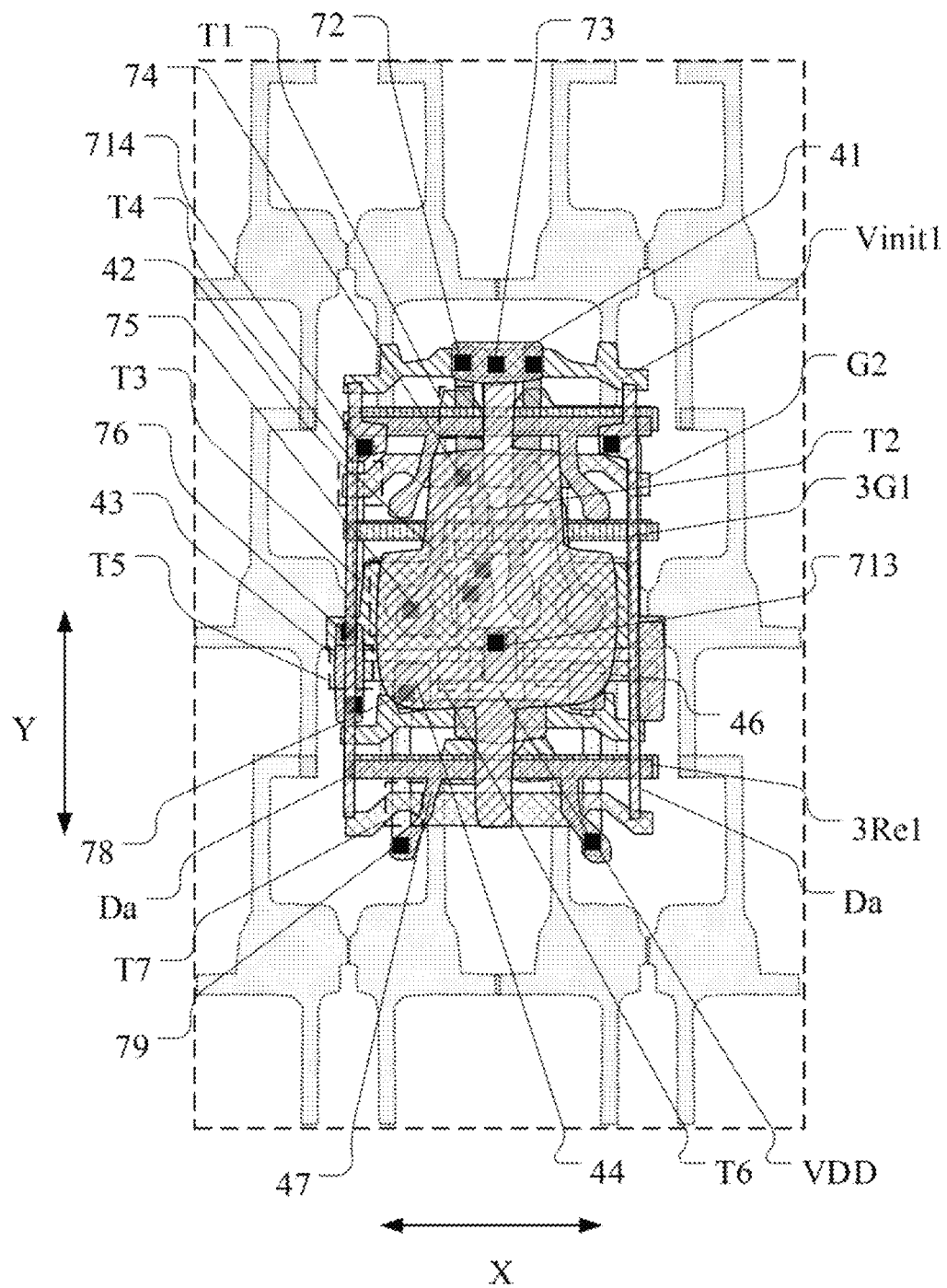
FIG. 44 is a structural layout of an array substrate according to an exemplary embodiment.
Figure 45:
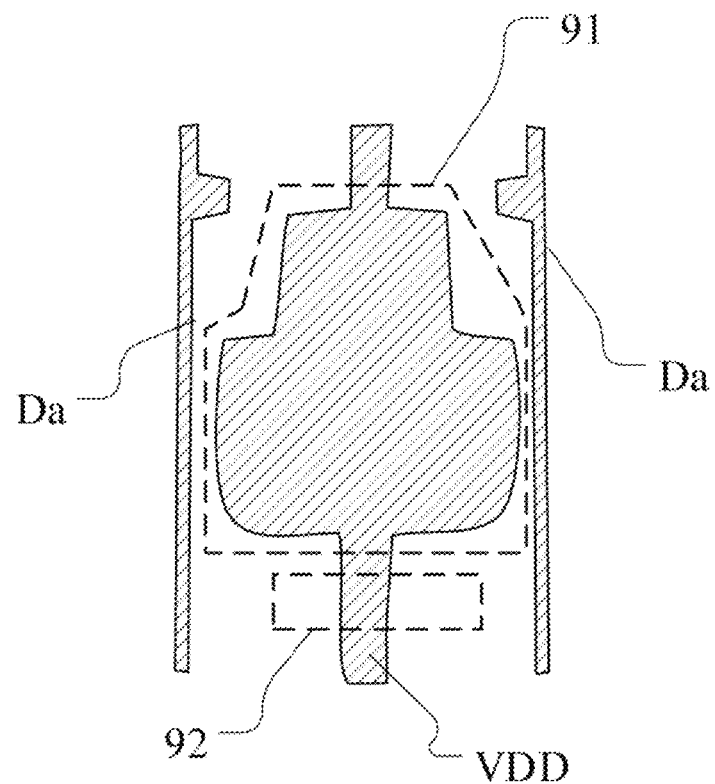
FIG. 45 is a structural layout of a second source and drain layer in FIG. 44.

As shown in FIGS. 44 and 45, FIG. 44 is a structural layout of an array substrate according to an exemplary embodiment of the present disclosure, and FIG. 45 is a structural layout of the second source and drain layer in FIG. 44. The difference between the second source and drain layer shown in FIG. 45 and the second source and drain layer shown in FIG. 43 is that the extension part 91 not only covers the channel regions of the first transistor and the second transistor, but also covers the channel regions of sixth transistor T6 and the driving transistor T3.

Figure 46:
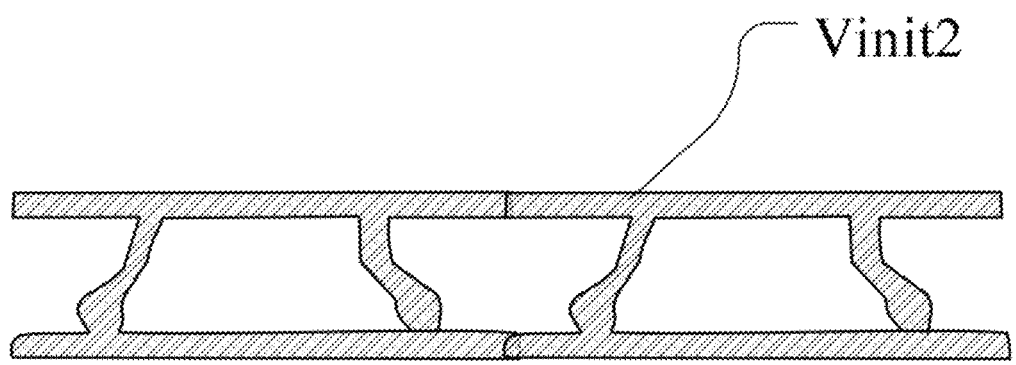
FIG. 46 is a schematic structural diagram of a second initialization signal line in an array substrate according to another exemplary embodiment.
Figure 47:
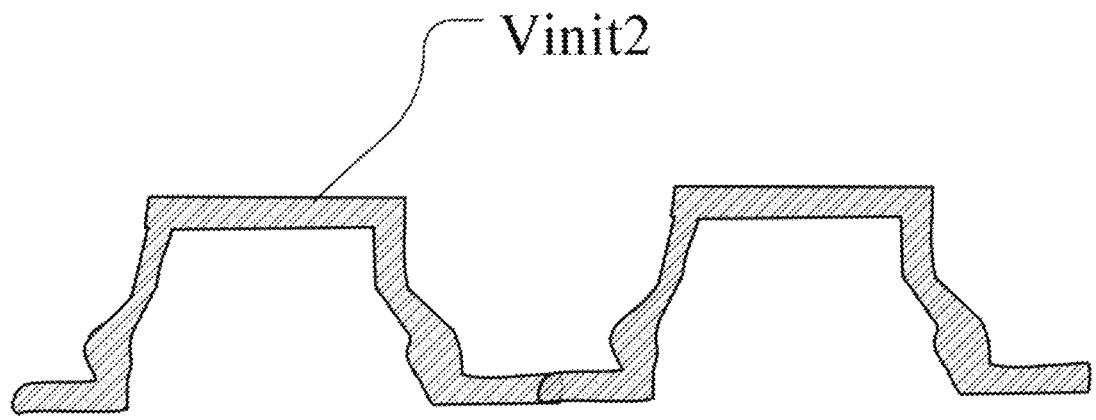
FIG. 47 is a schematic structural diagram of a second initialization signal line in an array substrate according to another exemplary embodiment.

As shown in FIGS. 46 and 47, both are schematic structural diagrams of the second initialization signal line in the array substrate according to another exemplary embodiment of the present disclosure. In other exemplary embodiments, the second initialization signal lines Vinit2 may be parallel grid lines or broken lines, which may be designed according to the voltage drop of the initialization signal lines.

Figure 48:
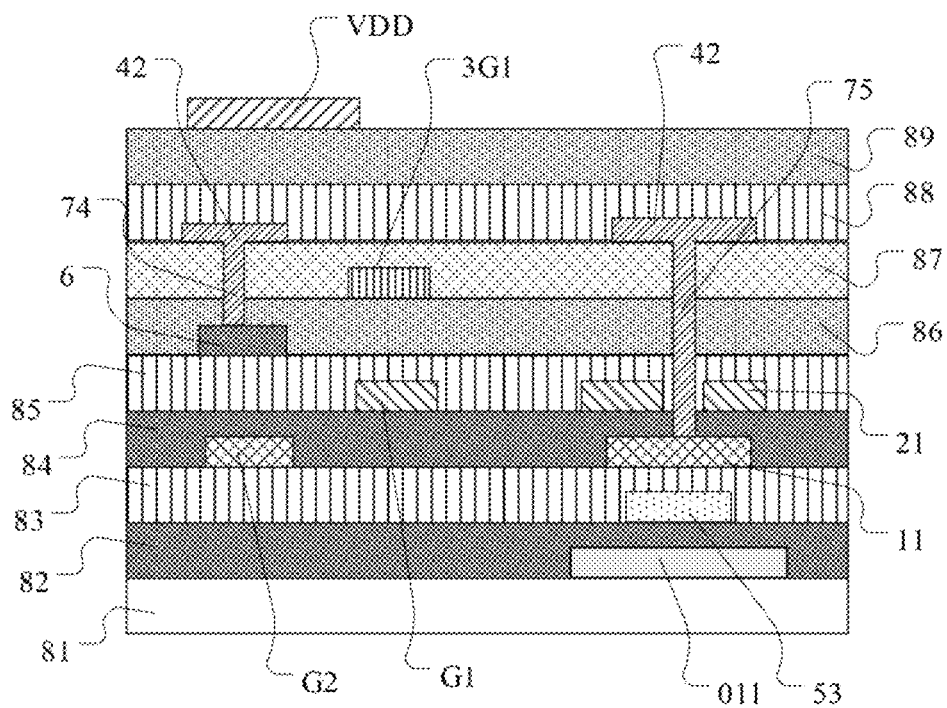
FIG. 48 is a partial cross-sectional view taken along the dotted line B in FIG. 42.

FIG. 48 is a partial cross-sectional view taken along the dotted line B in FIG. 42. The array substrate may further include a first insulating layer 82, a second insulating layer 83, a third insulating layer 84, a fourth insulating layer 85, a sixth insulating layer 86, a dielectric layer 87, a passivation layer 88, and a first planarization layer 89. The base substrate 81, the light shielding layer, the first insulating layer 82, the first active layer, the second insulating layer 83, the first gate layer, the third insulating layer 84, the second gate layer, the fourth insulating layer 85, the second active layer, the fifth insulating layer 86, the third gate layer, the dielectric layer 87, the first source and drain layer, the passivation layer 88, the first planarization layer 89, and the second source and drain layer are stacked in sequence. The first insulating layer 82 includes at least one of a silicon oxide layer and a silicon nitride layer, and the thickness of the first insulating layer 82 may be 2500 to 3500 angstroms. The second insulating layer 83 may be a silicon oxide layer, and the thickness of the second insulating layer 83 may be 1000 to 2000 angstroms. The third insulating layer 84 may be an interlayer insulating layer or an interlayer dielectric layer, the third insulating layer 84 may be a silicon nitride layer, and the thickness may be 1000 to 2000 angstroms. The fourth insulating layer 85 may include a silicon oxide layer and a silicon nitride layer, the thickness of the silicon oxide layer may be 3000 to 4000 angstroms, and the thickness of the silicon nitride may be 500 to 1000 angstroms. The fifth insulating layer 86 may be a silicon oxide layer, and the thickness may be 1000 to 1700 angstroms. The dielectric layer 87 may include a silicon oxide layer and a silicon nitride layer, the thickness of the silicon oxide layer may be 1500 to 2500 angstroms, and the thickness of the silicon nitride layer may be 2500 to 3500 angstroms. A side of the second source and drain layer away from the base substrate may also be provided with a second planarization layer, and the anode layer is located on a side of the second planarization layer away from the base substrate. A side of the anode layer away from the base substrate may also be provided with a light-emitting unit layer. The light-emitting unit layer may include an electron injection layer, an organic light-emitting layer, a hole injection layer, and the like.

The display panels and display devices provided by the embodiments of the present disclosure have the same or similar beneficial effects as the array substrates provided by the foregoing embodiments of the present disclosure. Since the array substrates have been described in detail in the foregoing embodiments, repeated descriptions will be omitted here.

The foregoing description of the embodiments has been provided for the purposes of illustration and description. The description is not intended to be exhaustive or to limit the present disclosure. Individual elements or features of a particular embodiment are generally not limited to the particular embodiment, but, where appropriate, are interchangeable and can be used in a selected embodiment, even if not specifically shown or described. The embodiments described here may be changed in many ways. Such changes should not be considered a departure from the present disclosure, and all such modifications are included within the scope of the present disclosure.

What is claimed is:

1. An array substrate, comprising:
a substrate;
a plurality of sub-pixels arranged in multiple rows and columns on the substrate, wherein at least one of the plurality of sub-pixels comprises a pixel circuit, and each pixel circuit comprises a driving circuit, a voltage-stabilizing circuit, a driving reset circuit and a light-emitting reset circuit;
wherein:
the driving circuit comprises a control terminal, a first terminal and a second terminal, and is configured to provide a driving current to a light-emitting device;
the voltage-stabilizing circuit is coupled to the control terminal of the driving circuit, a first node and a voltage-stabilizing control signal input terminal, and is configured to make the control terminal of the driving circuit and the first node conduct under control of a voltage-stabilizing control signal from the voltage-stabilizing control signal input terminal;
the driving reset circuit is coupled to a driving reset control signal input terminal, the first node and a driving reset voltage terminal, and is configured to provide a driving reset voltage from the driving reset voltage terminal to the voltage-stabilizing circuit under control of a driving reset control signal from the driving reset control signal input terminal, so as to reset the control terminal of the driving circuit; and
the light-emitting reset circuit is coupled to a light-emitting reset control signal input terminal, the light-emitting device and a light-emitting reset voltage terminal, and is configured to provide a light-emitting reset voltage from the light-emitting reset voltage terminal to the light-emitting device under control of a light-emitting reset control signal from the light-emitting reset control signal input terminal, so as to reset the light-emitting device;
a driving reset voltage line coupled to the driving reset voltage terminal and configured to provide the driving reset voltage to the driving reset voltage terminal; and
a light-emitting reset voltage line coupled to the light-emitting reset voltage terminal and configured to provide the light-emitting reset voltage to the light-emitting reset voltage terminal;
wherein:
the driving circuit comprises a driving transistor, the voltage-stabilizing circuit comprises a voltage-stabilizing transistor, the driving reset circuit comprises a driving reset transistor, and the light-emitting reset circuit comprises a light-emitting reset transistor;

a first electrode of the driving transistor is coupled to the first terminal of the driving circuit, a gate of the driving transistor is coupled to the control terminal of the driving circuit, and a second electrode of the driving transistor is coupled to the second terminal of the driving circuit;
a first electrode of the voltage-stabilizing transistor is coupled to the control terminal of the driving circuit, a second electrode of the voltage-stabilizing transistor is coupled to the first node, and a gate of the voltage-stabilizing transistor is coupled to the voltage-stabilizing control signal input terminal;
a first electrode of the driving reset transistor is coupled to the driving reset voltage terminal, a gate of the driving reset transistor is coupled to the driving reset control signal input terminal, and a second electrode of the driving reset transistor coupled to the first node;
a first electrode of the light-emitting reset transistor is coupled to the light-emitting reset voltage terminal, a gate of the light-emitting reset transistor is coupled to the light-emitting reset control signal input terminal, and a second electrode of the light-emitting reset transistor is coupled to a first electrode of the light-emitting device;
an active layer of the voltage-stabilizing transistor comprises an oxide semiconductor material, and active layers of the driving transistor and the driving reset transistor comprise a silicon semiconductor material.

2. The array substrate according to claim 1, wherein an active layer of the light-emitting reset transistor comprises the oxide semiconductor material.

3. The array substrate according to claim 2, further comprising:
a first active semiconductor layer on the substrate and comprising the silicon semiconductor material; and
a second active semiconductor layer arranged on a side of the first active semiconductor layer away from the substrate and insulated from the first active semiconductor layer and comprising the oxide semiconductor material.

4. The array substrate according to claim 3, wherein:
the first active semiconductor layer comprises the active layer of the driving transistor and the active layer of the driving reset transistor; and
the second active semiconductor layer comprises a first part and a second part arranged along a column direction, the first part of the second active semiconductor layer comprises the active layer of the voltage-stabilizing transistor, and the second part of the second active semiconductor layer comprises the active layer of the light-emitting reset transistor.

5. The array substrate according to claim 4, wherein the first part of the second active semiconductor layer and the second part of the second active semiconductor layer are aligned in the column direction.

6. The array substrate according to claim 5, wherein the pixel circuit further comprises a data writing circuit, a compensation circuit, a storage circuit and a light-emitting control circuit;
wherein:
the data writing circuit is coupled to a data signal input terminal, a scan signal input terminal, and the first terminal of the driving circuit, and is configured to provide a data signal from the data signal input terminal to the first terminal of the driving circuit under control of a scan signal from the scan signal input terminal;

the compensation circuit is coupled to the second terminal of the driving circuit, the first node and a compensation control signal input terminal, and is configured to perform a threshold compensation for the driving circuit according to a compensation control signal from the compensation control signal input terminal;

the storage circuit is coupled to a first power voltage terminal and the control terminal of the driving circuit, and is configured to store a voltage difference between the first power voltage terminal and the control terminal of the driving circuit; and the light-emitting control circuit is coupled to the light-emitting control signal input terminal, the first power voltage terminal, the first terminal and the second terminal of the driving circuit, the light-emitting reset circuit and the light-emitting device, and is configured to apply a first power voltage from the first power voltage terminal to the driving circuit and apply the driving current generated by the driving circuit to the light-emitting device under control of the light-emitting control signal from the light-emitting control signal input terminal.

7. The array substrate according to claim 6, wherein the data writing circuit comprises a data writing transistor, the compensation circuit comprises a compensation transistor, the storage circuit comprises a storage capacitor, and the light-emitting control circuit comprises a first light-emitting control transistor and a second light-emitting control transistor;

wherein:
a first electrode of the data writing transistor is coupled to the data signal input terminal, a gate of the data writing transistor is coupled to the scan signal input terminal, and a second electrode of the data writing transistor is coupled to the first terminal of the driving circuit;

a first electrode of the compensation transistor is coupled to the second terminal of the driving circuit, a gate of the compensation transistor is coupled to the compensation control signal input terminal, and a second electrode of the compensation transistor is coupled the first node;

a first electrode of the storage capacitor is coupled to the first power voltage terminal, a second electrode of the storage capacitor is coupled to the control terminal of the driving circuit, and is configured to store the voltage difference between the first power voltage terminal and the control terminal of the driving circuit;

a first electrode of the first light-emitting control transistor is coupled to the first power voltage terminal, a gate of the first light-emitting control transistor is coupled to the light-emitting control signal input terminal, and a second electrode of the first light-emitting control transistor is coupled to the first terminal of the driving circuit; and a first electrode of the second light-emitting control transistor is coupled to the second terminal of the driving circuit, a gate of the second light-emitting control transistor is coupled to the light-emitting control signal input terminal, and a second electrode of the second light-emitting control transistor is coupled to the first electrode of the light-emitting device.

8. The array substrate according to claim 7, wherein the first active semiconductor layer comprises active layers of the data writing transistor, the compensation transistor, the first light-emitting control transistor and the second light-emitting control transistor.

9. The array substrate according to claim 8, wherein the light-emitting reset control signal and the light-emitting control signal are a same signal.

10. The array substrate according to claim 8, wherein the scan signal and the compensation control signal are a same signal.

11. The array substrate according to claim 10, further comprising:
a first conductive layer arranged between the first active semiconductor layer and the second active semiconductor layer and insulated from the first active semiconductor layer and the second active semiconductor layer, wherein the first conductive layer comprises a driving reset control signal line, a scan signal line, the gate of the driving transistor, the first electrode of the storage capacitor and a light-emitting control signal line that are sequentially arranged along the column direction;

wherein:
the driving reset control signal line is coupled to the driving reset control signal input terminal, and is configured to provide the driving reset control signal to the driving reset control signal input terminal;

the scan signal line is coupled to the scan signal input terminal and the compensation control signal input terminal, is configured to provide the scan signal to the scan signal input terminal, and is configured to provide the compensation control signal to the compensation control signal input terminal;

the first electrode of the storage capacitor and the gate of the driving transistor are formed as an integral structure; and the light-emitting control signal line is coupled to the light-emitting control signal input terminal, and is configured to provide the light-emitting control signal to the light-emitting control signal input terminal.

12. The array substrate according to claim 11, wherein:
an overlapping portion between an orthographic projection of the driving reset control signal line on the substrate and an orthographic projection of the first active semiconductor layer on the substrate is the gate of the driving reset transistor;

overlapping portions between an orthographic projection of the scan signal line on the substrate and the orthographic projection of the first active semiconductor layer on the substrate are the gate of the compensation transistor and the gate of the data writing transistor; and overlapping portions between an orthographic projection of the light-emitting control signal line on the substrate and the orthographic projection of the first active semiconductor layer on the substrate are the gate of the first light-emitting control transistor and the gate of the second light-emitting control transistor.

13. The array substrate according to claim 12, further comprising:
a second conductive layer arranged between the first conductive layer and the second active semiconductor layer and insulated from the first conductive layer and the second active semiconductor layer, wherein the second conductive layer comprises a voltage-stabilizing control signal line, the second electrode of the storage capacitor, a first power voltage line and a light-emitting reset control signal line that are arranged along the column direction;

wherein:
the voltage-stabilizing control signal line is coupled to the voltage-stabilizing control signal input terminal, and is configured to provide the voltage-stabilizing control signal to the voltage-stabilizing control signal input terminal;
the first power voltage line is coupled to the first power voltage terminal, and is configured to provide the first power voltage to the first power voltage terminal;
orthographic projections of the second electrode of the storage capacitor and the first electrode of the storage capacitor on the substrate at least partially overlap;
the second electrode of the storage capacitor and the first power voltage line are integrally formed; and
the light-emitting reset control signal line is coupled to the light-emitting reset control signal input terminal, and is configured to provide the light-emitting reset control signal to the light-emitting reset control signal input terminal.

14. The array substrate according to claim 13, wherein:
an overlapping portion between an orthographic projection of the voltage-stabilizing control signal line on the substrate and an orthographic projection of the second active semiconductor layer on the substrate is a first gate of the voltage-stabilizing transistor; and
an overlapping portion between an orthographic projection of the light-emitting control signal line on the substrate and the orthographic projection of the second active semiconductor layer on the substrate is a first gate of the light-emitting reset transistor.

15. The array substrate according to claim 14, further comprising:
a third conductive layer arranged on a side of the second active semiconductor layer away from the substrate and insulated from the second active semiconductor layer, wherein the third conductive layer comprises the voltage-stabilizing control signal line, the light-emitting reset control signal line, and a light-emitting reset voltage line that are arranged along the column direction.

16. The array substrate according to claim 15, wherein:
an overlapping portion between an orthographic projection of the voltage-stabilizing control signal line on the substrate and an orthographic projection of the second active semiconductor layer on the substrate is a second gate of the voltage-stabilizing transistor electrode; and
an overlapping portion between an orthographic projection of the light-emitting reset control signal line on the substrate and an orthographic projection of the second active semiconductor layer on the substrate is a second gate of the light-emitting reset transistor; and
the light-emitting reset voltage line is coupled to the second active semiconductor layer through a via hole to form the first electrode of the light-emitting reset transistor.

17. The array substrate according to claim 16, further comprising:
a fourth conductive layer arranged on a side of the third conductive layer away from the substrate and insulated from the third conductive layer, wherein the fourth conductive layer the layer comprises a first connection portion, a second connection portion, a third connection portion, a fourth connection portion, a fifth connection portion, a sixth connection portion, a seventh connection portion, and an eighth connection portion;
wherein:
the first connection portion is used as the driving reset voltage line;
the first connection portion is coupled to a drain region of the driving reset transistor through a via hole to form the first electrode of the driving reset transistor;
the second connection portion is coupled to the light-emitting reset voltage line through a via hole;
the third connection portion is coupled to a drain region of the data writing transistor through a via hole to form the first electrode of the data writing transistor;
the fourth connection portion is coupled to a source region of the driving reset transistor and a source region of the compensation transistor through via holes to form the second electrode of the driving reset transistor and the second electrode of the compensation transistor, respectively, and the fourth connection portion is coupled to a source region of the voltage-stabilizing transistor through a via hole to form the second electrode of the voltage-stabilizing transistor;
the fifth connection portion is coupled to the gate of the driving transistor and the first electrode of the storage capacitor through via holes, and the fifth connection portion is coupled to a drain region of the voltage-stabilizing transistor through a via hole to form the first electrode of the voltage-stabilizing transistor;
the sixth connection portion is coupled to a drain region of the first light-emitting control transistor through a via hole to form the first electrode of the first light-emitting control transistor;
the seventh connection portion is coupled to a source region of the second light-emitting control transistor through a via hole to form the second electrode of the second light-emitting control transistor, and the seventh connection portion is coupled to a source region of the light-emitting reset transistor to form the second electrode of the light-emitting reset transistor; and
the eighth connection portion is coupled to the source region of the light-emitting reset transistor through a via hole to form the first electrode of the light-emitting reset transistor.

18. The array substrate according to claim 17, further comprising:
a fifth conductive layer arranged on a side of the fourth conductive layer away from the substrate and insulated from the fourth conductive layer, wherein the fifth conductive layer comprises a data signal line, the first power voltage line, and a second power voltage line that are arranged in a row direction;
wherein:
the data signal line extends along the column direction, and is coupled to the third connection portion of the fourth conductive layer through a via hole;
the first power voltage line extends along the column direction, and is coupled to the third connection portion of the fourth conductive layer through a via hole; and
the second power voltage line extends along the column direction, and is coupled to the seventh connection portion of the fourth conductive layer through a via hole.

19. A display panel comprising an array substrate, wherein the array substrate comprises:

a substrate;

a plurality of sub-pixels arranged in multiple rows and columns on the substrate, wherein at least one of the plurality of sub-pixels comprises a pixel circuit, and each pixel circuit comprises a driving circuit, a voltage-stabilizing circuit, a driving reset circuit and a light-emitting reset circuit;

wherein:

the driving circuit comprises a control terminal, a first terminal and a second terminal, and is configured to provide a driving current to a light-emitting device;

the voltage-stabilizing circuit is coupled to the control terminal of the driving circuit, a first node and a voltage-stabilizing control signal input terminal, and is configured to make the control terminal of the driving circuit and the first node conduct under control of a voltage-stabilizing control signal from the voltage-stabilizing control signal input terminal;

the driving reset circuit is coupled to a driving reset control signal input terminal, the first node and a driving reset voltage terminal, and is configured to provide a driving reset voltage from the driving reset voltage terminal to the voltage-stabilizing circuit under control of a driving reset control signal from the driving reset control signal input terminal, so as to reset the control terminal of the driving circuit; and the light-emitting reset circuit is coupled to a light-emitting reset control signal input terminal, the light-emitting device and a light-emitting reset voltage terminal, and is configured to provide a light-emitting reset voltage from the light-emitting reset voltage terminal to the light-emitting device under control of a light-emitting reset control signal from the light-emitting reset control signal input terminal, so as to reset the light-emitting device;

a driving reset voltage line coupled to the driving reset voltage terminal and configured to provide the driving reset voltage to the driving reset voltage terminal; and a light-emitting reset voltage line coupled to the light-emitting reset voltage terminal and configured to provide the light-emitting reset voltage to the light-emitting reset voltage terminal;

wherein:

the driving circuit comprises a driving transistor, the voltage-stabilizing circuit comprises a voltage-stabilizing transistor, the driving reset circuit comprises a driving reset transistor, and the light-emitting reset circuit comprises a light-emitting reset transistor;

a first electrode of the driving transistor is coupled to the first terminal of the driving circuit, a gate of the driving transistor is coupled to the control terminal of the driving circuit, and a second electrode of the driving transistor is coupled to the second terminal of the driving circuit;

a first electrode of the voltage-stabilizing transistor is coupled to the control terminal of the driving circuit, a second electrode of the voltage-stabilizing transistor is coupled to the first node, and a gate of the voltage-stabilizing transistor is coupled to the voltage-stabilizing control signal input terminal;

a first electrode of the driving reset transistor is coupled to the driving reset voltage terminal, a gate of the driving reset transistor is coupled to the driving reset control signal input terminal, and a second electrode of the driving reset transistor coupled to the first node;

a first electrode of the light-emitting reset transistor is coupled to the light-emitting reset voltage terminal, a gate of the light-emitting reset transistor is coupled to the light-emitting reset control signal input terminal, and a second electrode of the light-emitting reset transistor is coupled to a first electrode of the light-emitting device;

an active layer of the voltage-stabilizing transistor comprises an oxide semiconductor material, and active layers of the driving transistor and the driving reset transistor comprise a silicon semiconductor material.

\* \* \* \* \*